United States Patent

Imazu

[19]

[11] Patent Number: 5,903,581
[45] Date of Patent: May 11, 1999

[54] METHOD OF DETECTING AND CORRECTING TRANSMISSION ERROR OF DIGITAL SIGNALS

[76] Inventor: Ryuzo Imazu, 19-10-407, Shinashiyakami, Suita-shi, Osaka 565, Japan

[21] Appl. No.: 08/776,309

[22] PCT Filed: May 30, 1996

[86] PCT No.: PCT/JP96/01468

§ 371 Date: Jan. 29, 1997

§ 102(e) Date: Jan. 29, 1997

[87] PCT Pub. No.: WO96/38922

PCT Pub. Date: Dec. 5, 1996

[30] Foreign Application Priority Data

May 30, 1995 [JP] Japan .................................. 7-132386

[51] Int. Cl.⁶ ............................ G06F 11/10; H03M 13/00
[52] U.S. Cl. ........................ 371/37.01; 371/49.1; 371/30
[58] Field of Search ............................... 371/37.01, 49.1, 371/30

[56] References Cited

U.S. PATENT DOCUMENTS 5,740,186   4/1998   Widmer .................................. 371/37.1

FOREIGN PATENT DOCUMENTS 55-26715   2/1980   Japan .
63-226141  9/1988   Japan .

*Primary Examiner*—Phung M. Chung
*Attorney, Agent, or Firm*—Wenderoth, Lind & Ponack, L.L.P.

[57] ABSTRACT

A method of detecting and correcting errors that occurs while digital signals are transmitted in series. In this method, in a processing unit of a transmitter, n addresses (ad) are allocated to respective n digital signals. Using these addresses (ad), bits of the digital signals are picked out, a plurality of bit strings (g) are created by combining information bits and check bits of the selected bits, and the plurality of bit strings (g) thus created are subjected to parity checks to determine the value of the check bits of the digital signals. A transmission code (1) thus created are transmitted to a receiver.

In the processing unit of the receiver, the plurality of bit strings (g) are created from the signal received. The plurality of bit strings (g) thus created are subjected to parity checks to detect and correct errors in the transmission code (1).

31 Claims, 37 Drawing Sheets

FIG. 4

| ad | |
|---|---|
| (00000) | $a_0$ |
| (00001) | $a_1$ — 1 |
| (00010) | $a_2$ |
| (00011) | $a_3$ |
| (00100) | $a_4$ |
| (00101) | $a_5$ |
| (00110) | $a_6$ |
| (00111) | $c_0$ |
| (01000) | $a_7$ |
| ⋮ | ⋮ |
| (10111) | $c_8$ |
| (11000) | $a_{15}$ |
| (11001) | $c_9$ |
| (11010) | $c_{10}$ |
| (11011) | $c_{11}$ |
| (11100) | $c_{12}$ |
| (11101) | $c_{13}$ |
| (11110) | $c_{14}$ |
| (11111) | $c_{15}$ |

FIG. 5

| ad | | | ad | | |
|---|---|---|---|---|---|
| (00000) | 1 | | (01111) | $c_4$ | |
| (00001) | 0 | | (10000) | 0 | |
| (00010) | 1 | | (10001) | 1 | |
| (00011) | 0 | | (10010) | $c_5$ | |
| (00100) | 1 | | (10011) | 1 | |
| (00101) | 0 | | (10100) | $c_6$ | |
| (00101) | 1 | | (10101) | $c_7$ | |
| (00111) | $c_0$ | | (10110) | $c_8$ | |
| (01000) | 0 | | (10111) | 0 | |
| (01001) | 1 | | (11000) | $c_9$ | |
| (01010) | 0 | | (11001) | $c_{10}$ | |
| (01011) | $c_1$ | | (11010) | $c_{11}$ | |
| (01100) | 1 | | (11011) | $c_{12}$ | |
| (01101) | $c_2$ | | (11100) | $c_{13}$ | |
| (01110) | $c_3$ | | (11101) | $c_{14}$ | |
| | | | (11111) | $c_{15}$ | |

FIG. 7

|  | $C_1$ | $C_2$ | $C_3$ | $C_4$ | $C_5$ | $C_6$ | $C_7$ | $C_8$ | $C_9$ | $C_{10}$ |
|---|---|---|---|---|---|---|---|---|---|---|
|  | 0101 | 0101 | 0101 | 0101 | .... | .... | .... | .... | .... | .... |
|  | 0011 | .... | .... | .... | 0101 | 0101 | 0101 | .... | .... | .... |
|  | .... | 0011 | .... | .... | 0011 | .... | .... | 0101 | 0101 | .... |
|  | .... | .... | 0011 | .... | .... | 0011 | .... | 0011 | .... | 0101 |
| a d | .... | .... | .... | 0011 | .... | .... | 0011 | .... | 0011 | 0011 |
| (00000) | ‡ | ‡ | ‡ | ‡ | ‡ | ‡ | ‡ | ‡ | ‡ | ‡ |
| (00001) | ‡ | ‡ | ‡ | ‡ | ‡ | ‡ | ‡ | ‡ | ‡ | ‡ |
| (00010) | ‡ | ‡ | ‡ | ‡ | ‡ | ‡ | ‡ | ‡ | ‡ | ‡ |
| (00011) | ‡ | ‡ | ‡ | ‡ | ‡ | ‡ | ‡ | ‡ | ‡ | ‡ |
| (00100) | ‡ | ‡ | ‡ | ‡ | ‡ | ‡ | ‡ | ‡ | ‡ | ‡ |
| (00101) | ‡ | ‡ | ‡ | ‡ | ‡ | ‡ | ‡ | ‡ | ‡ | ‡ |
| (00110) | ‡ | ‡ | ‡ | ‡ | ‡ | ‡ | ‡ | ‡ | ‡ | ‡ |
| (00111) | ‡ | ‡ | ‡ | ‡ | ‡ | ‡ | ‡ | ‡ | ‡ | ‡ |
| (01000) | ‡ | ‡ | ‡ | ‡ | ‡ | ‡ | ‡ | ‡ | ‡ | ‡ |
| (01001) | ‡ | ‡ | ‡ | ‡ | ‡ | ‡ | ‡ | ‡ | ‡ | ‡ |
| (01010) | ‡ | ‡ | ‡ | ‡ | ‡ | ‡ | ‡ | ‡ | ‡ | ‡ |
| (01011) | ‡ | ‡ | ‡ | ‡ | ‡ | ‡ | ‡ | ‡ | ‡ | ‡ |
| (01100) | ‡ | ‡ | ‡ | ‡ | ‡ | ‡ | ‡ | ‡ | ‡ | ‡ |
| (01101) | ‡ | ‡ | ‡ | ‡ | ‡ | ‡ | ‡ | ‡ | ‡ | ‡ |
| (01110) | ‡ | ‡ | ‡ | ‡ | ‡ | ‡ | ‡ | ‡ | ‡ | ‡ |
| (01111) | ‡ | ‡ | ‡ | ‡ | ‡ | ‡ | ‡ | ‡ | ‡ | ‡ |
| (10000) | ‡ | ‡ | ‡ | ‡ | ‡ | ‡ | ‡ | ‡ | ‡ | ‡ |
| (10001) | ‡ | ‡ | ‡ | ‡ | ‡ | ‡ | ‡ | ‡ | ‡ | ‡ |
| (10010) | ‡ | ‡ | ‡ | ‡ | ‡ | ‡ | ‡ | ‡ | ‡ | ‡ |
| (10011) | ‡ | ‡ | ‡ | ‡ | ‡ | ‡ | ‡ | ‡ | ‡ | ‡ |
| (10100) | ‡ | ‡ | ‡ | ‡ | ‡ | ‡ | ‡ | ‡ | ‡ | ‡ |
| (10101) | ‡ | ‡ | ‡ | ‡ | ‡ | ‡ | ‡ | ‡ | ‡ | ‡ |
| (10110) | ‡ | ‡ | ‡ | ‡ | ‡ | ‡ | ‡ | ‡ | ‡ | ‡ |
| (10111) | ‡ | ‡ | ‡ | ‡ | ‡ | ‡ | ‡ | ‡ | ‡ | ‡ |
| (11000) | ‡ | ‡ | ‡ | ‡ | ‡ | ‡ | ‡ | ‡ | ‡ | ‡ |
| (11001) | ‡ | ‡ | ‡ | ‡ | ‡ | ‡ | ‡ | ‡ | ‡ | ‡ |
| (11010) | ‡ | ‡ | ‡ | ‡ | ‡ | ‡ | ‡ | ‡ | ‡ | ‡ |
| (11011) | ‡ | ‡ | ‡ | ‡ | ‡ | ‡ | ‡ | ‡ | ‡ | ‡ |
| (11100) | ‡ | ‡ | ‡ | ‡ | ‡ | ‡ | ‡ | ‡ | ‡ | ‡ |
| (11101) | ‡ | ‡ | ‡ | ‡ | ‡ | ‡ | ‡ | ‡ | ‡ | ‡ |
| (11110) | ‡ | ‡ | ‡ | ‡ | ‡ | ‡ | ‡ | ‡ | ‡ | ‡ |
| (11111) | ‡ | ‡ | ‡ | ‡ | ‡ | ‡ | ‡ | ‡ | ‡ | ‡ |

| a d | receiving input | $G_1$ | $G_2$ | $G_3$ | $G_4$ | $G_5$ | $G_6$ | $G_7$ | $G_8$ | $G_9$ | $G_{10}$ |
|---|---|---|---|---|---|---|---|---|---|---|---|
| | | 0101 | 0101 | 0101 | 0101 | .... | .... | .... | .... | .... | .... |
| | | 0011 | .... | .... | .... | 0101 | 0101 | 0101 | .... | .... | .... |
| | | .... | 0011 | .... | .... | 0011 | .... | .... | 0101 | 0101 | .... |
| | | .... | .... | 0011 | .... | .... | 0011 | .... | 0011 | .... | 0101 |
| | | .... | .... | .... | 0011 | .... | .... | 0011 | .... | 0011 | 0011 |
| (00000) | 1 | 1 | 1 | 1 | 1 | 1 | 1 | 1 | 1 | 1 | 1 |
| (00001) | 0 | 0 | 0 | 0 | 0 | 0 | 0 | 0 | 0 | 0 | 0 |
| (00010) | 1 | 1 | 1 | 1 | 1 | 1 | 1 | 1 | 1 | 1 | 1 |
| (00011) | 0 | 0 | 0 | 0 | 0 | 0 | 0 | 0 | 0 | 0 | 0 |
| (00100) | 1 | 1 | 1 | 1 | 1 | 1 | 1 | 1 | 1 | 1 | 1 |
| (00101) | 0 | 0 | 0 | 0 | 0 | 0 | 0 | 0 | 0 | 0 | 0 |
| (00110) | 1 | 1 | 1 | 1 | 1 | 1 | 1 | 1 | 1 | 1 | 1 |
| (00111) | 0 | 0 | 0 | 0 | 0 | 0 | 0 | 0 | 0 | 0 | 0 |
| (01000) | 0 | 0 | 0 | 0 | 0 | 0 | 0 | 0 | 0 | 0 | 0 |
| (01001) | 1 | 1 | 1 | 1 | 1 | 1 | 1 | 1 | 1 | 1 | 1 |
| (01010) | 0 | 0 | 0 | 0 | 0 | 0 | 0 | 0 | 0 | 0 | 0 |
| (01011) | 1 | 1 | 1 | 1 | 1 | 1 | 1 | 1 | 1 | 1 | 1 |
| (01100) | 1 | 1 | 1 | 1 | 1 | 1 | 1 | 1 | 1 | 1 | 1 |
| (01101) | 0 | 0 | 0 | 0 | 0 | 0 | 0 | 0 | 0 | 0 | 0 |
| (01110) | 1 | 1 | 1 | 1 | 1 | 1 | 1 | 1 | 1 | 1 | 1 |
| (01111) | 0 | 0 | 0 | 0 | 0 | 0 | 0 | 0 | 0 | 0 | 0 |
| (10000) | 0 | 0 | 0 | 0 | 0 | 0 | 0 | 0 | 0 | 0 | 0 |
| (10001) | 1 | 1 | 1 | 1 | 1 | 1 | 1 | 1 | 1 | 1 | 1 |
| (10010) | 0 | 0 | 0 | 0 | 0 | 0 | 0 | 0 | 0 | 0 | 0 |
| (10011) | 1 | 1 | 1 | 1 | 1 | 1 | 1 | 1 | 1 | 1 | 1 |
| (10100) | 1 | 1 | 1 | 1 | 1 | 1 | 1 | 1 | 1 | 1 | 1 |
| (10101) | 0 | 0 | 0 | 0 | 0 | 0 | 0 | 0 | 0 | 0 | 0 |
| (10110) | 1 | 1 | 1 | 1 | 1 | 1 | 1 | 1 | 1 | 1 | 1 |
| (10111) | 0 | 0 | 0 | 0 | 0 | 0 | 0 | 0 | 0 | 0 | 0 |
| (11000) | 0 | 0 | 0 | 0 | 0 | 0 | 0 | 0 | 0 | 0 | 0 |
| (11001) | 1 | 1 | 1 | 1 | 1 | 1 | 1 | 1 | 1 | 1 | 1 |
| (11010) | 0 | 0 | 0 | 0 | 0 | 0 | 0 | 0 | 0 | 0 | 0 |
| (11011) | 1 | 1 | 1 | 1 | 1 | 1 | 1 | 1 | 1 | 1 | 1 |
| (11100) | 0 | 0 | 0 | 0 | 0 | 0 | 0 | 0 | 0 | 0 | 0 |
| (11101) | 1 | 1 | 1 | 1 | 1 | 1 | 1 | 1 | 1 | 1 | 1 |
| (11110) | 0 | 0 | 0 | 0 | 0 | 0 | 0 | 0 | 0 | 0 | 0 |
| (11111) | 1 | 1 | 1 | 1 | 1 | 1 | 1 | 1 | 1 | 1 | 1 |
| parity check e:even | | eeee | eeee | eeee | eeee | eeee | eeee | eeee | eeee | eeee | eeee |

| a d<br>receiving input | | $G_1$<br>0101<br>0011<br>....<br>....<br>.... | $G_2$<br>0101<br>....<br>0011<br>....<br>.... | $G_3$<br>0101<br>....<br>....<br>0011<br>.... | $G_4$<br>0101<br>....<br>....<br>....<br>0011 | $G_5$<br>....<br>0101<br>0011<br>....<br>.... | $G_6$<br>....<br>0101<br>....<br>0011<br>.... | $G_7$<br>....<br>0101<br>....<br>....<br>0011 | $G_8$<br>....<br>....<br>0101<br>0011<br>.... | $G_9$<br>....<br>....<br>0101<br>....<br>0011 | $G_{10}$<br>....<br>....<br>....<br>0101<br>0011 |
|---|---|---|---|---|---|---|---|---|---|---|---|
| (00000) | 1 | 1 | 1 | 1 | 1 | 1 | 1 | 1 | 1 | 1 | 1 |
| (00001) | 0 | 0 | 0 | 0 | 0 | 0 | 0 | 0 | 0 | 0 | 0 |
| (00010) | 1 |   | 1 | 1 | 1 | 1 | 1 | 1 | 1 | 1 | 1 |
| (00011) | 0 |   | 0 | 0 | 0 | 0 | 0 | 0 | 0 | 0 | 0 |
| (00100) | 1 | 1 |   | 1 | 1 |   | 1 | 1 | 1 | 1 | 1 |
| (00101) | 0 | 0 |   | 0 | 0 |   | 0 | 0 | 0 | 0 | 0 |
| (00110) | 1 |   | 1 | 1 | 1 |   | 1 | 1 | 1 | 1 | 1 |
| (00111) | 0 |   | 0 | 0 | 0 |   | 0 | 0 | 0 | 0 | 0 |
| (01000) | 0 | 0 | 0 |   | 0 | 0 |   | 0 | 0 | 0 | 0 |
| (01001) | 1 | 1 | 1 |   | 1 | 1 |   | 1 | 1 | 1 | 1 |
| (01010) | 0 | 0 | 0 |   | 0 | 0 |   | 0 | 0 | 0 | 0 |
| (01011) | 0 | 0 | 0 |   | 0 | 0 |   | 0 | 0 | 0 | 0 |
| (01100) | 0 | 0 | 0 | 0 | 0 | 0 | 0 | 0 | 0 | 0 | 0 |
| (01101) | 0 | 0 | 0 | 0 | 0 | 0 | 0 | 0 | 0 | 0 | 0 |
| (01110) | 1 |   | 1 | 1 | 1 |   | 1 | 1 | 1 | 1 | 1 |
| (01111) | 1 |   | 1 | 1 | 1 |   | 1 | 1 | 1 | 1 | 1 |
| (10000) | 1 | 1 | 1 | 1 | 1 | 1 | 1 | 1 | 1 | 1 | 1 |
| (10001) | 1 | 1 | 1 | 1 | 1 | 1 | 1 | 1 | 1 | 1 | 1 |
| (10010) | 0 |   | 0 | 0 |   | 0 | 0 | 0 | 0 | 0 | 0 |
| (10011) | 1 |   | 1 | 1 |   | 1 | 1 | 1 | 1 | 1 | 1 |
| (10100) | 1 | 1 |   | 1 | 1 |   | 1 | 1 | 1 | 1 | 1 |
| (10101) | 0 | 0 |   | 0 | 0 |   | 0 | 0 | 0 | 0 | 0 |
| (10110) | 1 |   | 1 | 1 | 1 |   | 1 | 1 | 1 | 1 | 1 |
| (10111) | 0 |   | 0 | 0 | 0 |   | 0 | 0 | 0 | 0 | 0 |
| (11000) | 0 | 0 | 0 |   | 0 | 0 |   | 0 | 0 | 0 | 0 |
| (11001) | 1 | 1 | 1 |   | 1 | 1 |   | 1 | 1 | 1 | 1 |
| (11010) | 0 | 0 | 0 |   | 0 | 0 |   | 0 | 0 | 0 | 0 |
| (11011) | 1 |   | 1 | 1 | 1 | 1 |   | 1 | 1 | 1 | 1 |
| (11100) | 0 | 0 |   | 0 | 0 | 0 | 0 | 0 | 0 | 0 | 0 |
| (11101) | 1 | 1 |   | 1 | 1 | 1 | 1 | 1 | 1 | 1 | 1 |
| (11110) | 0 |   | 0 | 0 | 0 | 0 | 0 | 0 | 0 | 0 | 0 |
| (11111) | 1 |   | 1 | 1 | 1 | 1 | 1 | 1 | 1 | 1 | 1 |
| parity check | | eeeb | ebbb | bebe | bebe | bbbb | bebe | bcbe | bebe | bebe | ebbe | e:even
b:break

FIG. 14

| $(2^5, 16)_3$ a d | receiving input | $G_1$ 0101 0011 .... .... .... | $G_2$ 0101 .... 0011 .... .... | $G_3$ 0101 .... .... 0011 .... | $G_4$ 0101 .... .... .... 0011 | $G_5$ .... 0101 0011 .... .... | $G_6$ .... 0101 .... 0011 .... | $G_7$ .... 0101 .... .... 0011 | $G_8$ .... .... 0101 0011 .... | $G_9$ .... .... 0101 .... 0011 | $G_{10}$ .... .... .... 0101 0011 |
|---|---|---|---|---|---|---|---|---|---|---|---|
| (00000) | 1 | 1 | 1 | 1 | 1 | 1 | 1 | 1 | 1 | 1 | 1 |
| (00001) | 1 | 1 | 1 | 1 | 1 | 1 | 1 | 1 | 1 | 1 | 1 |
| (00010) | 1 | 1 | 1 | 1 | 1 | 1 | 1 | 1 | 1 | 1 | 1 |
| (00011) | 0 |   | 0 | 0 | 0 | 0 | 0 | 0 | 0 | 0 | 0 |
| (00100) | 1 | 1 |   | 1 | 1 |   | 1 | 1 | 1 | 1 | 1 |
| (00101) | 0 | 0 |   | 0 | 0 |   | 0 | 0 | 0 | 0 | 0 |
| (00110) | 1 |   | 1 | 1 | 1 |   | 1 | 1 | 1 | 1 | 1 |
| (00111) | 0 |   | 0 | 0 | 0 |   | 0 | 0 | 0 | 0 | 0 |
| (01000) | 0 | 0 | 0 |   | 0 | 0 | 0 |   | 0 | 0 | 0 |
| (01001) | 1 | 1 | 1 |   | 1 | 1 | 1 |   | 1 | 1 | 1 |
| (01010) | 0 | 0 | 0 |   | 0 | 0 | 0 |   | 0 | 0 | 0 |
| (01011) | 1 |   | 1 | 1 |   | 1 | 1 | 1 |   | 1 | 1 |
| (01100) | 1 | 1 |   | 1 | 1 |   | 1 | 1 |   | 1 | 1 |
| (01101) | 1 | 1 |   | 1 | 1 |   | 1 | 1 |   | 1 | 1 |
| (01110) | 1 |   | 1 | 1 | 1 |   | 1 | 1 |   | 1 | 1 |
| (01111) | 0 |   | 0 | 0 | 0 |   | 0 | 0 |   | 0 | 0 |
| (10000) | 0 | 0 | 0 | 0 |   | 0 | 0 |   | 0 | 0 | 0 |
| (10001) | 1 | 1 | 1 | 1 |   | 1 | 1 |   | 1 | 1 | 1 |
| (10010) | 0 | 0 | 0 | 0 |   | 0 | 0 |   | 0 | 0 | 0 |
| (10011) | 1 |   | 1 | 1 |   | 1 | 1 | 1 |   | 1 | 1 |
| (10100) | 1 | 1 |   | 1 | 1 |   | 1 | 1 | 1 |   | 1 |
| (10101) | 0 | 0 |   | 0 | 0 |   | 0 | 0 | 0 |   | 0 |
| (10110) | 1 |   | 1 | 1 | 1 |   | 1 | 1 | 1 |   | 1 |
| (10111) | 0 |   | 0 | 0 | 0 |   | 0 | 0 | 0 |   | 0 |
| (11000) | 0 | 0 | 0 |   | 0 | 0 | 0 | 0 | 0 | 0 | 0 |
| (11001) | 1 | 1 | 1 |   | 1 | 1 | 1 | 1 | 1 | 1 | 1 |
| (11010) | 0 | 0 | 0 |   | 0 | 0 | 0 | 0 | 0 | 0 | 0 |
| (11011) | 1 |   | 1 | 1 | 1 |   | 1 | 1 | 1 | 1 | 1 |
| (11100) | 0 | 0 |   | 0 | 0 | 0 | 0 | 0 | 0 | 0 | 0 |
| (11101) | 1 | 1 |   | 1 | 1 | 1 | 1 | 1 | 1 | 1 | 1 |
| (11110) | 0 |   | 0 | 0 | 0 | 0 | 0 | 0 | 0 | 0 | 0 |
| (11111) | 1 |   | 1 | 1 | 1 | 1 | 1 | 1 | 1 | 1 | 1 |
| parity check e:even b:break | | ebee | ebee | ebee | ebeb | beee | beee | beee | beee | beee | beee |

FIG. 15(a)

|   | $f_1$ | $f_2$ | $f_3$ | $f_4$ | $f_5$ |
|---|---|---|---|---|---|
| $G_1$ | 1 | 1 | | | |
| $G_2$ | 1 | | 1 | | |
| $G_3$ | 1 | | | 1 | |
| $G_4$ | 1 | | | | 1 |
| $G_5$ | | 1 | 1 | | |
| $G_6$ | | 1 | | 1 | |
| $G_7$ | | 1 | | | 1 |
| $G_8$ | | | 1 | 1 | |
| $G_9$ | | | 1 | | 1 |
| $G_{10}$ | | | | 1 | 1 |

FIG. 15(b)

|   | $G_1$ | $G_2$ | $G_3$ | $G_4$ | $G_5$ | $G_6$ | $G_7$ | $G_8$ | $G_9$ | $G_{10}$ |
|---|---|---|---|---|---|---|---|---|---|---|
| $H_1 = f_5 f_4 f_3 f_2 f_1^4$ | 1 | 1 | 1 | 1 | | | | | | |
| $H_2 = f_5 f_4 f_3 f_2^4 f_1$ | 1 | | | | 1 | 1 | 1 | | | |
| $H_3 = f_5 f_4 f_3^4 f_2 f_1$ | | 1 | | | 1 | | | 1 | 1 | |
| $H_4 = f_5 f_4^4 f_3 f_2 f_1$ | | | 1 | | | 1 | | 1 | | 1 |
| $H_5 = f_5^4 f_4 f_3 f_2 f_1$ | | | | 1 | | | 1 | | 1 | 1 |

FIG. 16(a)

$$\begin{array}{c|ccccc} & f_1 & f_2 & f_3 & f_4 & f_5 \\ \hline G_1 & 1 & 1 & & & \\ G_2 & 1 & & 1 & & \\ G_3 & 1 & & & 1 & \\ G_4 & 1 & & & & 1 \\ \hline & f_1^* & f_2 & f_3 & f_4 & f_5 \end{array}$$

$$\begin{array}{c|ccccc} & f_1 & f_2 & f_3 & f_4 & f_5 \\ \hline G_5 & & 1 & 1 & & \\ G_6 & & 1 & & 1 & \\ G_7 & & 1 & & & 1 \\ G_1 & 1 & 1 & & & \\ \hline & f_1 & f_2^* & f_3 & f_4 & f_5 \end{array}$$

$$\begin{array}{c|ccccc} & f_1 & f_2 & f_3 & f_4 & f_5 \\ \hline G_8 & & & 1 & 1 & \\ G_9 & & & 1 & & 1 \\ G_2 & 1 & & 1 & & \\ G_5 & & 1 & 1 & & \\ \hline & f_1 & f_2 & f_3^* & f_4 & f_5 \end{array}$$

$$\begin{array}{c|ccccc} & f_1 & f_2 & f_3 & f_4 & f_5 \\ \hline G_{10} & & & & 1 & 1 \\ G_3 & 1 & & & 1 & \\ G_6 & & 1 & & 1 & \\ G_8 & & & 1 & 1 & \\ \hline & f_1 & f_2 & f_3 & f_4^* & f_5 \end{array}$$

$$\begin{array}{c|ccccc} & f_1 & f_2 & f_3 & f_4 & f_5 \\ \hline G_{10} & & & & 1 & 1 \\ G_9 & & & 1 & & 1 \\ G_7 & & 1 & & & 1 \\ G_4 & 1 & & & & 1 \\ \hline & f_1 & f_2 & f_3 & f_4 & f_5^* \end{array}$$

| $(2^5, 16)_3$ | | $G_1$ | $G_2$ | $G_3$ | $G_4$ | $G_5$ | $G_6$ | $G_7$ | $G_8$ | $G_9$ | $G_{10}$ |
|---|---|---|---|---|---|---|---|---|---|---|---|
| | | 0101 | 0101 | 0101 | 0101 | .... | .... | .... | .... | .... | .... |
| | | 0011 | .... | .... | .... | 0101 | 0101 | 0101 | .... | .... | .... |
| | | .... | 0011 | .... | .... | 0011 | .... | .... | 0101 | 0101 | .... |
| a d | receiving input | .... | .... | 0011 | .... | .... | 0011 | .... | 0011 | .... | 0101 |
| | | .... | .... | .... | 0011 | .... | .... | 0011 | .... | 0011 | 0011 |
| (00000) | 1 | 1 | 1 | 1 | 1 | 1 | 1 | 1 | 1 | 1 | 1 |
| (00001) | 1 | 1 | 1 | 1 | 1 | 1 | 1 | 1 | 1 | 1 | 1 |
| (00010) | 1 | 1 | 1 | 1 | 1 | 1 | 1 | 1 | 1 | 1 | 1 |
| (00011) | 0 | | 0 | 0 | 0 | 0 | 0 | 0 | 0 | 0 | 0 |
| (00100) | 1 | 1 | | 1 | 1 | 1 | | 1 | 1 | 1 | 1 |
| (00101) | 0 | 0 | | 0 | 0 | 0 | | 0 | 0 | 0 | 0 |
| (00110) | 1 | | 1 | 1 | 1 | | 1 | 1 | 1 | 1 | 1 |
| (00111) | 0 | | 0 | 0 | 0 | | 0 | 0 | 0 | 0 | 0 |
| (01000) | 0 | 0 | 0 | | 0 | 0 | 0 | | 0 | 0 | | 0 |
| (01001) | 1 | 1 | 1 | | 1 | 1 | 1 | | 1 | 1 | | 1 |
| (01010) | 0 | | 0 | 0 | | 0 | 0 | 0 | | 0 | 0 | 0 |
| (01011) | 1 | | 1 | 1 | | 1 | 1 | 1 | | 1 | 1 | 1 |
| (01100) | 1 | 1 | | 1 | 1 | 1 | | 1 | 1 | | 1 | 1 |
| (01101) | 0 | 0 | | 0 | 0 | 0 | | 0 | 0 | | 0 | 0 |
| (01110) | 1 | | 1 | 1 | 1 | 1 | | 1 | 1 | | 1 | 1 |
| (01111) | 0 | | 0 | 0 | 0 | 0 | | 0 | 0 | | 0 | 0 |
| (10000) | 0 | 0 | 0 | 0 | | 0 | 0 | 0 | | 0 | 0 | 0 |
| (10001) | 1 | 1 | 1 | 1 | | 1 | 1 | 1 | | 1 | 1 | 1 |
| (10010) | 0 | 0 | 0 | 0 | | 0 | 0 | 0 | 0 | 0 | | 0 |
| (10011) | 1 | | 1 | 1 | 1 | | 1 | 1 | 1 | 1 | 1 | 1 |
| (10100) | 1 | 1 | | 1 | 1 | | 1 | 1 | 1 | 1 | | 1 | 1 |
| (10101) | 0 | 0 | | 0 | 0 | | 0 | 0 | 0 | 0 | 0 | | 0 |
| (10110) | 1 | | 1 | 1 | 1 | | 1 | 1 | 1 | 1 | | 1 | 1 |
| (10111) | 0 | | 0 | 0 | 0 | | 0 | 0 | 0 | 0 | | 0 | 0 |
| (11000) | 0 | 0 | 0 | | 0 | 0 | 0 | 0 | 0 | 0 | 0 |
| (11001) | 0 | 0 | 0 | | 0 | 0 | 0 | 0 | 0 | 0 | 0 |
| (11010) | 0 | | 0 | 0 | 0 | 0 | 0 | 0 | 0 | 0 | 0 |
| (11011) | 1 | | 1 | 1 | | 1 | 1 | 1 | 1 | 1 | 1 | 1 |
| (11100) | 0 | 0 | | 0 | 0 | 0 | 0 | 0 | 0 | 0 | 0 |
| (11101) | 1 | 1 | | 1 | 1 | 1 | 1 | 1 | 1 | 1 | 1 |
| (11110) | 0 | | 0 | 0 | 0 | 0 | 0 | 0 | 0 | 0 | 0 |
| (11111) | 1 | | 1 | 1 | 1 | 1 | 1 | 1 | 1 | 1 | 1 |
| parity check | | eeee | eeee | ebeb | ebeb | eeee | bbeb | bebe | beee | bebe | beeb | e: even
b: break

FIG. 18

$H_1 = G_1 \times G_2 \times G_3 \times G_4$ $(\quad) \times (\quad) \times (\cdot 0 \cdot \cdot 1) \times (0 \cdot \cdot \cdot 1)$
= indefinite
$(\quad) \times (\quad) \times (\cdot 0 \cdot \cdot 1) \times (1 \cdot \cdot \cdot 1)$
= indefinite
$(\quad) \times (\cdot 1 \cdot \cdot 1) \times (\cdot 0 \cdot \cdot 1) \times (0 \cdot \cdot \cdot 1)$
= indefinite
$(\quad) \times (\cdot 1 \cdot \cdot 1) \times (\cdot 0 \cdot \cdot 1) \times (1 \cdot \cdot \cdot 1)$
= indefinite $H_2 = G_1 \times G_5 \times G_6 \times G_7$ $(\quad) \times (\quad) \times (\cdot 0 \cdot 0 \cdot) \times (0 \cdot \cdot 0 \cdot)$
= indefinite
$(\quad) \times (\quad) \times (\cdot 0 \cdot 0 \cdot) \times (1 \cdot \cdot 0 \cdot)$
= indefinite
$(\quad) \times (\quad) \times (\cdot 1 \cdot 0 \cdot) \times (0 \cdot \cdot 0 \cdot)$
= indefinite
$(\quad) \times (\quad) \times (\cdot 1 \cdot 0 \cdot) \times (1 \cdot \cdot 0 \cdot)$
= indefinite $H_3 = G_2 \times G_5 \times G_8 \times G_9$ $(\quad) \times (\quad) \times (\cdot 00 \cdot \cdot) \times (0 \cdot 1 \cdot \cdot)$
= indefinite
$(\quad) \times (\quad) \times (\cdot 00 \cdot \cdot) \times (1 \cdot 0 \cdot \cdot)$
= indefinite
$(\quad) \times (\quad) \times (\cdot 10 \cdot \cdot) \times (0 \cdot 1 \cdot \cdot)$
= indefinite
$(\quad) \times (\quad) \times (\cdot 10 \cdot \cdot) \times (1 \cdot 0 \cdot \cdot)$
= indefinite $H_4 = G_3 \times G_5 \times G_8 \times G_{10}$ $(\cdot 0 \cdot \cdot 1) \times (\cdot 0 \cdot 0 \cdot) \times (\cdot 00 \cdot \cdot) \times (00 \cdot \cdot \cdot)$
= <u>(00001)</u>
$(\cdot 0 \cdot \cdot 1) \times (\cdot 0 \cdot 0 \cdot) \times (\cdot 00 \cdot \cdot) \times (01 \cdot \cdot \cdot)$
= indefinite
$(\cdot 0 \cdot \cdot 1) \times (\cdot 0 \cdot 0 \cdot) \times (\cdot 10 \cdot \cdot) \times (00 \cdot \cdot \cdot)$
= indefinite
$(\cdot 0 \cdot \cdot 1) \times (\cdot 0 \cdot 0 \cdot) \times (\cdot 10 \cdot \cdot) \times (01 \cdot \cdot \cdot)$
= indefinite
$(\cdot 0 \cdot \cdot 1) \times (\cdot 1 \cdot 0 \cdot) \times (\cdot 00 \cdot \cdot) \times (00 \cdot \cdot \cdot)$
= indefinite
$(\cdot 0 \cdot \cdot 1) \times (\cdot 1 \cdot 0 \cdot) \times (\cdot 00 \cdot \cdot) \times (01 \cdot \cdot \cdot)$
= indefinite
$(\cdot 0 \cdot \cdot 1) \times (\cdot 1 \cdot 0 \cdot) \times (\cdot 10 \cdot \cdot) \times (00 \cdot \cdot \cdot)$
= indefinite
$(\cdot 0 \cdot \cdot 1) \times (\cdot 1 \cdot 0 \cdot) \times (\cdot 10 \cdot \cdot) \times (01 \cdot \cdot \cdot)$
= indefinite

FIG. 19

$H_4 = G_3 \times G_5 \times G_8 \times G_{10}$ $(\cdot 1 \cdot \cdot 1) \times (\cdot 0 \cdot 0 \cdot) \times (\cdot 00 \cdot \cdot) \times (00 \cdot \cdot \cdot)$
= indefinite $(\cdot 1 \cdot \cdot 1) \times (\cdot 0 \cdot 0 \cdot) \times (\cdot 00 \cdot \cdot) \times (01 \cdot \cdot \cdot)$
= indefinite $(\cdot 1 \cdot \cdot 1) \times (\cdot 0 \cdot 0 \cdot) \times (\cdot 10 \cdot \cdot) \times (00 \cdot \cdot \cdot)$
= indefinite $(\cdot 1 \cdot \cdot 1) \times (\cdot 0 \cdot 0 \cdot) \times (\cdot 10 \cdot \cdot) \times (01 \cdot \cdot \cdot)$
= indefinite $(\cdot 1 \cdot \cdot 1) \times (\cdot 1 \cdot 0 \cdot) \times (\cdot 00 \cdot \cdot) \times (00 \cdot \cdot \cdot)$
= indefinite $(\cdot 1 \cdot \cdot 1) \times (\cdot 1 \cdot 0 \cdot) \times (\cdot 10 \cdot \cdot) \times (00 \cdot \cdot \cdot)$
= indefinite $(\cdot 1 \cdot \cdot 1) \times (\cdot 1 \cdot 0 \cdot) \times (\cdot 10 \cdot \cdot) \times (00 \cdot \cdot \cdot)$
= indefinite $(\cdot 1 \cdot \cdot 1) \times (\cdot 1 \cdot 0 \cdot) \times (\cdot 10 \cdot \cdot) \times (01 \cdot \cdot \cdot)$
= indefinite $H_5 = G_4 \times G_7 \times G_8 \times G_{10}$ $(0 \cdot \cdot \cdot 1) \times (0 \cdot \cdot 0 \cdot) \times (0 \cdot 0 \cdot \cdot) \times (00 \cdot \cdot \cdot)$
= (00001)

$(0 \cdot \cdot \cdot 1) \times (0 \cdot \cdot 0 \cdot) \times (0 \cdot 0 \cdot \cdot) \times (01 \cdot \cdot \cdot)$
= (01001)

$(0 \cdot \cdot \cdot 1) \times (0 \cdot \cdot 0 \cdot) \times (1 \cdot 0 \cdot \cdot) \times (00 \cdot \cdot \cdot)$
= indefinite $(0 \cdot \cdot \cdot 1) \times (0 \cdot \cdot 0 \cdot) \times (1 \cdot 0 \cdot \cdot) \times (01 \cdot \cdot \cdot)$
= indefinite $(0 \cdot \cdot \cdot 1) \times (0 \cdot \cdot 1 \cdot) \times (0 \cdot 0 \cdot \cdot) \times (00 \cdot \cdot \cdot)$
= indefinite $(0 \cdot \cdot \cdot 1) \times (0 \cdot \cdot 1 \cdot) \times (0 \cdot 0 \cdot \cdot) \times (01 \cdot \cdot \cdot)$
= (01001)

$(0 \cdot \cdot \cdot 1) \times (0 \cdot \cdot 1 \cdot) \times (1 \cdot 0 \cdot \cdot) \times (00 \cdot \cdot \cdot)$
= indefinite $(0 \cdot \cdot \cdot 1) \times (0 \cdot \cdot 1 \cdot) \times (1 \cdot 0 \cdot \cdot) \times (01 \cdot \cdot \cdot)$
= indefinite $(1 \cdot \cdot \cdot 1) \times (0 \cdot \cdot 0 \cdot) \times (0 \cdot 0 \cdot \cdot) \times (00 \cdot \cdot \cdot)$
= indefinite $(1 \cdot \cdot \cdot 1) \times (0 \cdot \cdot 0 \cdot) \times (0 \cdot 0 \cdot \cdot) \times (01 \cdot \cdot \cdot)$
= indefinite $(1 \cdot \cdot \cdot 1) \times (0 \cdot \cdot 0 \cdot) \times (1 \cdot 0 \cdot \cdot) \times (00 \cdot \cdot \cdot)$
= indefinite $(1 \cdot \cdot \cdot 1) \times (0 \cdot \cdot 0 \cdot) \times (1 \cdot 0 \cdot \cdot) \times (01 \cdot \cdot \cdot)$
= indefinite $(1 \cdot \cdot \cdot 1) \times (0 \cdot \cdot 1 \cdot) \times (0 \cdot 0 \cdot \cdot) \times (00 \cdot \cdot \cdot)$
= indefinite $(1 \cdot \cdot \cdot 1) \times (0 \cdot \cdot 1 \cdot) \times (0 \cdot 0 \cdot \cdot) \times (01 \cdot \cdot \cdot)$
= indefinite $(1 \cdot \cdot \cdot 1) \times (0 \cdot \cdot 1 \cdot) \times (1 \cdot 0 \cdot \cdot) \times (00 \cdot \cdot \cdot)$
= indefinite $(1 \cdot \cdot \cdot 1) \times (0 \cdot \cdot 1 \cdot) \times (1 \cdot 0 \cdot \cdot) \times (01 \cdot \cdot \cdot)$
= indefinite

| a d | once correction data | $G_1$ 0101 0011 .... .... .... | $G_2$ 0101 .... 0011 .... .... | $G_3$ 0101 .... .... 0011 .... | $G_4$ 0101 .... .... .... 0011 | $G_5$ .... 0101 0011 .... .... | $G_6$ .... 0101 .... 0011 .... | $G_7$ .... 0101 .... .... 0011 | $G_8$ .... .... 0101 0011 .... | $G_9$ .... .... 0101 .... 0011 | $G_{10}$ .... .... .... 0101 0011 |
|---|---|---|---|---|---|---|---|---|---|---|---|
| (00000) | 1 | 1 | 1 | 1 | 1 | 1 | 1 | 1 | 1 | 1 | 1 |
| (00001) | 0 | 0 | 0 | 0 | 0 | 0 | 0 | 0 | 0 | 0 | 0 |
| (00010) | 1 | 1 | 1 | 1 | 1 | 1 | 1 | 1 | 1 | 1 | 1 |
| (00011) | 0 |   | 0 | 0 | 0 | 0 | 0 | 0 | 0 | 0 | 0 |
| (00100) | 1 | 1 |   | 1 | 1 |   | 1 | 1 | 1 | 1 | 1 |
| (00101) | 0 | 0 |   | 0 | 0 |   | 0 | 0 | 0 | 0 | 0 |
| (00110) | 1 |   | 1 | 1 | 1 |   | 1 | 1 | 1 | 1 | 1 |
| (00111) | 0 |   | 0 | 0 | 0 |   | 0 | 0 | 0 | 0 | 0 |
| (01000) | 0 | 0 | 0 |   | 0 | 0 |   | 0 | 0 | 0 | 0 |
| (01001) | 0 | 0 | 0 |   | 0 | 0 |   | 0 | 0 | 0 | 0 |
| (01010) | 0 |   | 0 | 0 |   | 0 |   | 0 | 0 | 0 | 0 |
| (01011) | 1 |   | 1 | 1 |   | 1 |   | 1 | 1 | 1 | 1 |
| (01100) | 1 | 1 |   | 1 | 1 |   | 1 | 1 |   | 1 | 1 |
| (01101) | 0 | 0 |   | 0 | 0 |   | 0 | 0 |   | 0 | 0 |
| (01110) | 1 |   | 1 | 1 | 1 |   | 1 | 1 |   | 1 | 1 |
| (01111) | 0 |   | 0 | 0 | 0 |   | 0 | 0 |   | 0 | 0 |
| (10000) | 0 | 0 | 0 | 0 |   | 0 | 0 |   | 0 | 0 | 0 |
| (10001) | 1 | 1 | 1 | 1 |   | 1 | 1 |   | 1 | 1 | 1 |
| (10010) | 0 | 0 | 0 | 0 |   | 0 | 0 |   | 0 | 0 | 0 |
| (10011) | 1 |   | 1 | 1 |   | 1 | 1 |   | 1 | 1 | 1 |
| (10100) | 1 | 1 |   | 1 | 1 |   | 1 | 1 | 1 |   | 1 |
| (10101) | 0 | 0 |   | 0 | 0 |   | 0 | 0 | 0 |   | 0 |
| (10110) | 1 |   | 1 | 1 | 1 |   | 1 | 1 | 1 |   | 1 |
| (10111) | 0 |   | 0 | 0 | 0 |   | 0 | 0 | 0 |   | 0 |
| (11000) | 0 | 0 | 0 |   | 0 | 0 |   | 0 | 0 | 0 | 0 |
| (11001) | 0 | 0 | 0 |   | 0 | 0 |   | 0 | 0 | 0 | 0 |
| (11010) | 0 |   | 0 | 0 | 0 | 0 |   | 0 | 0 | 0 | 0 |
| (11011) | 1 |   | 1 | 1 | 1 | 1 |   | 1 | 1 | 1 | 1 |
| (11100) | 0 | 0 |   | 0 | 0 |   | 0 | 0 | 0 | 0 | 0 |
| (11101) | 1 | 1 |   | 1 | 1 |   | 1 | 1 | 1 | 1 | 1 |
| (11110) | 0 |   | 0 | 0 | 0 |   | 0 | 0 | 0 | 0 | 0 |
| (11111) | 1 |   | 1 | 1 | 1 |   | 1 | 1 | 1 | 1 | 1 | parity check:  eeee eeee eeee bbeb eeee bebe bebe eebe bbbe ebeb e: even
b: break

FIG. 21

$H_1 = G_1 \times G_2 \times G_3 \times G_4$ ( ) × ( ) × ( ) × (0···1)
= indefinite
( ) × ( ) × ( ) × (1···1)
= indefinite $H_2 = G_1 \times G_3 \times G_5 \times G_7$ ( ) × ( ) × ( ) × (0··0·)
= indefinite
( ) × ( ) × ( ) × (1··0·)
= indefinite $H_3 = G_3 \times G_5 \times G_8 \times G_9$ ( ) × ( ) × ( ) × (0·0··)
= indefinite
( ) × ( ) × ( ) × (1·0··)
= indefinite $H_4 = G_3 \times G_6 \times G_8 \times G_{10}$ ( ) × ( ) × ( ) × (01···)
= indefinite
( ) × ( ) × ( ) × (11···)
= indefinite $H_5 = G_4 \times G_7 \times G_9 \times G_{10}$ (0···1) × (0··0·) × (0·0··) × (01···)
= (01001)
(0···1) × (0··0·) × (0·0··) × (11···)
=
(0···1) × (0··0·) × (1·0··) × (01···)
=
(0···1) × (0··0·) × (1·0··) × (11···)
=
(0···1) × (1··0·) × (0·0··) × (01···)
=
(0···1) × (1··0·) × (0·0··) × (11···)
=
(0···1) × (1··0·) × (1·0··) × (01···)
=
(0···1) × (1··0·) × (1·0··) × (11···)
=.
(1···1) × (0··0·) × (0·0··) × (01···)
=
(1···1) × (0··0·) × (0·0··) × (11···)
=
(1···1) × (0··0·) × (1·0··) × (01···)
=
(1···1) × (0··0·) × (1·0··) × (11···)
=
(1···1) × (1··0·) × (0·0··) × (01···)
=

FIG. 22

$(1\cdots 1) \times (1\cdot\cdot 0\cdot) \times (0\cdot 0\cdot\cdot) \times (11\cdots)$ $=$ $(1\cdots 1) \times (1\cdot\cdot 0\cdot) \times (1\cdot 0\cdot\cdot) \times (01\cdots)$ $=$ $(1\cdots 1) \times (1\cdot\cdot 0\cdot) \times (1\cdot 0\cdot\cdot) \times (11\cdots)$ $\underline{=(11001)}$

FIG. 23

$H_1 = G_1 \times G_2 \times G_3 \times G_4$ , $(f_5 f_4 f_3 f_2 f_1)$ . $|G_i| = 4$

| | |
|---|---|
| $(\cdots 00) \times (\cdot\cdot 0 \cdot 0) \times (\cdot 0 \cdot\cdot 0) \times (0 \cdot\cdot\cdot 0) = (00000)$ | 1 |
| $(\cdots 00) \times (\cdot\cdot 0 \cdot 0) \times (\cdot 0 \cdot\cdot 0) \times (1 \cdot\cdot\cdot 0) = (10000)$ | 17 |
| $(\cdots 00) \times (\cdot\cdot 0 \cdot 0) \times (\cdot 1 \cdot\cdot 0) \times (0 \cdot\cdot\cdot 0) = (01000)$ | 9 |
| $(\cdots 00) \times (\cdot\cdot 0 \cdot 0) \times (\cdot 1 \cdot\cdot 0) \times (1 \cdot\cdot\cdot 0) = (11000)$ | 25 |
| $(\cdots 00) \times (\cdot\cdot 1 \cdot 0) \times (\cdot 0 \cdot\cdot 0) \times (0 \cdot\cdot\cdot 0) = (00100)$ | 5 |
| $(\cdots 00) \times (\cdot\cdot 1 \cdot 0) \times (\cdot 0 \cdot\cdot 0) \times (1 \cdot\cdot\cdot 0) = (10100)$ | 21 |
| $(\cdots 00) \times (\cdot\cdot 1 \cdot 0) \times (\cdot 1 \cdot\cdot 0) \times (0 \cdot\cdot\cdot 0) = (01100)$ | 13 |
| $(\cdots 00) \times (\cdot\cdot 1 \cdot 0) \times (\cdot 1 \cdot\cdot 0) \times (1 \cdot\cdot\cdot 0) = (11100)$ | 29 |
| $(\cdots 01) \times (\cdot\cdot 0 \cdot 1) \times (\cdot 0 \cdot\cdot 1) \times (0 \cdot\cdot\cdot 1) = (00001)$ | 2 |
| $(\cdots 01) \times (\cdot\cdot 0 \cdot 1) \times (\cdot 0 \cdot\cdot 1) \times (1 \cdot\cdot\cdot 1) = (10001)$ | 18 |
| $(\cdots 01) \times (\cdot\cdot 0 \cdot 1) \times (\cdot 1 \cdot\cdot 1) \times (0 \cdot\cdot\cdot 1) = (01001)$ | 10 |
| $(\cdots 01) \times (\cdot\cdot 0 \cdot 1) \times (\cdot 1 \cdot\cdot 1) \times (1 \cdot\cdot\cdot 1) = (11001)$ | 26 |
| $(\cdots 01) \times (\cdot\cdot 1 \cdot 1) \times (\cdot 1 \cdot\cdot 0) \times (0 \cdot\cdot\cdot 1) = (00101)$ | 6 |
| $(\cdots 01) \times (\cdot\cdot 1 \cdot 1) \times (\cdot 1 \cdot\cdot 0) \times (1 \cdot\cdot\cdot 1) = (10101)$ | 22 |
| $(\cdots 01) \times (\cdot\cdot 1 \cdot 1) \times (\cdot 1 \cdot\cdot 1) \times (0 \cdot\cdot\cdot 1) = (01101)$ | 14 |
| $(\cdots 01) \times (\cdot\cdot 1 \cdot 1) \times (\cdot 1 \cdot\cdot 1) \times (1 \cdot\cdot\cdot 1) = (11101)$ | 30 |
| $(\cdots 10) \times (\cdot\cdot 0 \cdot 0) \times (\cdot 0 \cdot\cdot 0) \times (0 \cdot\cdot\cdot 0) = (00010)$ | 3 |
| $(\cdots 10) \times (\cdot\cdot 0 \cdot 0) \times (\cdot 0 \cdot\cdot 0) \times (1 \cdot\cdot\cdot 0) = (10010)$ | 19 |
| $(\cdots 10) \times (\cdot\cdot 0 \cdot 0) \times (\cdot 1 \cdot\cdot 0) \times (0 \cdot\cdot\cdot 0) = (01010)$ | 11 |
| $(\cdots 10) \times (\cdot\cdot 0 \cdot 0) \times (\cdot 1 \cdot\cdot 0) \times (1 \cdot\cdot\cdot 0) = (11010)$ | 27 |
| $(\cdots 10) \times (\cdot\cdot 1 \cdot 0) \times (\cdot 0 \cdot\cdot 0) \times (0 \cdot\cdot\cdot 0) = (00110)$ | 7 |
| $(\cdots 10) \times (\cdot\cdot 1 \cdot 0) \times (\cdot 0 \cdot\cdot 0) \times (1 \cdot\cdot\cdot 0) = (10110)$ | 23 |
| $(\cdots 10) \times (\cdot\cdot 1 \cdot 0) \times (\cdot 1 \cdot\cdot 0) \times (0 \cdot\cdot\cdot 0) = (01110)$ | 15 |
| $(\cdots 10) \times (\cdot\cdot 1 \cdot 0) \times (\cdot 1 \cdot\cdot 0) \times (1 \cdot\cdot\cdot 0) = (11110)$ | 31 |
| $(\cdots 11) \times (\cdot\cdot 0 \cdot 1) \times (\cdot 0 \cdot\cdot 1) \times (0 \cdot\cdot\cdot 0) = (00011)$ | 4 |
| $(\cdots 11) \times (\cdot\cdot 0 \cdot 1) \times (\cdot 0 \cdot\cdot 1) \times (1 \cdot\cdot\cdot 0) = (10011)$ | 20 |
| $(\cdots 11) \times (\cdot\cdot 0 \cdot 1) \times (\cdot 1 \cdot\cdot 1) \times (0 \cdot\cdot\cdot 0) = (01011)$ | 12 |
| $(\cdots 11) \times (\cdot\cdot 0 \cdot 1) \times (\cdot 1 \cdot\cdot 1) \times (1 \cdot\cdot\cdot 0) = (11011)$ | 28 |
| $(\cdots 11) \times (\cdot\cdot 1 \cdot 1) \times (\cdot 0 \cdot\cdot 1) \times (0 \cdot\cdot\cdot 0) = (00111)$ | 8 |
| $(\cdots 11) \times (\cdot\cdot 1 \cdot 1) \times (\cdot 0 \cdot\cdot 1) \times (1 \cdot\cdot\cdot 0) = (10111)$ | 24 |
| $(\cdots 11) \times (\cdot\cdot 1 \cdot 1) \times (\cdot 1 \cdot\cdot 1) \times (0 \cdot\cdot\cdot 0) = (01111)$ | 16 |
| $(\cdots 11) \times (\cdot\cdot 1 \cdot 1) \times (\cdot 1 \cdot\cdot 1) \times (1 \cdot\cdot\cdot 0) = (11111)$ | 32 |

FIG. 24

$H_2 = G_1 \times G_5 \times G_6 \times G_7$, $(f_5 f_4 f_3 f_2 f_1)$   $|G_i|=4$

| | |
|---|---|
| $(\cdots 00) \times (\cdot\cdot 00 \cdot) \times (\cdot 0 \cdot 0 \cdot) \times (0 \cdot\cdot 0 \cdot) = (00000)$ | 1 |
| $(\cdots 00) \times (\cdot\cdot 00 \cdot) \times (\cdot 0 \cdot 0 \cdot) \times (1 \cdot\cdot 0 \cdot) = (10000)$ | 17 |
| $(\cdots 00) \times (\cdot\cdot 00 \cdot) \times (\cdot 1 \cdot 0 \cdot) \times (0 \cdot\cdot 0 \cdot) = (01000)$ | 9 |
| $(\cdots 00) \times (\cdot\cdot 00 \cdot) \times (\cdot 1 \cdot 0 \cdot) \times (1 \cdot\cdot 0 \cdot) = (11000)$ | 25 |
| $(\cdots 00) \times (\cdot\cdot 10 \cdot) \times (\cdot 0 \cdot 0 \cdot) \times (0 \cdot\cdot 0 \cdot) = (00100)$ | 5 |
| $(\cdots 00) \times (\cdot\cdot 10 \cdot) \times (\cdot 0 \cdot 0 \cdot) \times (1 \cdot\cdot 0 \cdot) = (10100)$ | 21 |
| $(\cdots 00) \times (\cdot\cdot 10 \cdot) \times (\cdot 1 \cdot 0 \cdot) \times (0 \cdot\cdot 0 \cdot) = (01100)$ | 13 |
| $(\cdots 00) \times (\cdot\cdot 10 \cdot) \times (\cdot 1 \cdot 0 \cdot) \times (1 \cdot\cdot 0 \cdot) = (11100)$ | 29 |
| $(\cdots 01) \times (\cdot\cdot 00 \cdot) \times (\cdot 0 \cdot 0 \cdot) \times (0 \cdot\cdot 0 \cdot) = (00001)$ | 2 |
| $(\cdots 01) \times (\cdot\cdot 00 \cdot) \times (\cdot 0 \cdot 0 \cdot) \times (1 \cdot\cdot 0 \cdot) = (10001)$ | 18 |
| $(\cdots 01) \times (\cdot\cdot 00 \cdot) \times (\cdot 1 \cdot 0 \cdot) \times (0 \cdot\cdot 0 \cdot) = (01001)$ | 10 |
| $(\cdots 01) \times (\cdot\cdot 00 \cdot) \times (\cdot 1 \cdot 0 \cdot) \times (1 \cdot\cdot 0 \cdot) = (11001)$ | 26 |
| $(\cdots 01) \times (\cdot\cdot 10 \cdot) \times (\cdot 0 \cdot 0 \cdot) \times (0 \cdot\cdot 0 \cdot) = (00101)$ | 6 |
| $(\cdots 01) \times (\cdot\cdot 10 \cdot) \times (\cdot 0 \cdot 0 \cdot) \times (1 \cdot\cdot 0 \cdot) = (10101)$ | 22 |
| $(\cdots 01) \times (\cdot\cdot 10 \cdot) \times (\cdot 0 \cdot 1 \cdot) \times (0 \cdot\cdot 0 \cdot) = (01101)$ | 14 |
| $(\cdots 01) \times (\cdot\cdot 10 \cdot) \times (\cdot 0 \cdot 1 \cdot) \times (1 \cdot\cdot 0 \cdot) = (11101)$ | 30 |
| $(\cdots 10) \times (\cdot\cdot 01 \cdot) \times (\cdot 0 \cdot 1 \cdot) \times (0 \cdot\cdot 1 \cdot) = (00010)$ | 3 |
| $(\cdots 10) \times (\cdot\cdot 01 \cdot) \times (\cdot 0 \cdot 1 \cdot) \times (1 \cdot\cdot 1 \cdot) = (10010)$ | 19 |
| $(\cdots 10) \times (\cdot\cdot 01 \cdot) \times (\cdot 1 \cdot 1 \cdot) \times (0 \cdot\cdot 1 \cdot) = (01010)$ | 11 |
| $(\cdots 10) \times (\cdot\cdot 01 \cdot) \times (\cdot 1 \cdot 1 \cdot) \times (1 \cdot\cdot 1 \cdot) = (11010)$ | 27 |
| $(\cdots 10) \times (\cdot\cdot 11 \cdot) \times (\cdot 0 \cdot 1 \cdot) \times (0 \cdot\cdot 1 \cdot) = (00110)$ | 7 |
| $(\cdots 10) \times (\cdot\cdot 11 \cdot) \times (\cdot 0 \cdot 1 \cdot) \times (1 \cdot\cdot 1 \cdot) = (10110)$ | 23 |
| $(\cdots 10) \times (\cdot\cdot 11 \cdot) \times (\cdot 1 \cdot 1 \cdot) \times (0 \cdot\cdot 1 \cdot) = (01110)$ | 15 |
| $(\cdots 10) \times (\cdot\cdot 11 \cdot) \times (\cdot 1 \cdot 1 \cdot) \times (1 \cdot\cdot 1 \cdot) = (11110)$ | 31 |
| $(\cdots 11) \times (\cdot\cdot 01 \cdot) \times (\cdot 0 \cdot 1 \cdot) \times (0 \cdot\cdot 1 \cdot) = (00011)$ | 4 |
| $(\cdots 11) \times (\cdot\cdot 01 \cdot) \times (\cdot 0 \cdot 1 \cdot) \times (1 \cdot\cdot 1 \cdot) = (10011)$ | 20 |
| $(\cdots 11) \times (\cdot\cdot 01 \cdot) \times (\cdot 1 \cdot 1 \cdot) \times (0 \cdot\cdot 1 \cdot) = (01011)$ | 12 |
| $(\cdots 11) \times (\cdot\cdot 01 \cdot) \times (\cdot 1 \cdot 1 \cdot) \times (1 \cdot\cdot 1 \cdot) = (11011)$ | 28 |
| $(\cdots 11) \times (\cdot\cdot 11 \cdot) \times (\cdot 0 \cdot 1 \cdot) \times (0 \cdot\cdot 1 \cdot) = (00111)$ | 8 |
| $(\cdots 11) \times (\cdot\cdot 11 \cdot) \times (\cdot 0 \cdot 1 \cdot) \times (1 \cdot\cdot 1 \cdot) = (10111)$ | 24 |
| $(\cdots 11) \times (\cdot\cdot 11 \cdot) \times (\cdot 1 \cdot 1 \cdot) \times (0 \cdot\cdot 1 \cdot) = (01111)$ | 16 |
| $(\cdots 11) \times (\cdot\cdot 11 \cdot) \times (\cdot 1 \cdot 1 \cdot) \times (1 \cdot\cdot 1 \cdot) = (11111)$ | 32 |

FIG. 25

$H_3 = G_2 \times G_5 \times G_6 \times G_9$ , $(f_5 f_4 f_3 f_2 f_1)$  $|G_i| = 4$

| | |
|---|---|
| $(\cdot\cdot 0\cdot 0) \times (\cdot\cdot 00\cdot) \times (\cdot 00\cdot\cdot) \times (0\cdot 0\cdot\cdot) = (00000)$ | 1 |
| $(\cdot\cdot 0\cdot 0) \times (\cdot\cdot 00\cdot) \times (\cdot 00\cdot\cdot) \times (1\cdot 0\cdot\cdot) = (10000)$ | 17 |
| $(\cdot\cdot 0\cdot 0) \times (\cdot\cdot 00\cdot) \times (\cdot 10\cdot\cdot) \times (0\cdot 0\cdot\cdot) = (01000)$ | 9 |
| $(\cdot\cdot 0\cdot 0) \times (\cdot\cdot 00\cdot) \times (\cdot 10\cdot\cdot) \times (1\cdot 0\cdot\cdot) = (11000)$ | 25 |
| $(\cdot\cdot 0\cdot 0) \times (\cdot\cdot 01\cdot) \times (\cdot 00\cdot\cdot) \times (0\cdot 0\cdot\cdot) = (00010)$ | 3 |
| $(\cdot\cdot 0\cdot 0) \times (\cdot\cdot 01\cdot) \times (\cdot 00\cdot\cdot) \times (1\cdot 0\cdot\cdot) = (10010)$ | 19 |
| $(\cdot\cdot 0\cdot 0) \times (\cdot\cdot 01\cdot) \times (\cdot 10\cdot\cdot) \times (0\cdot 0\cdot\cdot) = (01010)$ | 11 |
| $(\cdot\cdot 0\cdot 0) \times (\cdot\cdot 01\cdot) \times (\cdot 10\cdot\cdot) \times (1\cdot 0\cdot\cdot) = (11010)$ | 27 |
| $(\cdot\cdot 0\cdot 1) \times (\cdot\cdot 00\cdot) \times (\cdot 00\cdot\cdot) \times (0\cdot 0\cdot\cdot) = (00001)$ | 2 |
| $(\cdot\cdot 0\cdot 1) \times (\cdot\cdot 00\cdot) \times (\cdot 00\cdot\cdot) \times (1\cdot 0\cdot\cdot) = (10001)$ | 18 |
| $(\cdot\cdot 0\cdot 1) \times (\cdot\cdot 00\cdot) \times (\cdot 10\cdot\cdot) \times (0\cdot 0\cdot\cdot) = (01001)$ | 10 |
| $(\cdot\cdot 0\cdot 1) \times (\cdot\cdot 00\cdot) \times (\cdot 10\cdot\cdot) \times (1\cdot 0\cdot\cdot) = (11001)$ | 26 |
| $(\cdot\cdot 0\cdot 1) \times (\cdot\cdot 01\cdot) \times (\cdot 00\cdot\cdot) \times (0\cdot 0\cdot\cdot) = (00011)$ | 4 |
| $(\cdot\cdot 0\cdot 1) \times (\cdot\cdot 01\cdot) \times (\cdot 00\cdot\cdot) \times (1\cdot 0\cdot\cdot) = (10011)$ | 20 |
| $(\cdot\cdot 0\cdot 1) \times (\cdot\cdot 01\cdot) \times (\cdot 10\cdot\cdot) \times (0\cdot 0\cdot\cdot) = (01011)$ | 12 |
| $(\cdot\cdot 0\cdot 1) \times (\cdot\cdot 01\cdot) \times (\cdot 10\cdot\cdot) \times (1\cdot 0\cdot\cdot) = (11011)$ | 28 |
| $(\cdot\cdot 1\cdot 0) \times (\cdot\cdot 10\cdot) \times (\cdot 01\cdot\cdot) \times (0\cdot 1\cdot\cdot) = (00100)$ | 5 |
| $(\cdot\cdot 1\cdot 0) \times (\cdot\cdot 10\cdot) \times (\cdot 01\cdot\cdot) \times (1\cdot 1\cdot\cdot) = (10100)$ | 21 |
| $(\cdot\cdot 1\cdot 0) \times (\cdot\cdot 10\cdot) \times (\cdot 11\cdot\cdot) \times (0\cdot 1\cdot\cdot) = (01100)$ | 13 |
| $(\cdot\cdot 1\cdot 0) \times (\cdot\cdot 10\cdot) \times (\cdot 11\cdot\cdot) \times (1\cdot 1\cdot\cdot) = (11100)$ | 29 |
| $(\cdot\cdot 1\cdot 0) \times (\cdot\cdot 11\cdot) \times (\cdot 01\cdot\cdot) \times (0\cdot 1\cdot\cdot) = (00110)$ | 7 |
| $(\cdot\cdot 1\cdot 0) \times (\cdot\cdot 11\cdot) \times (\cdot 01\cdot\cdot) \times (1\cdot 1\cdot\cdot) = (10110)$ | 23 |
| $(\cdot\cdot 1\cdot 0) \times (\cdot\cdot 11\cdot) \times (\cdot 11\cdot\cdot) \times (0\cdot 1\cdot\cdot) = (01110)$ | 15 |
| $(\cdot\cdot 1\cdot 0) \times (\cdot\cdot 11\cdot) \times (\cdot 11\cdot\cdot) \times (1\cdot 1\cdot\cdot) = (11110)$ | 31 |
| $(\cdot\cdot 1\cdot 1) \times (\cdot\cdot 10\cdot) \times (\cdot 01\cdot\cdot) \times (0\cdot 1\cdot\cdot) = (00101)$ | 6 |
| $(\cdot\cdot 1\cdot 1) \times (\cdot\cdot 10\cdot) \times (\cdot 01\cdot\cdot) \times (1\cdot 1\cdot\cdot) = (10101)$ | 22 |
| $(\cdot\cdot 1\cdot 1) \times (\cdot\cdot 10\cdot) \times (\cdot 11\cdot\cdot) \times (0\cdot 1\cdot\cdot) = (01101)$ | 14 |
| $(\cdot\cdot 1\cdot 1) \times (\cdot\cdot 10\cdot) \times (\cdot 11\cdot\cdot) \times (1\cdot 1\cdot\cdot) = (11101)$ | 30 |
| $(\cdot\cdot 1\cdot 1) \times (\cdot\cdot 11\cdot) \times (\cdot 01\cdot\cdot) \times (0\cdot 1\cdot\cdot) = (00111)$ | 8 |
| $(\cdot\cdot 1\cdot 1) \times (\cdot\cdot 11\cdot) \times (\cdot 01\cdot\cdot) \times (1\cdot 1\cdot\cdot) = (10111)$ | 24 |
| $(\cdot\cdot 1\cdot 1) \times (\cdot\cdot 11\cdot) \times (\cdot 11\cdot\cdot) \times (0\cdot 1\cdot\cdot) = (01111)$ | 16 |
| $(\cdot\cdot 1\cdot 1) \times (\cdot\cdot 11\cdot) \times (\cdot 11\cdot\cdot) \times (1\cdot 1\cdot\cdot) = (11111)$ | 32 |

FIG. 26

$H_4 = G_3 \times G_6 \times G_8 \times G_{10}, \ (f_5 f_4 f_3 f_2 f_1) \quad |G_i|=4$

| | |
|---|---|
| $(\cdot 0 \cdot \cdot 0) \times (\cdot 0 \cdot 0 \cdot) \times (\cdot 00 \cdot \cdot) \times (00 \cdot \cdot \cdot) = (00000)$ | 1 |
| $(\cdot 0 \cdot \cdot 0) \times (\cdot 0 \cdot 0 \cdot) \times (\cdot 00 \cdot \cdot) \times (10 \cdot \cdot \cdot) = (10000)$ | 17 |
| $(\cdot 0 \cdot \cdot 0) \times (\cdot 0 \cdot 0 \cdot) \times (\cdot 10 \cdot \cdot) \times (00 \cdot \cdot \cdot) = (00100)$ | 5 |
| $(\cdot 0 \cdot \cdot 0) \times (\cdot 0 \cdot 0 \cdot) \times (\cdot 10 \cdot \cdot) \times (10 \cdot \cdot \cdot) = (10100)$ | 21 |
| $(\cdot 0 \cdot \cdot 0) \times (\cdot 0 \cdot 1 \cdot) \times (\cdot 00 \cdot \cdot) \times (00 \cdot \cdot \cdot) = (00010)$ | 3 |
| $(\cdot 0 \cdot \cdot 0) \times (\cdot 0 \cdot 1 \cdot) \times (\cdot 00 \cdot \cdot) \times (10 \cdot \cdot \cdot) = (10010)$ | 19 |
| $(\cdot 0 \cdot \cdot 0) \times (\cdot 0 \cdot 1 \cdot) \times (\cdot 10 \cdot \cdot) \times (00 \cdot \cdot \cdot) = (00110)$ | 7 |
| $(\cdot 0 \cdot \cdot 0) \times (\cdot 0 \cdot 1 \cdot) \times (\cdot 10 \cdot \cdot) \times (10 \cdot \cdot \cdot) = (10110)$ | 23 |
| $(\cdot 0 \cdot \cdot 1) \times (\cdot 0 \cdot 0 \cdot) \times (\cdot 00 \cdot \cdot) \times (00 \cdot \cdot \cdot) = (00001)$ | 2 |
| $(\cdot 0 \cdot \cdot 1) \times (\cdot 0 \cdot 0 \cdot) \times (\cdot 00 \cdot \cdot) \times (10 \cdot \cdot \cdot) = (10001)$ | 18 |
| $(\cdot 0 \cdot \cdot 1) \times (\cdot 0 \cdot 0 \cdot) \times (\cdot 01 \cdot \cdot) \times (00 \cdot \cdot \cdot) = (00101)$ | 6 |
| $(\cdot 0 \cdot \cdot 1) \times (\cdot 0 \cdot 0 \cdot) \times (\cdot 01 \cdot \cdot) \times (10 \cdot \cdot \cdot) = (10101)$ | 22 |
| $(\cdot 0 \cdot \cdot 1) \times (\cdot 0 \cdot 1 \cdot) \times (\cdot 00 \cdot \cdot) \times (00 \cdot \cdot \cdot) = (00011)$ | 4 |
| $(\cdot 0 \cdot \cdot 1) \times (\cdot 0 \cdot 1 \cdot) \times (\cdot 00 \cdot \cdot) \times (10 \cdot \cdot \cdot) = (10011)$ | 20 |
| $(\cdot 0 \cdot \cdot 1) \times (\cdot 0 \cdot 1 \cdot) \times (\cdot 01 \cdot \cdot) \times (00 \cdot \cdot \cdot) = (00111)$ | 8 |
| $(\cdot 0 \cdot \cdot 1) \times (\cdot 0 \cdot 1 \cdot) \times (\cdot 01 \cdot \cdot) \times (10 \cdot \cdot \cdot) = (10111)$ | 24 |
| $(\cdot 1 \cdot \cdot 0) \times (\cdot 1 \cdot 0 \cdot) \times (\cdot 10 \cdot \cdot) \times (01 \cdot \cdot \cdot) = (01000)$ | 9 |
| $(\cdot 1 \cdot \cdot 0) \times (\cdot 1 \cdot 0 \cdot) \times (\cdot 10 \cdot \cdot) \times (11 \cdot \cdot \cdot) = (11000)$ | 25 |
| $(\cdot 1 \cdot \cdot 0) \times (\cdot 1 \cdot 0 \cdot) \times (\cdot 11 \cdot \cdot) \times (01 \cdot \cdot \cdot) = (01100)$ | 13 |
| $(\cdot 1 \cdot \cdot 0) \times (\cdot 1 \cdot 0 \cdot) \times (\cdot 11 \cdot \cdot) \times (11 \cdot \cdot \cdot) = (11100)$ | 29 |
| $(\cdot 1 \cdot \cdot 0) \times (\cdot 1 \cdot 1 \cdot) \times (\cdot 10 \cdot \cdot) \times (01 \cdot \cdot \cdot) = (01010)$ | 11 |
| $(\cdot 1 \cdot \cdot 0) \times (\cdot 1 \cdot 1 \cdot) \times (\cdot 10 \cdot \cdot) \times (11 \cdot \cdot \cdot) = (11010)$ | 27 |
| $(\cdot 1 \cdot \cdot 0) \times (\cdot 1 \cdot 1 \cdot) \times (\cdot 11 \cdot \cdot) \times (01 \cdot \cdot \cdot) = (01110)$ | 15 |
| $(\cdot 1 \cdot \cdot 0) \times (\cdot 1 \cdot 1 \cdot) \times (\cdot 11 \cdot \cdot) \times (11 \cdot \cdot \cdot) = (11110)$ | 31 |
| $(\cdot 1 \cdot \cdot 1) \times (\cdot 1 \cdot 0 \cdot) \times (\cdot 10 \cdot \cdot) \times (01 \cdot \cdot \cdot) = (01001)$ | 10 |
| $(\cdot 1 \cdot \cdot 1) \times (\cdot 1 \cdot 0 \cdot) \times (\cdot 10 \cdot \cdot) \times (11 \cdot \cdot \cdot) = (11001)$ | 26 |
| $(\cdot 1 \cdot \cdot 1) \times (\cdot 1 \cdot 0 \cdot) \times (\cdot 11 \cdot \cdot) \times (01 \cdot \cdot \cdot) = (01101)$ | 14 |
| $(\cdot 1 \cdot \cdot 1) \times (\cdot 1 \cdot 0 \cdot) \times (\cdot 11 \cdot \cdot) \times (11 \cdot \cdot \cdot) = (11101)$ | 30 |
| $(\cdot 1 \cdot \cdot 1) \times (\cdot 1 \cdot 1 \cdot) \times (\cdot 10 \cdot \cdot) \times (01 \cdot \cdot \cdot) = (01011)$ | 12 |
| $(\cdot 1 \cdot \cdot 1) \times (\cdot 1 \cdot 1 \cdot) \times (\cdot 10 \cdot \cdot) \times (11 \cdot \cdot \cdot) = (11011)$ | 28 |
| $(\cdot 1 \cdot \cdot 1) \times (\cdot 1 \cdot 1 \cdot) \times (\cdot 11 \cdot \cdot) \times (01 \cdot \cdot \cdot) = (01111)$ | 16 |
| $(\cdot 1 \cdot \cdot 1) \times (\cdot 1 \cdot 1 \cdot) \times (\cdot 11 \cdot \cdot) \times (11 \cdot \cdot \cdot) = (11111)$ | 32 |

FIG. 27

$H_5 = G_4 \times G_7 \times G_9 \times G_{10}, (f_5 f_4 f_3 f_2 f_1) \cdot |G_i| = 4$

| | |
|---|---|
| $(0\cdots0) \times (0\cdot\cdot 0\cdot) \times (0\cdot 0\cdot\cdot) \times (00\cdot\cdot\cdot) = (00000)$ | 1 |
| $(0\cdots0) \times (0\cdot\cdot 0\cdot) \times (0\cdot 0\cdot\cdot) \times (01\cdot\cdot\cdot) = (01000)$ | 9 |
| $(0\cdots0) \times (0\cdot\cdot 0\cdot) \times (0\cdot 1\cdot\cdot) \times (00\cdot\cdot\cdot) = (00100)$ | 5 |
| $(0\cdots0) \times (0\cdot\cdot 0\cdot) \times (0\cdot 1\cdot\cdot) \times (01\cdot\cdot\cdot) = (01100)$ | 13 |
| $(0\cdots0) \times (0\cdot\cdot 1\cdot) \times (0\cdot 0\cdot\cdot) \times (00\cdot\cdot\cdot) = (00010)$ | 3 |
| $(0\cdots0) \times (0\cdot\cdot 1\cdot) \times (0\cdot 0\cdot\cdot) \times (01\cdot\cdot\cdot) = (01010)$ | 11 |
| $(0\cdots0) \times (0\cdot\cdot 1\cdot) \times (0\cdot 1\cdot\cdot) \times (00\cdot\cdot\cdot) = (00110)$ | 7 |
| $(0\cdots0) \times (0\cdot\cdot 1\cdot) \times (0\cdot 1\cdot\cdot) \times (01\cdot\cdot\cdot) = (01110)$ | 15 |
| $(0\cdots1) \times (0\cdot\cdot 0\cdot) \times (0\cdot 0\cdot\cdot) \times (00\cdot\cdot\cdot) = (00001)$ | 2 |
| $(0\cdots1) \times (0\cdot\cdot 0\cdot) \times (0\cdot 0\cdot\cdot) \times (01\cdot\cdot\cdot) = (01001)$ | 10 |
| $(0\cdots1) \times (0\cdot\cdot 0\cdot) \times (0\cdot 1\cdot\cdot) \times (00\cdot\cdot\cdot) = (00101)$ | 6 |
| $(0\cdots1) \times (0\cdot\cdot 0\cdot) \times (0\cdot 1\cdot\cdot) \times (01\cdot\cdot\cdot) = (01101)$ | 14 |
| $(0\cdots1) \times (0\cdot\cdot 1\cdot) \times (0\cdot 0\cdot\cdot) \times (00\cdot\cdot\cdot) = (00011)$ | 4 |
| $(0\cdots1) \times (0\cdot\cdot 1\cdot) \times (0\cdot 0\cdot\cdot) \times (01\cdot\cdot\cdot) = (01011)$ | 12 |
| $(0\cdots1) \times (0\cdot\cdot 1\cdot) \times (0\cdot 1\cdot\cdot) \times (00\cdot\cdot\cdot) = (00111)$ | 8 |
| $(0\cdots1) \times (0\cdot\cdot 1\cdot) \times (0\cdot 1\cdot\cdot) \times (01\cdot\cdot\cdot) = (01111)$ | 16 |
| $(1\cdots0) \times (1\cdot\cdot 0\cdot) \times (1\cdot 0\cdot\cdot) \times (10\cdot\cdot\cdot) = (10000)$ | 17 |
| $(1\cdots0) \times (1\cdot\cdot 0\cdot) \times (1\cdot 0\cdot\cdot) \times (11\cdot\cdot\cdot) = (11000)$ | 25 |
| $(1\cdots0) \times (1\cdot\cdot 0\cdot) \times (1\cdot 1\cdot\cdot) \times (10\cdot\cdot\cdot) = (10100)$ | 21 |
| $(1\cdots0) \times (1\cdot\cdot 0\cdot) \times (1\cdot 1\cdot\cdot) \times (11\cdot\cdot\cdot) = (11100)$ | 29 |
| $(1\cdots0) \times (1\cdot\cdot 1\cdot) \times (1\cdot 0\cdot\cdot) \times (10\cdot\cdot\cdot) = (10010)$ | 19 |
| $(1\cdots0) \times (1\cdot\cdot 1\cdot) \times (1\cdot 0\cdot\cdot) \times (11\cdot\cdot\cdot) = (11010)$ | 27 |
| $(1\cdots0) \times (1\cdot\cdot 1\cdot) \times (1\cdot 1\cdot\cdot) \times (10\cdot\cdot\cdot) = (10110)$ | 23 |
| $(1\cdots0) \times (1\cdot\cdot 1\cdot) \times (1\cdot 1\cdot\cdot) \times (11\cdot\cdot\cdot) = (11110)$ | 31 |
| $(1\cdots1) \times (1\cdot\cdot 0\cdot) \times (1\cdot 0\cdot\cdot) \times (10\cdot\cdot\cdot) = (10001)$ | 18 |
| $(1\cdots1) \times (1\cdot\cdot 0\cdot) \times (1\cdot 0\cdot\cdot) \times (11\cdot\cdot\cdot) = (11001)$ | 26 |
| $(1\cdots1) \times (1\cdot\cdot 0\cdot) \times (1\cdot 1\cdot\cdot) \times (10\cdot\cdot\cdot) = (10101)$ | 22 |
| $(1\cdots1) \times (1\cdot\cdot 0\cdot) \times (1\cdot 1\cdot\cdot) \times (11\cdot\cdot\cdot) = (11101)$ | 30 |
| $(1\cdots1) \times (1\cdot\cdot 1\cdot) \times (1\cdot 0\cdot\cdot) \times (10\cdot\cdot\cdot) = (10011)$ | 20 |
| $(1\cdots1) \times (1\cdot\cdot 1\cdot) \times (1\cdot 0\cdot\cdot) \times (11\cdot\cdot\cdot) = (11011)$ | 28 |
| $(1\cdots1) \times (1\cdot\cdot 1\cdot) \times (1\cdot 1\cdot\cdot) \times (10\cdot\cdot\cdot) = (10111)$ | 24 |
| $(1\cdots1) \times (1\cdot\cdot 1\cdot) \times (1\cdot 1\cdot\cdot) \times (11\cdot\cdot\cdot) = (11111)$ | 32 |

FIG. 30

$H_1 = G_1 \times G_2 \times G_3 \times G_4$ , $(f_5 f_4 f_3 f_2 f_1)$ $|G_i|=4$

| | |
|---|---|
| $(\cdots 00) \times (\cdot\cdot 0 \cdot 0) \times (\cdot 0 \cdot\cdot 0) \times (0 \cdots 0) = (00000)$ | 1 |
| $\times (0 \cdots 1) =$ | |
| $\times (1 \cdots 0) = (10000)$ | 17 |
| $\times (1 \cdots 1) =$ | |
| $(\cdots 00) \times (\cdot\cdot 0 \cdot 0) \times (\cdot 0 \cdot\cdot 1) \times (0 \cdots 0) =$ | |
| $\times (0 \cdots 1) =$ | |
| $\times (1 \cdots 0) =$ | |
| $\times (1 \cdots 1) =$ | |
| $(\cdots 00) \times (\cdot\cdot 0 \cdot 0) \times (\cdot 1 \cdot\cdot 0) \times (0 \cdots 0) = (01000)$ | 9 |
| $\times (0 \cdots 1) =$ | |
| $\times (1 \cdots 0) = (11000)$ | 25 |
| $\times (1 \cdots 1) =$ | |
| $(\cdots 00) \times (\cdot\cdot 0 \cdot 0) \times (\cdot 1 \cdot\cdot 1) \times (0 \cdots 0) =$ | |
| $\times (0 \cdots 1) =$ | |
| $\times (1 \cdots 0) =$ | |
| $\times (1 \cdots 1) =$ | |
| $(\cdots 00) \times (\cdot\cdot 0 \cdot 1) \times (\cdot 0 \cdot\cdot 0) \times (0 \cdots 0) =$ | |
| $\times (0 \cdots 1) =$ | |
| $\times (1 \cdot\cdot 0) =$ | |
| $\times (1 \cdots 1) =$ | |
| $(\cdots 00) \times (\cdot\cdot 0 \cdot 1) \times (\cdot 0 \cdot\cdot 1) \times (0 \cdots 0) =$ | |
| $\times (0 \cdots 1) =$ | |
| $\times (1 \cdots 0) =$ | |
| $\times (1 \cdots 1) =$ | |
| $(\cdots 00) \times (\cdot\cdot 0 \cdot 1) \times (\cdot 1 \cdot\cdot 0) \times (0 \cdots 0) =$ | |
| $\times (0 \cdots 1) =$ | |
| $\times (1 \cdots 0) =$ | |
| $\times (1 \cdots 1) =$ | |
| $(\cdots 00) \times (\cdot\cdot 0 \cdot 1) \times (\cdot 1 \cdot\cdot 1) \times (0 \cdots 0) =$ | |
| $\times (0 \cdots 1) =$ | |
| $\times (1 \cdots 0) =$ | |
| $\times (1 \cdots 1) =$ | |

FIG. 31

$H_1 = G_1 \times G_2 \times G_3 \times G_4$ , $(f_5 f_4 f_3 f_2 f_1)$   $|G_i| = 4$ $(\cdots 00) \times (\cdot\cdot 1 \cdot 0) \times (\cdot 0 \cdot\cdot 0) \times (0 \cdots 0) = (00100)$     5
$\phantom{(\cdots 00) \times (\cdot\cdot 1 \cdot 0) \times (\cdot 0 \cdot\cdot 0)} \times (0 \cdots 1) =$
$\phantom{(\cdots 00) \times (\cdot\cdot 1 \cdot 0) \times (\cdot 0 \cdot\cdot 0)} \times (1 \cdots 0) = (10100)$     21
$\phantom{(\cdots 00) \times (\cdot\cdot 1 \cdot 0) \times (\cdot 0 \cdot\cdot 0)} \times (1 \cdots 1) =$
$(\cdots 00) \times (\cdot\cdot 1 \cdot 0) \times (\cdot 0 \cdot\cdot 1) \times (0 \cdots 0) =$
$\phantom{(\cdots 00) \times (\cdot\cdot 1 \cdot 0) \times (\cdot 0 \cdot\cdot 1)} \times (0 \cdots 1) =$
$\phantom{(\cdots 00) \times (\cdot\cdot 1 \cdot 0) \times (\cdot 0 \cdot\cdot 1)} \times (1 \cdots 0) =$
$\phantom{(\cdots 00) \times (\cdot\cdot 1 \cdot 0) \times (\cdot 0 \cdot\cdot 1)} \times (1 \cdots 1) =$
$(\cdots 00) \times (\cdot\cdot 1 \cdot 0) \times (\cdot 1 \cdot\cdot 0) \times (0 \cdots 0) = (01100)$     13
$\phantom{(\cdots 00) \times (\cdot\cdot 1 \cdot 0) \times (\cdot 1 \cdot\cdot 0)} \times (0 \cdots 1) =$
$\phantom{(\cdots 00) \times (\cdot\cdot 1 \cdot 0) \times (\cdot 1 \cdot\cdot 0)} \times (1 \cdots 0) = (11100)$     29
$\phantom{(\cdots 00) \times (\cdot\cdot 1 \cdot 0) \times (\cdot 1 \cdot\cdot 0)} \times (1 \cdots 1) =$
$(\cdots 00) \times (\cdot\cdot 1 \cdot 0) \times (\cdot 1 \cdot\cdot 1) \times (0 \cdots 0) =$
$\phantom{(\cdots 00) \times (\cdot\cdot 1 \cdot 0) \times (\cdot 1 \cdot\cdot 1)} \times (0 \cdots 1) =$
$\phantom{(\cdots 00) \times (\cdot\cdot 1 \cdot 0) \times (\cdot 1 \cdot\cdot 1)} \times (1 \cdots 0) =$
$\phantom{(\cdots 00) \times (\cdot\cdot 1 \cdot 0) \times (\cdot 1 \cdot\cdot 1)} \times (1 \cdots 1) =$
$(\cdots 00) \times (\cdot\cdot 1 \cdot 1) \times (\cdot 0 \cdot\cdot 0) \times (0 \cdots 0) =$
$\phantom{(\cdots 00) \times (\cdot\cdot 1 \cdot 1) \times (\cdot 0 \cdot\cdot 0)} \times (0 \cdots 1) =$
$\phantom{(\cdots 00) \times (\cdot\cdot 1 \cdot 1) \times (\cdot 0 \cdot\cdot 0)} \times (1 \cdots 0) =$
$\phantom{(\cdots 00) \times (\cdot\cdot 1 \cdot 1) \times (\cdot 0 \cdot\cdot 0)} \times (1 \cdots 1) =$
$(\cdots 00) \times (\cdot\cdot 1 \cdot 1) \times (\cdot 0 \cdot\cdot 1) \times (0 \cdots 0) =$
$\phantom{(\cdots 00) \times (\cdot\cdot 1 \cdot 1) \times (\cdot 0 \cdot\cdot 1)} \times (0 \cdots 1) =$
$\phantom{(\cdots 00) \times (\cdot\cdot 1 \cdot 1) \times (\cdot 0 \cdot\cdot 1)} \times (1 \cdots 0) =$
$\phantom{(\cdots 00) \times (\cdot\cdot 1 \cdot 1) \times (\cdot 0 \cdot\cdot 1)} \times (1 \cdots 1) =$
$(\cdots 00) \times (\cdot\cdot 1 \cdot 1) \times (\cdot 1 \cdot\cdot 0) \times (0 \cdots 0) =$
$\phantom{(\cdots 00) \times (\cdot\cdot 1 \cdot 1) \times (\cdot 1 \cdot\cdot 0)} \times (0 \cdots 1) =$
$\phantom{(\cdots 00) \times (\cdot\cdot 1 \cdot 1) \times (\cdot 1 \cdot\cdot 0)} \times (1 \cdots 0) =$
$\phantom{(\cdots 00) \times (\cdot\cdot 1 \cdot 1) \times (\cdot 1 \cdot\cdot 0)} \times (1 \cdots 1) =$
$(\cdots 00) \times (\cdot\cdot 1 \cdot 1) \times (\cdot 1 \cdot\cdot 1) \times (0 \cdots 0) =$
$\phantom{(\cdots 00) \times (\cdot\cdot 1 \cdot 1) \times (\cdot 1 \cdot\cdot 1)} \times (0 \cdots 1) =$
$\phantom{(\cdots 00) \times (\cdot\cdot 1 \cdot 1) \times (\cdot 1 \cdot\cdot 1)} \times (1 \cdots 0) =$
$\phantom{(\cdots 00) \times (\cdot\cdot 1 \cdot 1) \times (\cdot 1 \cdot\cdot 1)} \times (1 \cdots 1) =$

FIG. 32

$H_1 = G_1 \times G_2 \times G_3 \times G_4$ , $(f_5 f_4 f_3 f_2 f_1)$   $|G_i| = 4$ $(\cdots 01) \times (\cdot \cdot 0 \cdot 0) \times (\cdot 0 \cdot \cdot 0) \times (0 \cdot \cdot \cdot 0) =$
$\phantom{(\cdots 01) \times (\cdot \cdot 0 \cdot 0) \times (\cdot 0 \cdot \cdot 0)} \times (0 \cdots 1) =$
$\phantom{(\cdots 01) \times (\cdot \cdot 0 \cdot 0) \times (\cdot 0 \cdot \cdot 0)} \times (1 \cdots 0) =$
$\phantom{(\cdots 01) \times (\cdot \cdot 0 \cdot 0) \times (\cdot 0 \cdot \cdot 0)} \times (1 \cdots 1) =$
$(\cdots 01) \times (\cdot \cdot 0 \cdot 0) \times (\cdot 0 \cdot \cdot 1) \times (0 \cdots 0) =$
$\phantom{(\cdots 01) \times (\cdot \cdot 0 \cdot 0) \times (\cdot 0 \cdot \cdot 1)} \times (0 \cdots 1) =$
$\phantom{(\cdots 01) \times (\cdot \cdot 0 \cdot 0) \times (\cdot 0 \cdot \cdot 1)} \times (1 \cdots 0) =$
$\phantom{(\cdots 01) \times (\cdot \cdot 0 \cdot 0) \times (\cdot 0 \cdot \cdot 1)} \times (1 \cdots 1) =$
$(\cdots 01) \times (\cdot \cdot 0 \cdot 0) \times (\cdot 1 \cdot \cdot 0) \times (0 \cdots 0) =$
$\phantom{(\cdots 01) \times (\cdot \cdot 0 \cdot 0) \times (\cdot 1 \cdot \cdot 0)} \times (0 \cdots 1) =$
$\phantom{(\cdots 01) \times (\cdot \cdot 0 \cdot 0) \times (\cdot 1 \cdot \cdot 0)} \times (1 \cdots 0) =$
$\phantom{(\cdots 01) \times (\cdot \cdot 0 \cdot 0) \times (\cdot 1 \cdot \cdot 0)} \times (1 \cdots 1) =$
$(\cdots 01) \times (\cdot \cdot 0 \cdot 0) \times (\cdot 1 \cdot \cdot 1) \times (0 \cdots 0) =$
$\phantom{(\cdots 01) \times (\cdot \cdot 0 \cdot 0) \times (\cdot 1 \cdot \cdot 1)} \times (0 \cdots 1) =$
$\phantom{(\cdots 01) \times (\cdot \cdot 0 \cdot 0) \times (\cdot 1 \cdot \cdot 1)} \times (1 \cdots 0) =$
$\phantom{(\cdots 01) \times (\cdot \cdot 0 \cdot 0) \times (\cdot 1 \cdot \cdot 1)} \times (1 \cdots 1) =$
$(\cdots 01) \times (\cdot \cdot 0 \cdot 1) \times (\cdot 0 \cdot \cdot 0) \times (0 \cdots 0) =$
$\phantom{(\cdots 01) \times (\cdot \cdot 0 \cdot 1) \times (\cdot 0 \cdot \cdot 0)} \times (0 \cdots 1) =$
$\phantom{(\cdots 01) \times (\cdot \cdot 0 \cdot 1) \times (\cdot 0 \cdot \cdot 0)} \times (1 \cdots 0) =$
$\phantom{(\cdots 01) \times (\cdot \cdot 0 \cdot 1) \times (\cdot 0 \cdot \cdot 0)} \times (1 \cdots 1) =$
$(\cdots 01) \times (\cdot \cdot 0 \cdot 1) \times (\cdot 0 \cdot \cdot 1) \times (0 \cdots 0) =$
$\phantom{(\cdots 01) \times (\cdot \cdot 0 \cdot 1) \times (\cdot 0 \cdot \cdot 1)} \times (0 \cdots 1) = (00001) \quad 2$
$\phantom{(\cdots 01) \times (\cdot \cdot 0 \cdot 1) \times (\cdot 0 \cdot \cdot 1)} \times (1 \cdots 0) =$
$\phantom{(\cdots 01) \times (\cdot \cdot 0 \cdot 1) \times (\cdot 0 \cdot \cdot 1)} \times (1 \cdots 1) = (10001) \quad 18$
$(\cdots 01) \times (\cdot \cdot 0 \cdot 1) \times (\cdot 1 \cdot \cdot 0) \times (0 \cdots 0) =$
$\phantom{(\cdots 01) \times (\cdot \cdot 0 \cdot 1) \times (\cdot 1 \cdot \cdot 0)} \times (0 \cdots 1) =$
$\phantom{(\cdots 01) \times (\cdot \cdot 0 \cdot 1) \times (\cdot 1 \cdot \cdot 0)} \times (1 \cdots 0) =$
$\phantom{(\cdots 01) \times (\cdot \cdot 0 \cdot 1) \times (\cdot 1 \cdot \cdot 0)} \times (1 \cdots 1) =$
$(\cdots 01) \times (\cdot \cdot 0 \cdot 1) \times (\cdot 1 \cdot \cdot 1) \times (0 \cdots 0) =$
$\phantom{(\cdots 01) \times (\cdot \cdot 0 \cdot 1) \times (\cdot 1 \cdot \cdot 1)} \times (0 \cdots 1) = (01001) \quad 10$
$\phantom{(\cdots 01) \times (\cdot \cdot 0 \cdot 1) \times (\cdot 1 \cdot \cdot 1)} \times (1 \cdots 0) =$
$\phantom{(\cdots 01) \times (\cdot \cdot 0 \cdot 1) \times (\cdot 1 \cdot \cdot 1)} \times (1 \cdots 1) = (11001) \quad 26$

FIG. 33

$H_1 = G_1 \times G_2 \times G_3 \times G_4$ , $(f_5 f_4 f_3 f_2 f_1)$  $|G_i| = 4$ $(\cdots 01) \times (\cdot\cdot 1 \cdot 0) \times (\cdot 0 \cdot\cdot 0) \times (0 \cdots 0) =$
$\phantom{(\cdots 01) \times (\cdot\cdot 1 \cdot 0) \times (\cdot 0 \cdot\cdot 0)} \times (0 \cdots 1) =$
$\phantom{(\cdots 01) \times (\cdot\cdot 1 \cdot 0) \times (\cdot 0 \cdot\cdot 0)} \times (1 \cdots 0) =$
$\phantom{(\cdots 01) \times (\cdot\cdot 1 \cdot 0) \times (\cdot 0 \cdot\cdot 0)} \times (1 \cdots 1) =$
$(\cdots 01) \times (\cdot\cdot 1 \cdot 0) \times (\cdot 0 \cdot\cdot 1) \times (0 \cdots 0) =$
$\phantom{(\cdots 01) \times (\cdot\cdot 1 \cdot 0) \times (\cdot 0 \cdot\cdot 1)} \times (0 \cdots 1) =$
$\phantom{(\cdots 01) \times (\cdot\cdot 1 \cdot 0) \times (\cdot 0 \cdot\cdot 1)} \times (1 \cdots 0) =$
$\phantom{(\cdots 01) \times (\cdot\cdot 1 \cdot 0) \times (\cdot 0 \cdot\cdot 1)} \times (1 \cdots 1) =$
$(\cdots 01) \times (\cdot\cdot 1 \cdot 0) \times (\cdot 1 \cdot\cdot 0) \times (0 \cdots 0) =$
$\phantom{(\cdots 01) \times (\cdot\cdot 1 \cdot 0) \times (\cdot 1 \cdot\cdot 0)} \times (0 \cdots 1) =$
$\phantom{(\cdots 01) \times (\cdot\cdot 1 \cdot 0) \times (\cdot 1 \cdot\cdot 0)} \times (1 \cdots 0) =$
$\phantom{(\cdots 01) \times (\cdot\cdot 1 \cdot 0) \times (\cdot 1 \cdot\cdot 0)} \times (1 \cdots 1) =$
$(\cdots 01) \times (\cdot\cdot 1 \cdot 0) \times (\cdot 1 \cdot\cdot 1) \times (0 \cdots 0) =$
$\phantom{(\cdots 01) \times (\cdot\cdot 1 \cdot 0) \times (\cdot 1 \cdot\cdot 1)} \times (0 \cdots 1) =$
$\phantom{(\cdots 01) \times (\cdot\cdot 1 \cdot 0) \times (\cdot 1 \cdot\cdot 1)} \times (1 \cdots 0) =$
$\phantom{(\cdots 01) \times (\cdot\cdot 1 \cdot 0) \times (\cdot 1 \cdot\cdot 1)} \times (1 \cdots 1) =$
$(\cdots 01) \times (\cdot\cdot 1 \cdot 1) \times (\cdot 0 \cdot\cdot 0) \times (0 \cdots 0) =$
$\phantom{(\cdots 01) \times (\cdot\cdot 1 \cdot 1) \times (\cdot 0 \cdot\cdot 0)} \times (0 \cdots 1) =$
$\phantom{(\cdots 01) \times (\cdot\cdot 1 \cdot 1) \times (\cdot 0 \cdot\cdot 0)} \times (1 \cdots 0) =$
$\phantom{(\cdots 01) \times (\cdot\cdot 1 \cdot 1) \times (\cdot 0 \cdot\cdot 0)} \times (1 \cdots 1) =$
$(\cdots 01) \times (\cdot\cdot 1 \cdot 1) \times (\cdot 0 \cdot\cdot 1) \times (0 \cdots 0) =$
$\phantom{(\cdots 01) \times (\cdot\cdot 1 \cdot 1) \times (\cdot 0 \cdot\cdot 1)} \times (0 \cdots 1) =$
$\phantom{(\cdots 01) \times (\cdot\cdot 1 \cdot 1) \times (\cdot 0 \cdot\cdot 1)} \times (1 \cdots 0) =$
$\phantom{(\cdots 01) \times (\cdot\cdot 1 \cdot 1) \times (\cdot 0 \cdot\cdot 1)} \times (1 \cdots 1) =$
$(\cdots 01) \times (\cdot\cdot 1 \cdot 1) \times (\cdot 1 \cdot\cdot 0) \times (0 \cdots 0) =$
$\phantom{(\cdots 01) \times (\cdot\cdot 1 \cdot 1) \times (\cdot 1 \cdot\cdot 0)} \times (0 \cdots 1) = (00101) \qquad 6$
$\phantom{(\cdots 01) \times (\cdot\cdot 1 \cdot 1) \times (\cdot 1 \cdot\cdot 0)} \times (1 \cdots 0) =$
$\phantom{(\cdots 01) \times (\cdot\cdot 1 \cdot 1) \times (\cdot 1 \cdot\cdot 0)} \times (1 \cdots 1) = (10101) \qquad 22$
$(\cdots 01) \times (\cdot\cdot 1 \cdot 1) \times (\cdot 1 \cdot\cdot 1) \times (0 \cdots 0) =$
$\phantom{(\cdots 01) \times (\cdot\cdot 1 \cdot 1) \times (\cdot 1 \cdot\cdot 1)} \times (0 \cdots 1) = (01101) \qquad 14$
$\phantom{(\cdots 01) \times (\cdot\cdot 1 \cdot 1) \times (\cdot 1 \cdot\cdot 1)} \times (1 \cdots 0) =$
$\phantom{(\cdots 01) \times (\cdot\cdot 1 \cdot 1) \times (\cdot 1 \cdot\cdot 1)} \times (1 \cdots 1) = (11101) \qquad 30$

FIG. 34

$H_1 = G_1 \times G_2 \times G_3 \times G_4$ , $(f_5 f_4 f_3 f_2 f_1)$   $|G_i|=4$ $(\cdots 10) \times (\cdot\cdot 0 \cdot 0) \times (\cdot 0 \cdot\cdot 0) \times (0 \cdot\cdot\cdot 0) = (00010)$   3
$\phantom{(\cdots 10) \times (\cdot\cdot 0 \cdot 0) \times (\cdot 0 \cdot\cdot 0) \times} \times (0 \cdot\cdot\cdot 1) =$
$\phantom{(\cdots 10) \times (\cdot\cdot 0 \cdot 0) \times (\cdot 0 \cdot\cdot 0) \times} \times (1 \cdot\cdot\cdot 0) = (10010)$   19
$\phantom{(\cdots 10) \times (\cdot\cdot 0 \cdot 0) \times (\cdot 0 \cdot\cdot 0) \times} \times (1 \cdot\cdot\cdot 1) =$
$(\cdots 10) \times (\cdot\cdot 0 \cdot 0) \times (\cdot 0 \cdot\cdot 1) \times (0 \cdot\cdot\cdot 0) =$
$\phantom{(\cdots 10) \times (\cdot\cdot 0 \cdot 0) \times (\cdot 0 \cdot\cdot 1) \times} \times (0 \cdot\cdot\cdot 1) =$
$\phantom{(\cdots 10) \times (\cdot\cdot 0 \cdot 0) \times (\cdot 0 \cdot\cdot 1) \times} \times (1 \cdot\cdot\cdot 0) =$
$\phantom{(\cdots 10) \times (\cdot\cdot 0 \cdot 0) \times (\cdot 0 \cdot\cdot 1) \times} \times (1 \cdot\cdot\cdot 1) =$
$(\cdots 10) \times (\cdot\cdot 0 \cdot 0) \times (\cdot 1 \cdot\cdot 0) \times (0 \cdot\cdot\cdot 0) = (01010)$   11
$\phantom{(\cdots 10) \times (\cdot\cdot 0 \cdot 0) \times (\cdot 1 \cdot\cdot 0) \times} \times (0 \cdot\cdot\cdot 1) =$
$\phantom{(\cdots 10) \times (\cdot\cdot 0 \cdot 0) \times (\cdot 1 \cdot\cdot 0) \times} \times (1 \cdot\cdot\cdot 0) = (11010)$   27
$\phantom{(\cdots 10) \times (\cdot\cdot 0 \cdot 0) \times (\cdot 1 \cdot\cdot 0) \times} \times (1 \cdot\cdot\cdot 1) =$
$(\cdots 10) \times (\cdot\cdot 0 \cdot 0) \times (\cdot 1 \cdot\cdot 1) \times (0 \cdot\cdot\cdot 0) =$
$\phantom{(\cdots 10) \times (\cdot\cdot 0 \cdot 0) \times (\cdot 1 \cdot\cdot 1) \times} \times (0 \cdot\cdot\cdot 1) =$
$\phantom{(\cdots 10) \times (\cdot\cdot 0 \cdot 0) \times (\cdot 1 \cdot\cdot 1) \times} \times (1 \cdot\cdot\cdot 0) =$
$\phantom{(\cdots 10) \times (\cdot\cdot 0 \cdot 0) \times (\cdot 1 \cdot\cdot 1) \times} \times (1 \cdot\cdot\cdot 1) =$
$(\cdots 10) \times (\cdot\cdot 0 \cdot 1) \times (\cdot 0 \cdot\cdot 0) \times (0 \cdot\cdot\cdot 0) =$
$\phantom{(\cdots 10) \times (\cdot\cdot 0 \cdot 1) \times (\cdot 0 \cdot\cdot 0) \times} \times (0 \cdot\cdot\cdot 1) =$
$\phantom{(\cdots 10) \times (\cdot\cdot 0 \cdot 1) \times (\cdot 0 \cdot\cdot 0) \times} \times (1 \cdot\cdot\cdot 0) =$
$\phantom{(\cdots 10) \times (\cdot\cdot 0 \cdot 1) \times (\cdot 0 \cdot\cdot 0) \times} \times (1 \cdot\cdot\cdot 1) =$
$(\cdots 10) \times (\cdot\cdot 0 \cdot 1) \times (\cdot 0 \cdot\cdot 1) \times (0 \cdot\cdot\cdot 0) =$
$\phantom{(\cdots 10) \times (\cdot\cdot 0 \cdot 1) \times (\cdot 0 \cdot\cdot 1) \times} \times (0 \cdot\cdot\cdot 1) =$
$\phantom{(\cdots 10) \times (\cdot\cdot 0 \cdot 1) \times (\cdot 0 \cdot\cdot 1) \times} \times (1 \cdot\cdot\cdot 0) =$
$\phantom{(\cdots 10) \times (\cdot\cdot 0 \cdot 1) \times (\cdot 0 \cdot\cdot 1) \times} \times (1 \cdot\cdot\cdot 1) =$
$(\cdots 10) \times (\cdot\cdot 0 \cdot 1) \times (\cdot 1 \cdot\cdot 0) \times (0 \cdot\cdot\cdot 0) =$
$\phantom{(\cdots 10) \times (\cdot\cdot 0 \cdot 1) \times (\cdot 1 \cdot\cdot 0) \times} \times (0 \cdot\cdot\cdot 1) =$
$\phantom{(\cdots 10) \times (\cdot\cdot 0 \cdot 1) \times (\cdot 1 \cdot\cdot 0) \times} \times (1 \cdot\cdot\cdot 0) =$
$\phantom{(\cdots 10) \times (\cdot\cdot 0 \cdot 1) \times (\cdot 1 \cdot\cdot 0) \times} \times (1 \cdot\cdot\cdot 1) =$
$(\cdots 10) \times (\cdot\cdot 0 \cdot 1) \times (\cdot 1 \cdot\cdot 1) \times (0 \cdot\cdot\cdot 0) =$
$\phantom{(\cdots 10) \times (\cdot\cdot 0 \cdot 1) \times (\cdot 1 \cdot\cdot 1) \times} \times (0 \cdot\cdot\cdot 1) =$
$\phantom{(\cdots 10) \times (\cdot\cdot 0 \cdot 1) \times (\cdot 1 \cdot\cdot 1) \times} \times (1 \cdot\cdot\cdot 0) =$
$\phantom{(\cdots 10) \times (\cdot\cdot 0 \cdot 1) \times (\cdot 1 \cdot\cdot 1) \times} \times (1 \cdot\cdot\cdot 1) =$

FIG. 35

$H_1 = G_1 \times G_2 \times G_3 \times G_4$ , $(f_5 f_4 f_3 f_2 f_1)$   $|G_i|=4$ $(\cdots 10) \times (\cdot\cdot 1\cdot 0) \times (\cdot 0\cdot\cdot 0) \times (0\cdots 0) = (00110)$   7
$\phantom{(\cdots 10) \times (\cdot\cdot 1\cdot 0) \times (\cdot 0\cdot\cdot 0)} \times (0\cdots 1) =$
$\phantom{(\cdots 10) \times (\cdot\cdot 1\cdot 0) \times (\cdot 0\cdot\cdot 0)} \times (1\cdots 0) = (10110)$   23
$\phantom{(\cdots 10) \times (\cdot\cdot 1\cdot 0) \times (\cdot 0\cdot\cdot 0)} \times (1\cdots 1) =$
$(\cdots 10) \times (\cdot\cdot 1\cdot 0) \times (\cdot 0\cdot\cdot 1) \times (0\cdots 0) =$
$\phantom{(\cdots 10) \times (\cdot\cdot 1\cdot 0) \times (\cdot 0\cdot\cdot 1)} \times (0\cdots 1) =$
$\phantom{(\cdots 10) \times (\cdot\cdot 1\cdot 0) \times (\cdot 0\cdot\cdot 1)} \times (1\cdots 0) =$
$\phantom{(\cdots 10) \times (\cdot\cdot 1\cdot 0) \times (\cdot 0\cdot\cdot 1)} \times (1\cdots 1) =$
$(\cdots 10) \times (\cdot\cdot 1\cdot 0) \times (\cdot 1\cdot\cdot 0) \times (0\cdots 0) = (01110)$   15
$\phantom{(\cdots 10) \times (\cdot\cdot 1\cdot 0) \times (\cdot 1\cdot\cdot 0)} \times (0\cdots 1) =$
$\phantom{(\cdots 10) \times (\cdot\cdot 1\cdot 0) \times (\cdot 1\cdot\cdot 0)} \times (1\cdots 0) = (11110)$   31
$\phantom{(\cdots 10) \times (\cdot\cdot 1\cdot 0) \times (\cdot 1\cdot\cdot 0)} \times (1\cdots 1) =$
$(\cdots 10) \times (\cdot\cdot 1\cdot 0) \times (\cdot 1\cdot\cdot 1) \times (0\cdots 0) =$
$\phantom{(\cdots 10) \times (\cdot\cdot 1\cdot 0) \times (\cdot 1\cdot\cdot 1)} \times (0\cdots 1) =$
$\phantom{(\cdots 10) \times (\cdot\cdot 1\cdot 0) \times (\cdot 1\cdot\cdot 1)} \times (1\cdots 0) =$
$\phantom{(\cdots 10) \times (\cdot\cdot 1\cdot 0) \times (\cdot 1\cdot\cdot 1)} \times (1\cdots 1) =$
$(\cdots 10) \times (\cdot\cdot 1\cdot 1) \times (\cdot 0\cdot\cdot 0) \times (0\cdots 0) =$
$\phantom{(\cdots 10) \times (\cdot\cdot 1\cdot 1) \times (\cdot 0\cdot\cdot 0)} \times (0\cdots 1) =$
$\phantom{(\cdots 10) \times (\cdot\cdot 1\cdot 1) \times (\cdot 0\cdot\cdot 0)} \times (1\cdots 0) =$
$\phantom{(\cdots 10) \times (\cdot\cdot 1\cdot 1) \times (\cdot 0\cdot\cdot 0)} \times (1\cdots 1) =$
$(\cdots 10) \times (\cdot\cdot 1\cdot 1) \times (\cdot 0\cdot\cdot 1) \times (0\cdots 0) =$
$\phantom{(\cdots 10) \times (\cdot\cdot 1\cdot 1) \times (\cdot 0\cdot\cdot 1)} \times (0\cdots 1) =$
$\phantom{(\cdots 10) \times (\cdot\cdot 1\cdot 1) \times (\cdot 0\cdot\cdot 1)} \times (1\cdots 0) =$
$\phantom{(\cdots 10) \times (\cdot\cdot 1\cdot 1) \times (\cdot 0\cdot\cdot 1)} \times (1\cdots 1) =$
$(\cdots 10) \times (\cdot\cdot 1\cdot 1) \times (\cdot 1\cdot\cdot 0) \times (0\cdots 0) =$
$\phantom{(\cdots 10) \times (\cdot\cdot 1\cdot 1) \times (\cdot 1\cdot\cdot 0)} \times (0\cdots 1) =$
$\phantom{(\cdots 10) \times (\cdot\cdot 1\cdot 1) \times (\cdot 1\cdot\cdot 0)} \times (1\cdots 0) =$
$\phantom{(\cdots 10) \times (\cdot\cdot 1\cdot 1) \times (\cdot 1\cdot\cdot 0)} \times (1\cdots 1) =$
$(\cdots 10) \times (\cdot\cdot 1\cdot 1) \times (\cdot 1\cdot\cdot 1) \times (0\cdots 0) =$
$\phantom{(\cdots 10) \times (\cdot\cdot 1\cdot 1) \times (\cdot 1\cdot\cdot 1)} \times (0\cdots 1) =$
$\phantom{(\cdots 10) \times (\cdot\cdot 1\cdot 1) \times (\cdot 1\cdot\cdot 1)} \times (1\cdots 0) =$
$\phantom{(\cdots 10) \times (\cdot\cdot 1\cdot 1) \times (\cdot 1\cdot\cdot 1)} \times (1\cdots 1) =$

FIG. 36

$H_1 = G_1 \times G_2 \times G_3 \times G_4$ , $(f_5 f_4 f_3 f_2 f_1)$   $|G_i| = 4$ $(\cdots 11) \times (\cdot \cdot 0 \cdot 0) \times (\cdot 0 \cdot \cdot 0) \times (0 \cdots 0) =$
$\phantom{(\cdots 11) \times (\cdot \cdot 0 \cdot 0) \times (\cdot 0 \cdot \cdot 0)} \times (0 \cdots 1) =$
$\phantom{(\cdots 11) \times (\cdot \cdot 0 \cdot 0) \times (\cdot 0 \cdot \cdot 0)} \times (1 \cdots 0) =$
$\phantom{(\cdots 11) \times (\cdot \cdot 0 \cdot 0) \times (\cdot 0 \cdot \cdot 0)} \times (1 \cdots 1) =$
$(\cdots 11) \times (\cdot \cdot 0 \cdot 0) \times (\cdot 0 \cdot \cdot 1) \times (0 \cdots 0) =$
$\phantom{(\cdots 11) \times (\cdot \cdot 0 \cdot 0) \times (\cdot 0 \cdot \cdot 1)} \times (0 \cdots 1) =$
$\phantom{(\cdots 11) \times (\cdot \cdot 0 \cdot 0) \times (\cdot 0 \cdot \cdot 1)} \times (1 \cdots 0) =$
$\phantom{(\cdots 11) \times (\cdot \cdot 0 \cdot 0) \times (\cdot 0 \cdot \cdot 1)} \times (1 \cdots 1) =$
$(\cdots 11) \times (\cdot \cdot 0 \cdot 0) \times (\cdot 1 \cdot \cdot 0) \times (0 \cdots 0) =$
$\phantom{(\cdots 11) \times (\cdot \cdot 0 \cdot 0) \times (\cdot 1 \cdot \cdot 0)} \times (0 \cdots 1) =$
$\phantom{(\cdots 11) \times (\cdot \cdot 0 \cdot 0) \times (\cdot 1 \cdot \cdot 0)} \times (1 \cdots 0) =$
$\phantom{(\cdots 11) \times (\cdot \cdot 0 \cdot 0) \times (\cdot 1 \cdot \cdot 0)} \times (1 \cdots 1) =$
$(\cdots 11) \times (\cdot \cdot 0 \cdot 0) \times (\cdot 1 \cdot \cdot 1) \times (0 \cdots 0) =$
$\phantom{(\cdots 11) \times (\cdot \cdot 0 \cdot 0) \times (\cdot 1 \cdot \cdot 1)} \times (0 \cdots 1) =$
$\phantom{(\cdots 11) \times (\cdot \cdot 0 \cdot 0) \times (\cdot 1 \cdot \cdot 1)} \times (1 \cdots 0) =$
$\phantom{(\cdots 11) \times (\cdot \cdot 0 \cdot 0) \times (\cdot 1 \cdot \cdot 1)} \times (1 \cdots 1) =$
$(\cdots 11) \times (\cdot \cdot 0 \cdot 1) \times (\cdot 0 \cdot \cdot 0) \times (0 \cdots 0) =$
$\phantom{(\cdots 11) \times (\cdot \cdot 0 \cdot 1) \times (\cdot 0 \cdot \cdot 0)} \times (0 \cdots 1) =$
$\phantom{(\cdots 11) \times (\cdot \cdot 0 \cdot 1) \times (\cdot 0 \cdot \cdot 0)} \times (1 \cdots 0) =$
$\phantom{(\cdots 11) \times (\cdot \cdot 0 \cdot 1) \times (\cdot 0 \cdot \cdot 0)} \times (1 \cdots 1) =$
$(\cdots 11) \times (\cdot \cdot 0 \cdot 1) \times (\cdot 0 \cdot \cdot 1) \times (0 \cdots 0) = (00011)$   4
$\phantom{(\cdots 11) \times (\cdot \cdot 0 \cdot 1) \times (\cdot 0 \cdot \cdot 1)} \times (0 \cdots 1) =$
$\phantom{(\cdots 11) \times (\cdot \cdot 0 \cdot 1) \times (\cdot 0 \cdot \cdot 1)} \times (1 \cdots 0) = (10011)$   20
$\phantom{(\cdots 11) \times (\cdot \cdot 0 \cdot 1) \times (\cdot 0 \cdot \cdot 1)} \times (1 \cdots 1) =$
$(\cdots 11) \times (\cdot \cdot 0 \cdot 1) \times (\cdot 1 \cdot \cdot 0) \times (0 \cdots 0) =$
$\phantom{(\cdots 11) \times (\cdot \cdot 0 \cdot 1) \times (\cdot 1 \cdot \cdot 0)} \times (0 \cdots 1) =$
$\phantom{(\cdots 11) \times (\cdot \cdot 0 \cdot 1) \times (\cdot 1 \cdot \cdot 0)} \times (1 \cdots 0) =$
$\phantom{(\cdots 11) \times (\cdot \cdot 0 \cdot 1) \times (\cdot 1 \cdot \cdot 0)} \times (1 \cdots 1) =$
$(\cdots 11) \times (\cdot \cdot 0 \cdot 1) \times (\cdot 1 \cdot \cdot 1) \times (0 \cdots 0) = (01011)$   12
$\phantom{(\cdots 11) \times (\cdot \cdot 0 \cdot 1) \times (\cdot 1 \cdot \cdot 1)} \times (0 \cdots 1) =$
$\phantom{(\cdots 11) \times (\cdot \cdot 0 \cdot 1) \times (\cdot 1 \cdot \cdot 1)} \times (1 \cdots 0) = (11011)$   28
$\phantom{(\cdots 11) \times (\cdot \cdot 0 \cdot 1) \times (\cdot 1 \cdot \cdot 1)} \times (1 \cdots 1) =$

FIG. 37

$H_1 = G_1 \times G_2 \times G_3 \times G_4$ , $(f_5 f_4 f_3 f_2 f_1)$ $|G_i|=4$ $(\cdots 11) \times (\cdot\cdot 1 \cdot 0) \times (\cdot 0 \cdot\cdot 0) \times (0 \cdots 0) =$
$\phantom{(\cdots 11) \times (\cdot\cdot 1 \cdot 0) \times (\cdot 0 \cdot\cdot 0)} \times (0 \cdots 1) =$
$\phantom{(\cdots 11) \times (\cdot\cdot 1 \cdot 0) \times (\cdot 0 \cdot\cdot 0)} \times (1 \cdots 0) =$
$\phantom{(\cdots 11) \times (\cdot\cdot 1 \cdot 0) \times (\cdot 0 \cdot\cdot 0)} \times (1 \cdots 1) =$
$(\cdots 11) \times (\cdot\cdot 1 \cdot 0) \times (\cdot 0 \cdot\cdot 1) \times (0 \cdots 0) =$
$\phantom{(\cdots 11) \times (\cdot\cdot 1 \cdot 0) \times (\cdot 0 \cdot\cdot 1)} \times (0 \cdots 1) =$
$\phantom{(\cdots 11) \times (\cdot\cdot 1 \cdot 0) \times (\cdot 0 \cdot\cdot 1)} \times (1 \cdots 0) =$
$\phantom{(\cdots 11) \times (\cdot\cdot 1 \cdot 0) \times (\cdot 0 \cdot\cdot 1)} \times (1 \cdots 1) =$
$(\cdots 11) \times (\cdot\cdot 1 \cdot 0) \times (\cdot 1 \cdot\cdot 0) \times (0 \cdots 0) =$
$\phantom{(\cdots 11) \times (\cdot\cdot 1 \cdot 0) \times (\cdot 1 \cdot\cdot 0)} \times (0 \cdots 1) =$
$\phantom{(\cdots 11) \times (\cdot\cdot 1 \cdot 0) \times (\cdot 1 \cdot\cdot 0)} \times (1 \cdots 0) =$
$\phantom{(\cdots 11) \times (\cdot\cdot 1 \cdot 0) \times (\cdot 1 \cdot\cdot 0)} \times (1 \cdots 1) =$
$(\cdots 11) \times (\cdot\cdot 1 \cdot 0) \times (\cdot 1 \cdot\cdot 1) \times (0 \cdots 0) =$
$\phantom{(\cdots 11) \times (\cdot\cdot 1 \cdot 0) \times (\cdot 1 \cdot\cdot 1)} \times (0 \cdots 1) =$
$\phantom{(\cdots 11) \times (\cdot\cdot 1 \cdot 0) \times (\cdot 1 \cdot\cdot 1)} \times (1 \cdots 0) =$
$\phantom{(\cdots 11) \times (\cdot\cdot 1 \cdot 0) \times (\cdot 1 \cdot\cdot 1)} \times (1 \cdots 1) =$
$(\cdots 11) \times (\cdot\cdot 1 \cdot 1) \times (\cdot 0 \cdot\cdot 0) \times (0 \cdots 0) =$
$\phantom{(\cdots 11) \times (\cdot\cdot 1 \cdot 1) \times (\cdot 0 \cdot\cdot 0)} \times (0 \cdots 1) =$
$\phantom{(\cdots 11) \times (\cdot\cdot 1 \cdot 1) \times (\cdot 0 \cdot\cdot 0)} \times (1 \cdots 0) =$
$\phantom{(\cdots 11) \times (\cdot\cdot 1 \cdot 1) \times (\cdot 0 \cdot\cdot 0)} \times (1 \cdots 1) =$
$(\cdots 11) \times (\cdot\cdot 1 \cdot 1) \times (\cdot 0 \cdot\cdot 1) \times (0 \cdots 0) = (00111)$     8
$\phantom{(\cdots 11) \times (\cdot\cdot 1 \cdot 1) \times (\cdot 0 \cdot\cdot 1)} \times (0 \cdots 1) =$
$\phantom{(\cdots 11) \times (\cdot\cdot 1 \cdot 1) \times (\cdot 0 \cdot\cdot 1)} \times (1 \cdots 0) = (10111)$     24
$\phantom{(\cdots 11) \times (\cdot\cdot 1 \cdot 1) \times (\cdot 0 \cdot\cdot 1)} \times (1 \cdots 1) =$
$(\cdots 11) \times (\cdot\cdot 1 \cdot 1) \times (\cdot 1 \cdot\cdot 0) \times (0 \cdots 0) =$
$\phantom{(\cdots 11) \times (\cdot\cdot 1 \cdot 1) \times (\cdot 1 \cdot\cdot 0)} \times (0 \cdots 1) =$
$\phantom{(\cdots 11) \times (\cdot\cdot 1 \cdot 1) \times (\cdot 1 \cdot\cdot 0)} \times (1 \cdots 0) =$
$\phantom{(\cdots 11) \times (\cdot\cdot 1 \cdot 1) \times (\cdot 1 \cdot\cdot 0)} \times (1 \cdots 1) =$
$(\cdots 11) \times (\cdot\cdot 1 \cdot 1) \times (\cdot 1 \cdot\cdot 1) \times (0 \cdots 0) = (01111)$     16
$\phantom{(\cdots 11) \times (\cdot\cdot 1 \cdot 1) \times (\cdot 1 \cdot\cdot 1)} \times (0 \cdots 1) =$
$\phantom{(\cdots 11) \times (\cdot\cdot 1 \cdot 1) \times (\cdot 1 \cdot\cdot 1)} \times (1 \cdots 0) = (11111)$     32
$\phantom{(\cdots 11) \times (\cdot\cdot 1 \cdot 1) \times (\cdot 1 \cdot\cdot 1)} \times (1 \cdots 1) =$

FIG. 38(a)

$V = [v_1 \; v_2 \; v_3 \; v_4 \; v_5 \; v_6 \; v_7]$ $= A \cdot B$ $= [a_1 \; a_2 \; a_3 \; a_4] \begin{bmatrix} b_{11} & b_{21} & 1 & b_{31} & 0 & 0 & 0 \\ b_{12} & b_{22} & 0 & b_{32} & 1 & 0 & 0 \\ b_{13} & b_{23} & 0 & b_{33} & 0 & 1 & 0 \\ b_{14} & b_{24} & 0 & b_{34} & 0 & 0 & 1 \end{bmatrix}$ $= [c_1 \; c_2 \; a_1 \; c_3 \; a_2 \; a_3 \; a_4]$ V: hamming code
B: generated matrix
A: data

FIG. 38(b)

$V \cdot M = [c_1 \; c_2 \; a_1 \; c_3 \; a_2 \; a_3 \; a_4] \begin{bmatrix} 1 & 0 & 0 \\ 0 & 1 & 0 \\ b_{11} & b_{21} & b_{31} \\ 0 & 0 & 1 \\ b_{12} & b_{22} & b_{32} \\ b_{13} & b_{23} & b_{33} \\ b_{14} & b_{24} & b_{34} \end{bmatrix}$ $\begin{bmatrix} c_1 \\ c_2 \\ c_3 \end{bmatrix} = \begin{bmatrix} b_{11} & b_{12} & b_{13} & b_{14} \\ b_{21} & b_{22} & b_{23} & b_{24} \\ b_{31} & b_{32} & b_{33} & b_{34} \end{bmatrix} \begin{bmatrix} a_1 \\ a_2 \\ a_3 \\ a_4 \end{bmatrix}$ $V \cdot M = [2c_1 \; 2c_2 \; 2c_3]$
$= [0 \; 0 \; 0]$

FIG. 38(c)

$V \cdot M = V \cdot M + E \cdot M$ $= 0 + [1 \; 0 \; 0 \; 0 \; 0 \; 0 \; 0]$ $(\because V \cdot M = 0)$ $= (1 \; 0 \; 0) \begin{bmatrix} 1 & 0 & 0 \\ 0 & 1 & 0 \\ b_{11} & b_{21} & b_{31} \\ 0 & 0 & 1 \\ b_{12} & b_{22} & b_{32} \\ b_{13} & b_{23} & b_{33} \\ b_{14} & b_{24} & b_{34} \end{bmatrix}$

ここで:

$\begin{bmatrix} b_{11} & b_{21} & b_{31} \\ b_{12} & b_{22} & b_{32} \\ b_{13} & b_{23} & b_{33} \\ b_{14} & b_{24} & b_{34} \end{bmatrix} = \begin{bmatrix} 1 & 1 & 0 \\ 1 & 0 & 1 \\ 0 & 1 & 1 \\ 1 & 1 & 1 \end{bmatrix}$

FIG. 38(d)

| E | V·M |
|---|---|
| [1 0 0 0 0 0 0] | [1 0 0] |
| [0 1 0 0 0 0 0] | [0 1 0] |
| [0 0 1 0 0 0 0] | [1 1 0] |
| [0 0 0 1 0 0 0] | [0 0 1] |
| [0 0 0 0 1 0 0] | [1 0 1] |
| [0 0 0 0 0 1 0] | [0 1 1] |
| [0 0 0 0 0 0 1] | [1 1 1] |

METHOD OF DETECTING AND CORRECTING TRANSMISSION ERROR OF DIGITAL SIGNALS

TECHNICAL FIELD

This invention relates to a method of detecting transmission errors that may occur during serial transmission of digital signals and correcting the detected transmission errors.

BACKGROUND ART

Binary digital signals transmitted through a transmission line suffer bit reversal at a certain rate that depends upon the characteristics of the transmission line.

In order to detect and correct transmission errors due to bit reversal, redundant characters or check bits are added to information bits that represent information to be transmitted.

A hamming code V shown in FIG. 38 has its respective characters spaced a predetermined distance not less than three (hamming distance) from adjacent ones. If there is an error in one bit or character, such an error can be easily detected because in such a case, the hamming distance between the bit in error and the original bit changes from zero to one and the hamming distance between the bit in error and any adjacent bit changes from three to two.

Specifically, in the transmitter (see FIG. 38A), data $a_k$ (k=1, 2 . . . ) and redundant bits $c_1$ (1=1, 2 . . . ) are mixed together using a coding matrix B to create e.g. a hamming code "$c_1 \, c_2 \, a_1 \, c_3 \, a_2 \, a_3$".

Upon receiving the hamming code, the receiver checks it by multiplying the code by a check matrix M as shown in FIG. 38B.

If an error E=[1000000] occurs during transmission, results of check operations will be (100) as shown in FIG. 38C. Thus, it is possible to detect and specify the bit in error. FIG. 38D show the results of operations on bits in error.

One problem with such a hamming code is that such a code needs a relatively large number of redundant bits $c_k$ (in the above example, the ratio of information bits to the entire transmission bits is 4/7=57.2%), and thus the transmission efficiency is low. Also, in this arrangement, only one error can be detected and corrected at one time. That is, if errors occur in two bits, it is impossible to detect and correct such errors.

Now therefore, it is a first object of this invention to provide a method for detecting multiple transmission errors with high reliability while maintaining high transmission efficiency. A second object of the invention is to provide a method for correcting multiple transmission errors with high reliability while maintaining high transmission efficiency.

DISCLOSURE OF THE INVENTION

In order achieve the first object, there is provided, according to this invention, a method for detecting errors in transmission of n (in number) digital signals which are a mixture of k (in number) information bits ($a_k$) and n–k check bits ($c_{(n-k)}$), the method comprising, in a processing unit of a transmitter:

attaching n addresses (ad) which are h-digit numbers expressed in a number system having integer q as its base (n =$q^h$) to the respective n digital signals, allocating the check bits ($c_{(n-k)}$) to respective addresses (ad) each including h–r ($1 \leq r \leq h$) integers q–1 or 0's, and allocating the information bits ($a_k$) to the remaining ones of the addresses, selecting h–r digits from the h digits of each of the addresses (ad) without duplication, creating ${}_hC_{h-r} \cdot q^{h-r}$ bit strings (g) each comprising $q^r$ bits having the same integers for the selected h–r digits, determining the value of the check bits ($c_{(n-k)}$) in each bit string (g) to which the largest address (ad) is attached by subjecting the respective bit strings (g) to parity checks, thus producing a transmission code (1), and in a processing unit of a receiver: attaching n addresses (ad) which are h-digit numbers expressed in a number system having integer q as its base (n =$q^h$) to the respective n digital signals of the transmission code (1) received from the transmitter, selecting h–r digits from the h digits of each of the addresses (ad) without duplication, creating ${}_hC_{h-r} \cdot q^{h-r}$ bit strings (g) each comprising $q^r$ bits having the same integers for the selected h–r digits, and detecting errors in transmission by subjecting the respective bit strings (g) to parity checks.

In this method, in the transmitter, n addresses (ad) which are h-digit numbers expressed in a number system having integer q as its base are attached to the respective n digital signals. Check bits ($c_{(n-k)}$) are allocated to respective addresses (ad) each including h–r ($1 \leq r \leq h$) integers q–1 or 0's, information bits ($a_k$) are allocated to the remaining ones of the addresses. Transmission data are allocated to the information bits ($a_k$). h–r digits are selected from the h digits of each of the addresses (ad) without duplication to create ${}_hC_{h-r} \cdot q^{h-r}$ bit strings (g) each comprising $q^r$ bits having the same integers for the selected h–r digits. Each bit includes at least one address corresponding to a check bit ($c_{(n-k)}$). The $q^{r-1}$ bits corresponding to the remaining addresses (ad) may be all information bits ($a_k$), a mixture of information bits ($a_k$) and check bits ($c_{(n-k)}$), or all check bits ($c_{(n-k)}$). In any case, it is possible to select a check bit ($c_{(n-k)}$) corresponding to the largest one of the selected $q^r$ addresses (ad), and thus to determine the value of the check bits ($c_{(n-k)}$) in each bit string (g) to which the largest address (ad) is attached by subjecting the $q^r$ bits to even parity checks. This process is carried out for all the ${}_hC_{h-r} \cdot q^{h-r}$ bit strings (g) to create the transmission code (1).

In the receiver, addresses (ad) are attached to the transmission code (1) received, ${}_hC_{h-r} \cdot q^{h-r}$ bit strings (g) are created, and the bit strings (g) thus created are subjected to parity checks, in the same manner as in the transmitter. Any transmission error in the code can be easily detected, because such error appears in the form of parity break during parity checks. (claim 1)

All or part of the h digits of each address (ad) may be expressed in different number systems having different integers as their bases.

With this arrangement, it is possible to handle any number of signals without increasing the number of digits of each address (ad). (claim 2)

In order to achieve the second object, this invention provides a method for correcting errors in transmission of n (in number) digital signals which are a mixture of k (in number) information bits ($a_k$) and n–k check bits ($c_{(n-k)}$), the method comprising, the steps carried out in the processing unit of the transmitter in the above-described manner, and in a processing unit of a receiver: attaching n addresses (ad) which are h-digit numbers expressed in a number system having integer q as its base (n=$q^h$) to the respective n digital signals of the transmission code (1) received from the transmitter, selecting h–r digits from the h digits of each of the addresses (ad) without duplication, creating a group (G) of check formulas for each of the $_hC_{h-r}$ combinations of h–r bits, the check formulas in each group (G) being all the possible combinations of the integers of the selected h–r digits, creating $q^{h-r}$ bit strings (g) for each group (G), each of the bit strings comprising $q^r$ bits to which are attached addresses (ad) having the same integers at the selected h–r digits, allocating each check formula to a respective bit string (g), wherein only the h–r digits of the each check formula used to select the respective bit string (g) are effective digits and the remaining digits are indefinite, and correcting any bit in error by repeatedly subjecting the bit strings (g) to parity checks to calculate any parity break, collecting r+1 bit strings (g) in which parity break has been detected for each check formula group (G) and subjecting the thus collected r+1 bit strings to logic operations to find out the address of any bit in error.

In this arrangement, h–r digits are selected from the h digits of each of the addresses (ad) without duplication to create a group (G) of check formulas for each of the $_hC_{h-r}$ combinations of h–r digits, the check formulas in each group (G) being all the possible combinations of the integers of the selected h–r digits. Check formulas in different groups (G) has no common digits. The bit strings (g) to which the respective check formulas are allocated include address information. Thus, by carrying out logic operations on the components of the check formulas attached to bit strings (g) in which parity break is found for each check formula group (G), it is possible to detect bits in error. The logic operations are carried out by collecting r+1 check formula groups (G), so that the maximum number of operations will be PCr+1 $q^{(h-r)(r+1)}$ (where $P=_hC_{h-r}$). It is thus possible to reduce the number of operations. (claim 3)

The logic operations may be carried out for check formulas based on correction equations (Hn) for calculating effective digit components by performing logic operations between the check formula groups (G).

With this arrangement, logic operations for check formulas are carried out based on correction equations (Hn) that makes the digit components of addresses (ad) effective, so that it is possible to reduce unnecessary operations. That is, it is possible to combine digits of addresses (ad) by subjecting the components of the check formula groups (G) to logic operations. The number of such combinations will be $_hC_{h-r-1} \cdot q^{(h-r)(r+1)}$. It is thus possible to considerably reduce the number of operations. (claim 4)

Only logic operations that give effective results may be carried out between the check formulas.

With this arrangement, it is possible to reduce the number of operations ($_hC_{h-r-1} \cdot q^h$) and thus to reduce the cost, increase the processing speed and reduce the size of the device and energy consumption. (claim 5)

The step of correcting transmission errors may be repeated N times.

In this arrangement, even if there are many transmission errors and a long time is needed to correct these errors, the error correction process is terminated and a request for retransmission is issued when the error correction process has been repeated N times. It is thus possible to keep high transmission efficiency. (claim 6)

The step of correcting transmission errors may be carried out by comparing the operation results calculated from the check formulas and pointed to an identical address (ad) with a predetermined number A.

In this arrangement, for any address (ad) to which A or more operation results are pointed, error corrections are made unlimitedly. For example, if all the operation results are pointed to a certain address, the bit at this address is almost 100% in error. Thus, by carrying out error corrections only for addresses to which A ($1 \leq A \leq _hC_{h-r-1}$) or more operation results are pointed, it is possible to freely determine the reliability of error corrections. For addresses to which less than A operation results are pointed, no error corrections are made to improve error correction capacity. (claim 7)

A predetermined number L of bits may be corrected at one time.

The value L may be equal to or smaller than $q^{h-r-1}$. L bits counted downward from the maximum number ($_hC_{h-r-1}$) of the numbers of logic operations that are pointed to a single address (ad) are corrected. It is thus possible to freely determine the reliability of correction. No unreliable corrections are made, so that it is possible to improve error correction capacity with high efficiency. (claim 8)

All or part of the h digits of each address (ad) may be expressed in different number systems having different integers as their bases.

With this arrangement, it is possible to process any number of signals without increasing the digits of each address (ad). (claim 9)

In another arrangement, a plurality of bits are be combined into a transmission signal (1) in the processing unit of the transmitter and are transmitted to the receiver in a serial order, and the processing unit of the receiver separates the bits of the signal received, creates the original transmission signal (1) from the separated bits, and corrects any error present in the transmission signal (1) thus created.

With this arrangement, it is possible to eliminate any burst errors that may occur during transmission by separating bits of the signal received. The transmission capacity thus improves.

BRIEF DESCRIPTION OF THE DRAWINGS

FIG. 4 is a schematic view illustrating the transmission code of the first embodiment of this invention.

FIG. 5 is a schematic view of the transmission code of the first embodiment of this invention.

FIG. 7 is a view illustrating the encoding method of the first embodiment of this invention.

Figure 8:
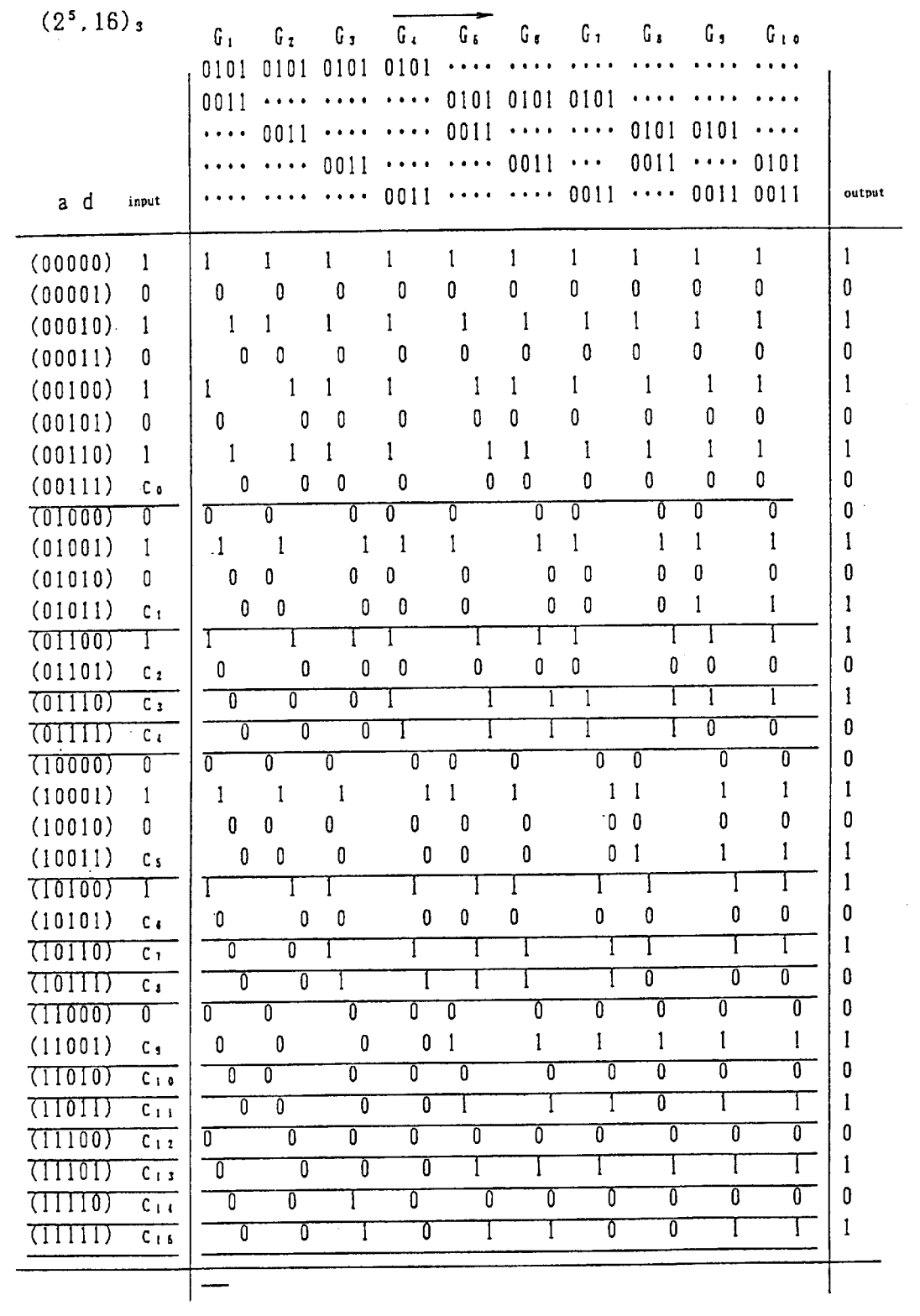

FIG. 8 is a view illustrating the detecting method of the first embodiment of this invention.

FIG. 10 is a view illustrating the detecting method of the first embodiment of this invention.

FIG. 11 is a view illustrating the detecting method of the first embodiment of this invention.

FIG. 14 is a view illustrating the correcting method of the second embodiment of this invention.

FIG. 15 is a view illustrating the correcting method of the second embodiment of this invention.

FIG. 16 is a view illustrating the correcting method of the second embodiment of this invention.

FIG. 17 is a view illustrating the correcting method of the second embodiment of this invention.

FIG. 18 is a view illustrating the correcting method of the second embodiment of this invention.

FIG. 19 is a view illustrating the correcting method of the second embodiment of this invention.

FIG. 20 is a view illustrating the correcting method of the second embodiment of this invention.

FIG. 21 is a view illustrating the correcting method of the second embodiment of this invention.

FIG. 22 is a view illustrating the correcting method of the second embodiment of this invention.

FIG. 23 is a table showing solutions for correction equations of the second embodiment of this invention.

FIG. 24 is a table showing solutions for correction equations of the second embodiment of this invention.

FIG. 25 is a table showing solutions for correction equations of the second embodiment of this invention.

FIG. 26 is a table showing solutions for correction equations of the second embodiment of this invention.

FIG. 27 is a table showing solutions for correction equations of the second embodiment of this invention.

FIG. 30 is a table showing solutions for correction equations of the second embodiment.

FIG. 31 is a table showing solutions for correction equations of the second embodiment.

FIG. 32 is a table showing solutions for correction equations of the second embodiment.

FIG. 33 is a table showing solutions for correction equations of the second embodiment.

FIG. 34 is a table showing solutions for correction equations of the second embodiment.

FIG. 35 is a table showing solutions for correction equations of the second embodiment.

FIG. 36 is a table showing solutions for correction equations of the second embodiment.

FIG. 37 is a table showing solutions for correction equations of the second embodiment.

FIG. 38 shows a conventional arrangement.

BEST MODE FOR CARRYING OUT THE INVENTION

An embodiment of this invention will now be described with reference to the drawings.

Figure 1:
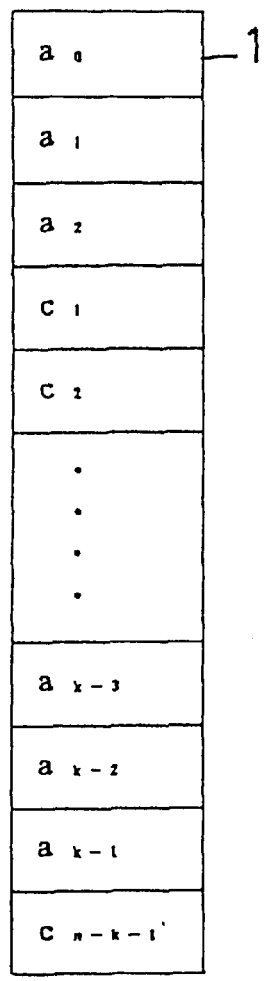
FIG. 1 is a schematic view of the transmission code according to this invention.

FIG. 1 shows a data block according to the present invention.

The data block comprises a row of n bits. Of the n bits, k bits are information bits $a_k$ (k=1, 2, ... k), and the remaining n–k bits are check bits $c_{(n-k)}$. The information bits $a_k$ and check bits $c_{(n-k)}$ are mixed together to form a transmission code 1.

The transmission code 1 is created by a processor, such as a computer or a dedicated LSI, of a transmitter, and sent to a processor of a receiver.

Figure 2:
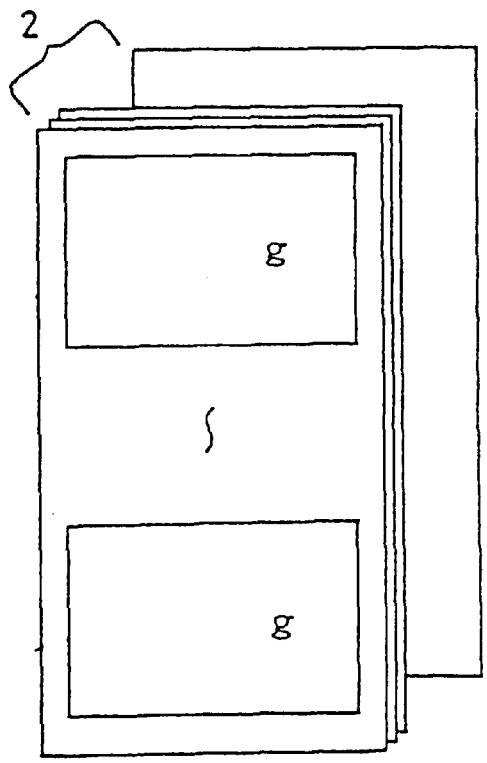
FIG. 2 is a schematic view of the memory according to this invention.

For this purpose, bit columns g are generated in a working area of a memory 2 in the processor of the transmitter, as shown in FIG. 2. The bit columns g are subjected to a parity check to produce (encode) check bits $c_{(n-k)}$. The transmission code 1 thus created is sent to the receiver.

The processor of the receiver detects and corrects any error in the transmission code 1 transmitted from the transmitter by creating bit columns g based on the information bits $a_k$ and check bits $c_{(n-k)}$ of the transmission code 1.

Figure 3:
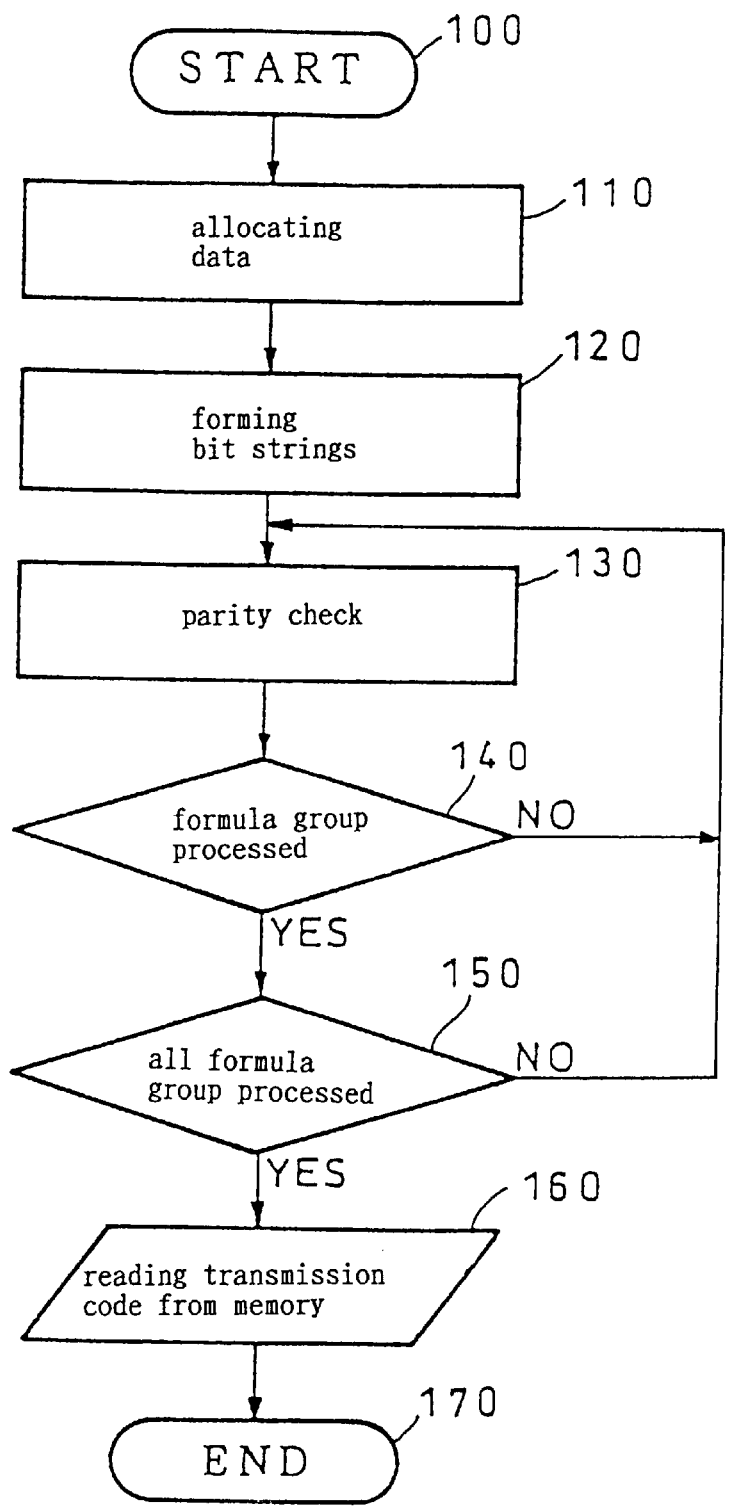
FIG. 3 is a flowchart showing a first embodiment of this invention.

The method of detecting and correcting transmission errors according to the invention is now described step by step with reference to the flowchart of FIG. 3.

The transmission code 1 shown has a length n of 32 bits, of which 16 bits are information bits ak.

In the processor of the transmitter, upon start of the process (Step 100), a working space corresponding to the length n of the transmission code 1 is created in the memory 2. Data are allocated to each of the n bits of the transmission code 1 (110). Addresses ad are attached to the respective n bits of the transmission code 1. The addresses ad are h-figure numbers represented by a number system having integer q as its base and different from one another.

That is, the addresses ad, which are h-figure numbers represented by a number system having q as its base, are allocated to the respective n bits, which are numbered by decimal notation, and comprise information bits $a_k$ and check bits $c_{(n-k)}$, based on the following formula:

$$Bn = \phi(Nn) = \phi(Mg \cdot Eg) \quad (1)$$

where $$Bn = \begin{vmatrix} b_0 \\ b_1 \\ . \\ . \\ . \\ . \\ b_n \end{vmatrix} \quad Nn = \begin{vmatrix} 0 \\ 1 \\ . \\ . \\ . \\ . \\ n \end{vmatrix} \quad Mg = \begin{vmatrix} 0 & 0 & 0 & . & . & . & . & 0 \\ 0 & 0 & . & . & . & . & . & 1 \\ 0 & . & . & . & . & . & . & q-1 \\ . & . & . & . & . & . & . & . \\ . & . & . & . & . & . & . & q-1 \\ . & . & . & . & . & . & . & . \\ q-1 & . & . & . & . & . & q-1 \end{vmatrix} \quad Eq = \begin{vmatrix} q^{h-1} \\ . \\ . \\ . \\ . \\ q^0 \end{vmatrix}$$

Thus, there is a one-to-one relationship between Nn, which represents the addresses ad, and $M_g \cdot E_g$.

That is, the relationship between Nn and $M_g$ $E_g$ is given by the formula:

$$Nn = Mg \cdot Eg \quad (2)$$

By determining the number represented by the number system having q as its base, $E_g$ will be constant. Thus, there is the following relationship between Bn and $M_g$:

$$Nn = \pi(Mg)$$

which leads to:

$$Bn = \phi(Nn) = \phi[\pi(Mg)]$$
$$= \phi[\pi(Mg)]$$

Thus, Bn and $M_g$ can be combined in a one-to-one relation to each other. Each row of $M_g$ serves as an address ad for each bit.

In the above formulas,

Bn is a vector having as its components n bits numbered by decimal notation;

Nn is a vector having as its components decimal numbers 0–n which are attached to the respective components of BN;

$M_g$ is a matrix having h columns by $q^h$ rows;

$E_g$ is a vector having as its components $q^0 – q^{h-1}$;

ø is a function that establishes a one-to-one relation between the components of Bn and Nn;

π is a function that establishes a one-to-one relation between the components of Nn and $M_g$; and $M_g \cdot E_{gg}$ is the product of the matrix and the vector.

In this embodiment, the addresses ad are binaries (q=2), and there are 32 (n=2⁵) bits counted in decimal notation. Thus, the binary addresses ad are attached to the 32 bits as shown in FIG. 4.

That is, if the transmission data are (1010101010101010), the first bit is given the address (00000), the second bit is given the address (00001), and then (00010), . . . (11111), as shown in FIG. 5.

Data are allocated to the respective bits, which correspond to $q^h$ addresses, using r (1≦r≦h) digit determined by Formula (3). Since the addresses ad are binaries (q=2) in this embodiment, the information bits $a_k$ are allocated to all the bits to which are attached addresses ad each including h–r or more integers 1's (maximum number q–1 or 2–1) or 0's. In this embodiment, transmission data are allocated to 16 bits to which are attached addressees ad including three or more 0's.

(1) or (0) is allocated to each of the remaining bits, i.e. the check bits $C_{(n-k)}$.

(1) or (0) is allocated to each of the check bits $C_{(n-k)}$, using the addresses ad attached to the bits that represent transmission data 1.

That is, address codes ad are used to create bit strings g, which are all the possible combinations of information bits $a_k$ and check bits $c_{(n-k)}$ in the manner shown by Formula (3).

$$n = q^h = \sum_{i=0}^{h} {}_hC_i \cdot (q-1)^i$$

$$k = \sum_{i=0}^{r-1} {}_hC_i \cdot (q-1)^i$$

$$n - k = \sum_{i=r}^{h} {}_hC_i \cdot (q-1)^i$$

(3)

where k is the number of information bits, n-k is the number of check bits, n is the number of transmission bits, and r is an arbitrarily determined number of figures.

Then, h–r of the h figures of the addresses ad are selected without duplication, and the bits to which are attached addresses ad whose components of the selected h–r figures are the same are selected as bit strings g, the number of such bit strings g being ${}_hC_{h-r} \cdot q^{h-r}$ (Step 120).

Figure 6:
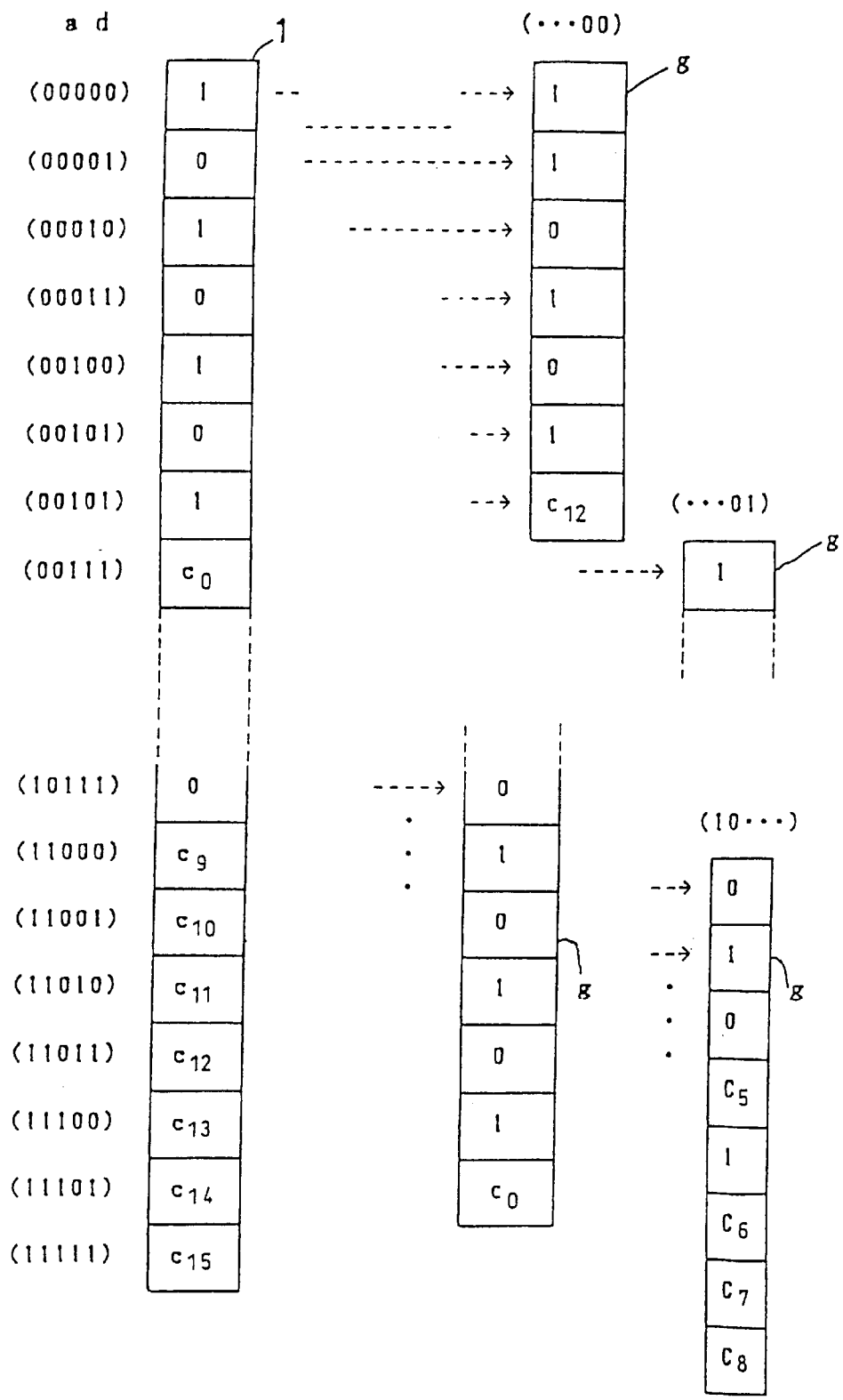
FIG. 6 is a view illustrating the encoding method of the first embodiment of this invention.

In this embodiment, the number h–r being 2, all the rows g of bits which are the same in integers of the two selected figures of their addresses ad are selected, as shown in FIG. 6. In such bit strings g are included those to which are attached addresses ad whose two right figures are (00) and (01), respectively. All the possible bit strings g are shown in FIG. 7. That is, each column of the characters * indicate a bit string whose addresses are the same in the integers of the two selected figures.

In this embodiment, there are 10 (${}_5C_2$) combinations in which two figures are selected from the five figures of the addresses ad. Of any combination, integers 1 and 0 can be combined in 4 (2²) different ways. In FIG. 7, the 10 combinations or check formula groups are represented by $G_1$–$G_{10}$, each being subdivided into four bit strings g.

Each bit string g in each check formula group G includes at least one address ad corresponding to a check bit $c_{(n-k)}$.

The bits in the bit string g corresponding to the remaining addresses ad ($q^r$–1 in number) may consist essentially of information bits ak, may be a combination of information bits ak and check bits $c_{(n-k)}$, or may consist essentially of check bits $c_{(n-k)}$. In any case, one check bit $c_{(n-k)}$ corresponding to the largest address of the $q^r$ addresses ad in the bit string g can be selected. Then, the value of the check bits $c_{(n-k)}$ is determined by subjecting the $q^r$ bits to parity check as shown by Formula (4). (Step. 130)

$$C_{(n-k)} = a1 + a2 + \ldots \pmod{2}$$

(4)

If two or more check bits $c_{(n-k)}$ are included in each bit string g, the bit having the larger address ad is changed.

When one check formula groups G has been processed in the above manner (Step 140), the other groups G are processed one after another. This process is repeated until all the check formula groups G are processed (Step 150.) In these processes, the same check bits $c_{(n-k)}$ will be selected many times. Their values are renewed every time they are selected.

The values of some check bits $c_{(n-k)}$ may be changed by repeated parity checks. But by the time all the groups G are processed, the parity of the check bits $c_{(n-k)}$ will have been determined without contradiction.

When all the groups G have been processed, the transmission code 1 is read from the memory 2 (Step 160). The whole process thus ends (Step 170).

In this embodiment, the encoded transmission code 1 is represented b($2^h$, k)$_{h-r}$ to clarify the fact that h–r of the h figures of each address are invalid.

Figure 9:
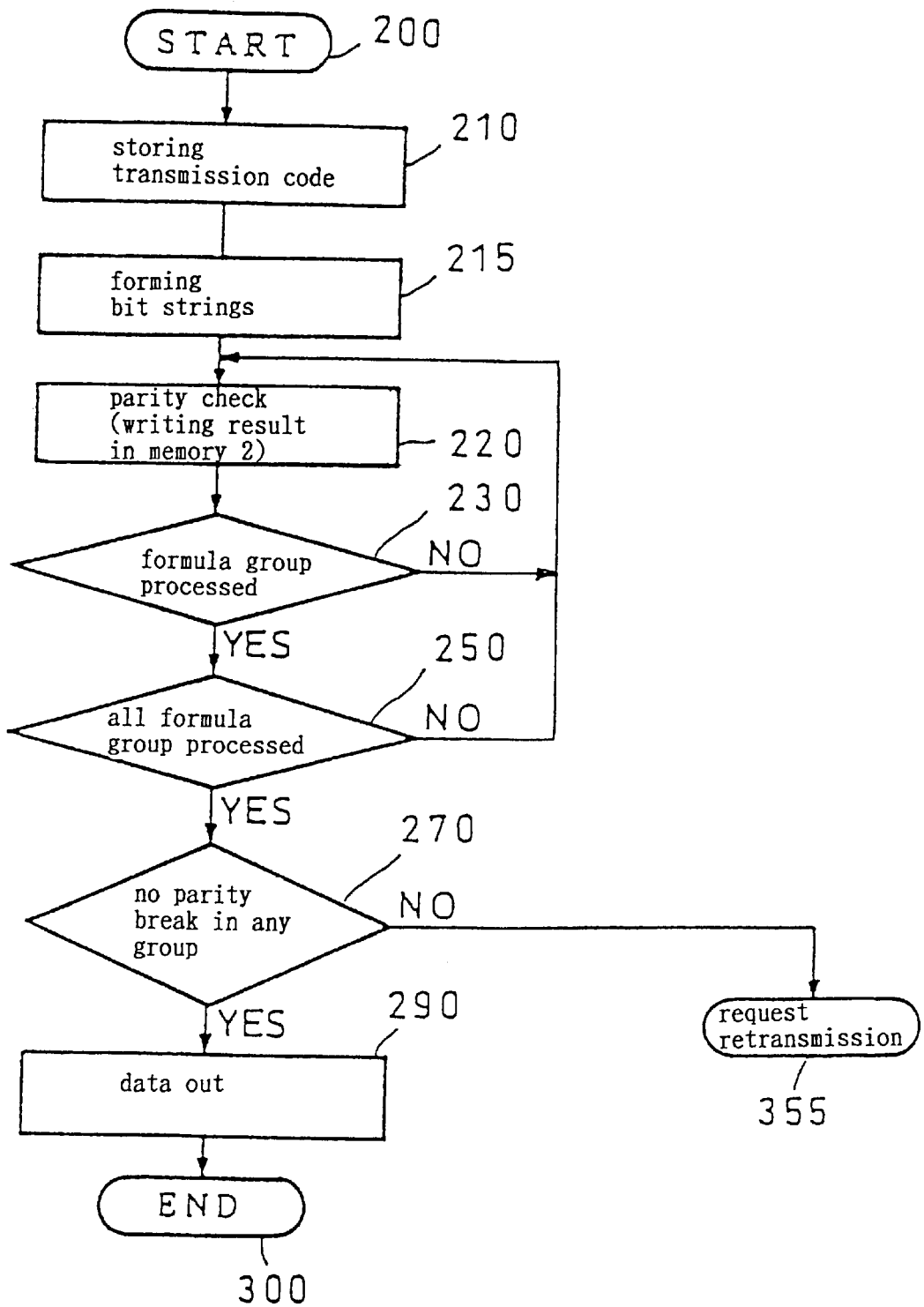
FIG. 9 is a flowchart showing the detecting method of the first embodiment of this invention.

When such transmission code 1 is received by the receiver, its processing unit carries out the steps in the transmitter in the reverse direction to create bit strings g and subject the bit strings to parity checks to detect any transmission error, as shown by flowchart of FIG. 9.

Specifically, when the receiver receives the transmission code 1, its processing unit is activated (Step 200). The transmission code 1 is temporarily stored in the memory 2 with addresses ad attached (Step 210). Then, as shown in FIG. 10, the same bit strings g created in the transmitter are created using the same addresses used in the transmitter (Step 215). The respective bit strings g thus created are subjected to parity checks (Step 220). The results are written in the memory 2. When all the bits g in one check formula group G have been processed (Step 230), the other check formula groups G are processed one after another (step 250). When all the groups G have been processed, judgment is made whether of not there is a parity break based on the previous parity checks (Step 270). If there is a parity break, which indicates the existence of transmission errors, the receiver sends a request for retransmission to the transmitter (Step 355).

If no parity break is found, information bits $a_k$ are separated and outputted (Step 290) and the receiver is deactivated (Step 300).

Suppose now the four bits represented by the addresses (01011), (01100), (01111) and (10000) suffer bit reversals simultaneously as shown in FIG. 11. Although the number of 1's in the entire transmission code 1 remains unchanged, parity breaks will be observed in a plurality of bit strings g as shown in FIG. 11. Thus, it is possible to detect transmission errors.

In this embodiment, in order to detect transmission errors, a plurality of bit strings g are created by combining information bits ak and check bits $c_{(n-k)}$ and the bit strings g thus created are subjected to parity checks. With this arrangement, it is possible to detect even bursting errors in which four bits, two of them being in succession, suffer bit reversals simultaneously.

Figure 12:
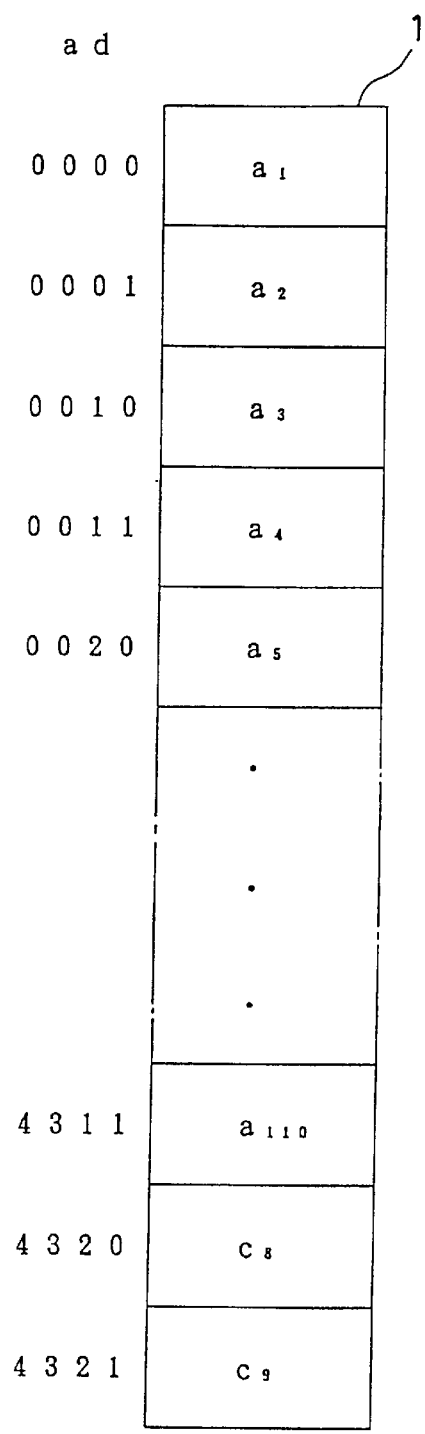
FIG. 12 is a view of another embodiment of the transmission code of this invention.

In this embodiment, all the h figures of the addresses ad are expressed by binary codes. But instead, all or part of the h figures of the addresses ad may be expressed in different number systems based on different bases. For example, as shown in FIG. 12, the respective figures are expressed in number systems based on 5, 4, 3 and 2, respectively. With this arrangement, it is possible to change the length n of the transmission code 1 without changing the number of figures of the addresses.

In this embodiment, the addresses ad are allocated to the respective bits so as to increase from the first bit a1 to the last bit ak. But they may be attached to the respective bits so as to increase from the last bit $a_k$ to the first bit a1. In the latter case, contrary to the abovementioned arrangement, the information bits $a_k$ are allocated to the addresses ad having 1's by a predetermined number or less, and the value of the check bit $c_{(n-k)}$ to which the smallest address ad is attached is changed for each bit string g based on parity. Other processes are carried out in the same way as above. Their description is thus omitted.

Description is now made of the second embodiment of the method for detecting errors in transmission of digital signals.

In this method, the steps carried out in the processing unit of the transmitter are the same as in the first embodiment. As shown in FIG. 3, information bits $a_k$ and check bits $c_{(n-k)}$ are selected, the selected information bits ak and check bits $c_{(n-k)}$ are combined to create bit strings g, the bit strings g thus created are subjected to parity checks to determine the value of the check bits $c_{(n-k)}$, and the transmission code 1 thus produced are transmitted.

Figure 13:
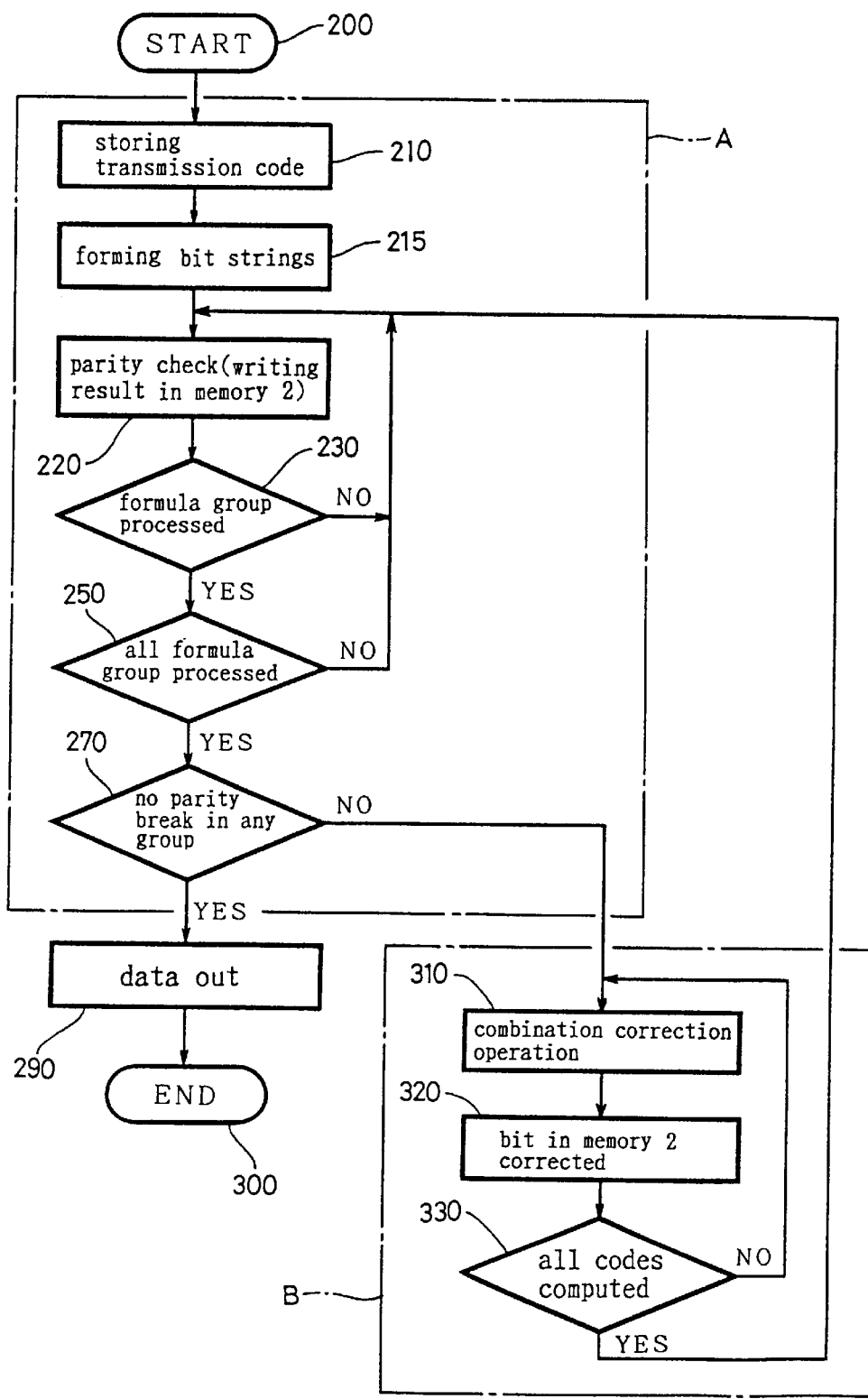
FIG. 13 is a flowchart showing a second embodiment of this invention.

When the transmission code 1 is received by the receiver, its processing unit creates bit strings g from the transmission code 1 received from the transmitter by carrying out the steps of the first embodiment in the reverse direction, as shown at A of the flowchart of FIG. 13.

Specifically, when the receiver receives the transmission code 1, its processing unit is activated (Step 200). The transmission code 1 is temporarily stored in the memory 2 with addresses ad expressed in the number system having q as its base ($n=q^h$) attached thereto (Step 210). Then, h-r digits are selected from the h digits of each address ad without duplication, and for each of the $_hC_{h-r}$ combinations of h-r digits, a group G of check formulas are created, the check formulas being all the possible combinations of the integers of the selected h-r digits. Further, the bits to which the addresses belonging to the respective check formulas in each group G are attached are selected to create $q^{h-r}$ bit strings g for each group G.

In the particular embodiment, h is 5 and r is 3 as in the first embodiment. Thus, two digits are selected from the five digits of each address ad. There are 10 such combinations. For each combination, a group G of check formulas are created, the check formulas being all the possible combinations of 1 and 0 in the two selected digits. Then, the same bit strings g created in the transmitter are created using the addresses ad (Step 215). Each bit string g is subjected to parity checks. The results are written in the memory 2 (Step 220). When all the bit strings g of one check formula group G have been checked for parity (Step 230), the other groups G are also subjected to parity checks one after another (Step 250).

If parity break is detected, the processing unit carries out combination correction operations (Step 310) as shown at B in the flowchart of FIG. 13.

More specifically, as shown in FIG. 14, the check formulas used to create the bit strings, in which the selected two digits are definite, while the remaining digits are indefinite, are attached to the respective bit strings g. Then, logic operations are carried out on the following principles.

(1) While errors can be detected in a maximum of $q^{h-r}$ bit strings g in the $_hC_{h-r}$ check formula groups, no operations are carried out between check formulas in the same one check group G.

(2) Operations are always carried out for r+1 check formulas, and not for other combinations.

That is, check formula groups G in which parity break has been detected are picked out, and the following logic operations are carried out between arbitrarily picked out r+1 check formula groups G. Thus, it is possible to point out bits in error because each check formula group G has address components. Maximum possible number of times such operations are carried out is $_pC_{r+1} \cdot q^{(h-r)(r+1)}$ (where $P = _hC_{h-r}$).

As shown in FIG. 15A, Each check formula group G includes e.g. two effective digits $f_h$. In the embodiment, two (h-r) of the five digits of the check formulas in each group G are effective. Thus, by combining any four check formula groups G, it is possible to cover all the digits $f_h$ of the check formulas as shown in FIG. 15B.

By using check formula groups G, correction equations Hn which can specify any address ad are obtainable (FIG. 15B). In this embodiment, each correction equation Hn selects one digit from the five digits. Thus, as shown in FIGS. 16A–16E, by collecting any 4 (r+1) check groups G, which all cover the same one digit, it is possible to specify an address ad. In the figures, $f_h^4$ indicates the digit $f_h$ which is covered by all the four groups G. There are $_hC_{h-r-1} \cdot q^{(h-r)(r+1)}$ combinations of such groups G. It is thus possible to greatly reduce the number of operations.

Logic operations are carried out between the same digits of the selected check formulas according to the following truth value table.

|     | 0 | 1 | 2 | * * * | q − 1 | . |
|-----|---|---|---|-------|-------|---|
| 0   | 0 | . | . | . . . | .     | 0 |
| 1   | . | 1 | . | . . . | .     | 1 |
| 2   | . | . | 2 | . . . | .     | 2 |
| *   | . | . | . | * . . | .     | * |
| *   | . | . | . | . * . | .     | * |
| q − 1 | . | . | . | . . * | q − 1 | q − 1 |
| .   | 0 | 1 | 2 | * * * | q − 1 | . |

.: indefinite
*: number in number system having q as its base

For example, operations are carried out between check formulas as follows:

$$(\ldots 01) \times (\ldots 00.) \times (.0.0.) \times (0..0.) = (00001)$$

$$(\ldots 01) \times (\ldots 00.) \times (.0.0.) \times (0..0.) = (\ldots\ldots) => \text{indefinite}$$

Suppose now the bit at the address (00001) is in error as shown in FIG. 14, then parity break will be detected at (...01) in $G_1$, (..0.1) in $G_2$, (.0..1) in $G_3$, (0...1) in $G_4$, (..00.) in $G_5$, (.0.0.) in $G_6$, (0..0.) in $G_7$, (.00..) in $G_8$, (0.0..) in $G_9$, and (00...) in $G_{10}$. Thus, the correction equations $H_n$ shown in FIG. 16 will be as follows:

$$H_1 = G_1 \times G_2 \times G_3 \times G_4$$
$$= (\cdots 01) \times (\cdot\cdot 0 \cdot 1) \times (\cdot 0 \cdot\cdot 1) \times (0 \cdots 1)$$
$$= (0\,0\,0\,0\,1)$$
$$H_2 = G_1 \times G_5 \times G_6 \times G_7$$
$$= (\cdots 01) \times (\cdot\cdot 00 \cdot) \times (\cdot 0 \cdot 0 \cdot) \times (0 \cdot\cdot 0 \cdot)$$
$$= (0\,0\,0\,0\,1)$$
$$H_3 = G_3 \times G_5 \times G_8 \times G_9$$
$$= (\cdots 0 \cdot 1) \times (\cdot\cdot 00 \cdot) \times (\cdot 00 \cdot\cdot) \times (00 \cdots)$$
$$= (0\,0\,0\,0\,1)$$
$$H_4 = G_3 \times G_5 \times G_8 \times G_{10}$$
$$= (\cdot 0 \cdot\cdot 1) \times (\cdot 0 \cdot 0 \cdot) \times (\cdot 00 \cdot\cdot) \times (00 \cdots)$$
$$= (0\,0\,0\,0\,1)$$
$$H_5 = G_4 \times G_7 \times G_9 \times G_{10}$$
$$= (0 \cdots 1) \times (0 \cdot\cdot 0 \cdot) \times (0 \cdot 0 \cdot\cdot) \times (00 \cdots)$$
$$= (0\,0\,0\,0\,1)$$

That is, the solutions of the above equations $H_1$–$H_5$ are all (00001). The bit at this address is thus corrected (Step 320).

When all the equations Hn have been solved and the bit in error has been corrected (Step 330), bit strings g are created from the corrected transmission code 1, and subjected to parity checks to detect transmission errors if any (Steps 220–270).

In this case, since only one bit, at (00001), was in error, no parity break will occur again. Thus, data are outputted (Step 290) and the error detection/correction process is terminated (Step 300).

Even if errors are detected at a plurality of addresses at the same time, it is possible to detect and correct such errors by using the above equations in the following manner.

Suppose the bits at (00001) and (11001) are in error, as shown in FIG. 17. Then, parity break will be detected at (.0..1) and (.1..1) in $G_3$(0...1) and (1...1) in $G_4$, (.0.0.) and (.1.1.) in $G_6$, (0..0.) and (1..1.) in $G_7$, (.00..) in $G_8$, (0.0..) and (1.0..) in $G_9$, and (00...) and (11...) in $G_{10}$.

The first round of correction operations using the correction equations Hn as shown in FIGS. 18 and 19 will specify the addresses (00001) and (01001). The bits at these addresses are thus altered. Since the originally correct bit at (01001) is altered, parity break will now be detected at (0...0), (0...1) and (1...1) in $G_4$, (.0.0.) and (.1.0.) in $G_6$, (0..0.) and (1..0.) in $G_7$, (.10..) in $G_8$, (0.0..) and (0.1..) in $G_9$, and (01 . . . ) and (11 . . . ) in $G_{10}$, as shown in FIG. 20.

Correction operations are thus carried out again. This time, as shown in FIGS. 21 and 22, the bits at (01001) and (11001) will be specified. These bits are thus altered. The altered bits coincide with the original ones. Thus, no parity break will be detected in the bit strings g created from the transmission code 1 thus corrected. That is, the transmission code 1 has now been restored.

In this method, bit strings g are created by combining information bits ak and check bits $c_{(n-k)}$ of the transmission code 1. The code 1 are then corrected by attaching check formulas to the plurality of bit strings g thus created. It is thus possible to correct even multiple errors with high reliability.

In the particular embodiment, bit strings are created based on addresses ad expressed in binary notation. That is, the following relations are met:

$$2^n = 2^2 = \overset{h}{\text{EXP}_2} 2^h$$
$$= \text{EXP}_2 \sum_{i=0}^{h} {}_h C_i$$

Its limit formula is:

$$M1 \leq 2^n / \text{EXP}_2 \sum_{i=0}^{r-1} {}_h C_i$$
$$\leq 2^{2^h} / \text{EXP}_2 \sum_{i=0}^{r-1} {}_h C_i$$
$$\leq \text{EXP}_2 2^h / \text{EXP}_2 \sum_{i=0}^{r-1} {}_h C_i$$
$$\leq \text{EXP}_2 \left( 2^h - \sum_{i=0}^{r-1} {}_h C_i \right)$$

The limit formula of hamming of a conventional code is:

$$M \leq 2^n / \sum_{i=0}^{t} {}_h C_i$$

Thus, there is a correction between M1 (present invention) and M (prior art):

M>M1

This means that in the arrangement of the present invention, it is possible to use a greater M than in the conventional arrangement, provided the code lengths are the same. It is thus possible not only to transmit data with high efficiency but to correct even multiple errors with high reliability.

In the arrangement of the present invention, since h-digit addresses ad are expressed in binary notation, there is the following relation between the number of effective digits in each check formula group G and the number of indefinite digits:

detection capacity: $2^{h-r+1}-1+\alpha$ bits
correction capacity: $2^{h-r}-1+\beta$ bits $\alpha$ and $\beta$ will be explained in the following comparison examples.

In the specific embodiment, h is 5 and r is 3. Thus, the following equations are met:

detection capacity: $2^{5-3+1}-1=7$ bits
correction capacity: $2^{5-3}-1=3$ bits To deepen understanding, solutions for part ($H_1$) of the correction equations $H_n$ for $(2^5, 16)_2$ used in the description of the embodiment are shown in FIGS. 30–37. Solutions for $H_2$–$H_5$ are omitted because they are easily inferable from the solutions for $H_1$. The numbers at the right end of the equations are the decimal notations of the binary numbers.

In the embodiment, the addresses ad are attached from a1 toward $a_k$, but may be attached in the reverse order. In the latter case, the information bits $a_k$ are allocated to the addresses ad having 1's by a predetermined number or less, and the value of the check bit $c_{(n-k)}$ to which the smallest address ad is attached is changed for each bit string g based on even parity. Other processes are carried out in the same way as above. Their description is thus omitted.

In the second embodiment, many useless operations that produce indefinite results are carried out using the correction equations $H_n$, as shown in FIGS. 18 and 19. In an arrangement shown in FIGS. 23 through 27, in order to eliminate such useless operations, only the correction equations $H_n$ that produce effective results, and the data obtained are prepared in the processing unit of the receiver in the form of a data table. By using this table, it is possible to carry out only the effective operations and thus to increase the processing speed. Since useless operations are eliminated, the number of operations carried out decreases dramatically to ${}_h C_{h-r-1} \cdot q^h$.

In an alternate embodiment of the second embodiment, it is possible to set a correction coefficient A, the number of checks N and the number of corrected bits L.

Figure 28:
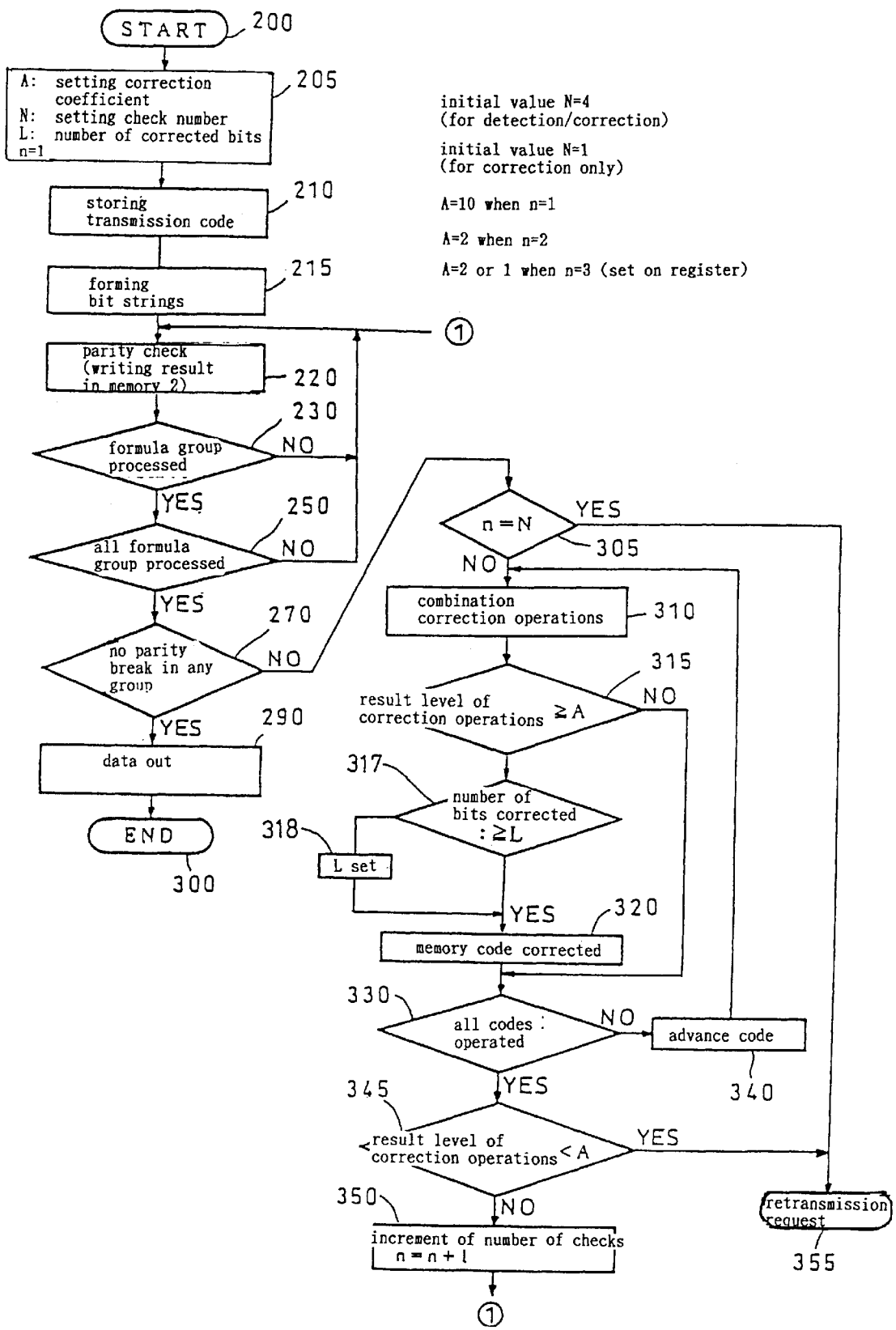
FIG. 28 is a flowchart showing a modified embodiment of the second embodiment of this invention.

As shown in FIG. 28, the method of this embodiment includes, besides the steps of the second embodiment, shown in the flowchart of FIG. 9, the step of setting the number of checks, the correction coefficient and the number of corrected bits (205), the step of determining the number of checks (305), the step of determining the level of the result of correction operations (315), the step of determining the number of bits to be corrected (317), and the step of setting the number of bits (318).

The number of checks is set in Step 205 to set the number of times error corrections are made. In Step 305, when the number of times error corrections are made reaches the preset number N, the process is terminated and a request for retransmission is issued. It is thus possible to eliminate the necessity of repeatedly making corrections due to many errors when the data are transmitted, and thus to maintain high efficiency of transmission even if a long time is needed for error corrections.

The correction coefficient is set in Step 205 to set the level of capacity to correct errors in bit strings g detected in the receiver.

That is, during corrections, the address ad attached to each bit can appear once to $_hC_{h-r-1}$ times.

For example, in level A, if $_hC_{h-r-1} = _5C_1 = 5$, the number of equations $H_n$ is five. Thus, the address (00000) can appear once to five times. Since the bit at any address that has appeared five times has the highest possibility that it is in error, corrections are made only if an address ad attached to any bit to be corrected appears A ($1 \leq A \leq 5$) times. That is, in this arrangement, the number of error bit detection/correction operations are set in Step 205, and the memory 2 is not corrected in Step 315 if the number of appearances of a certain address ad is less than A.

Further, the number of bits corrected at one time in Step 205 is limited to a predetermined value to improve the processing capacity while keeping high reliability. In this case, the number L of bits corrected at one time is set at:

$$L \leq q^{h-r-1} \text{ or less}$$

The number L is determined so that the number of addresses that can be corrected, i.e. $_hC_{h-r-1}$, will be maximum. Corrections are made only for $q^{h-r-1}$ or less addresses ad counted from $_hC_{h-r-1}$ downward.

For example, if $_hC_{h-r-1}$ is $_5C_{5-3-1} = 5$, the same address can appear once to five times. If there are a plurality of such addresses ad, $q^{h-r-1} = 2^{5-3-1} = 2^1$ or less addresses, i.e. two or one address is corrected.

For example, only the addresses that appeared five times and four times are corrected, while the remaining addresses, i.e. addresses that appeared three times, twice and once are not. It is thus possible to improve processing capacity without impairing reliability.

For this purpose, the number of bits to be corrected are determined in Step 317, and if this number is L or less, corrections are made as it is. If over L, only L addresses ad as counted from the largest one downward are corrected in Step 318.

With this arrangement, errors can be corrected most efficiently. This embodiment is otherwise the same as the embodiment of FIG. 9.

Next, description is made of the third embodiment, which is a method of correcting transmission errors of digital signals which can reduce burst errors.

Figure 29:
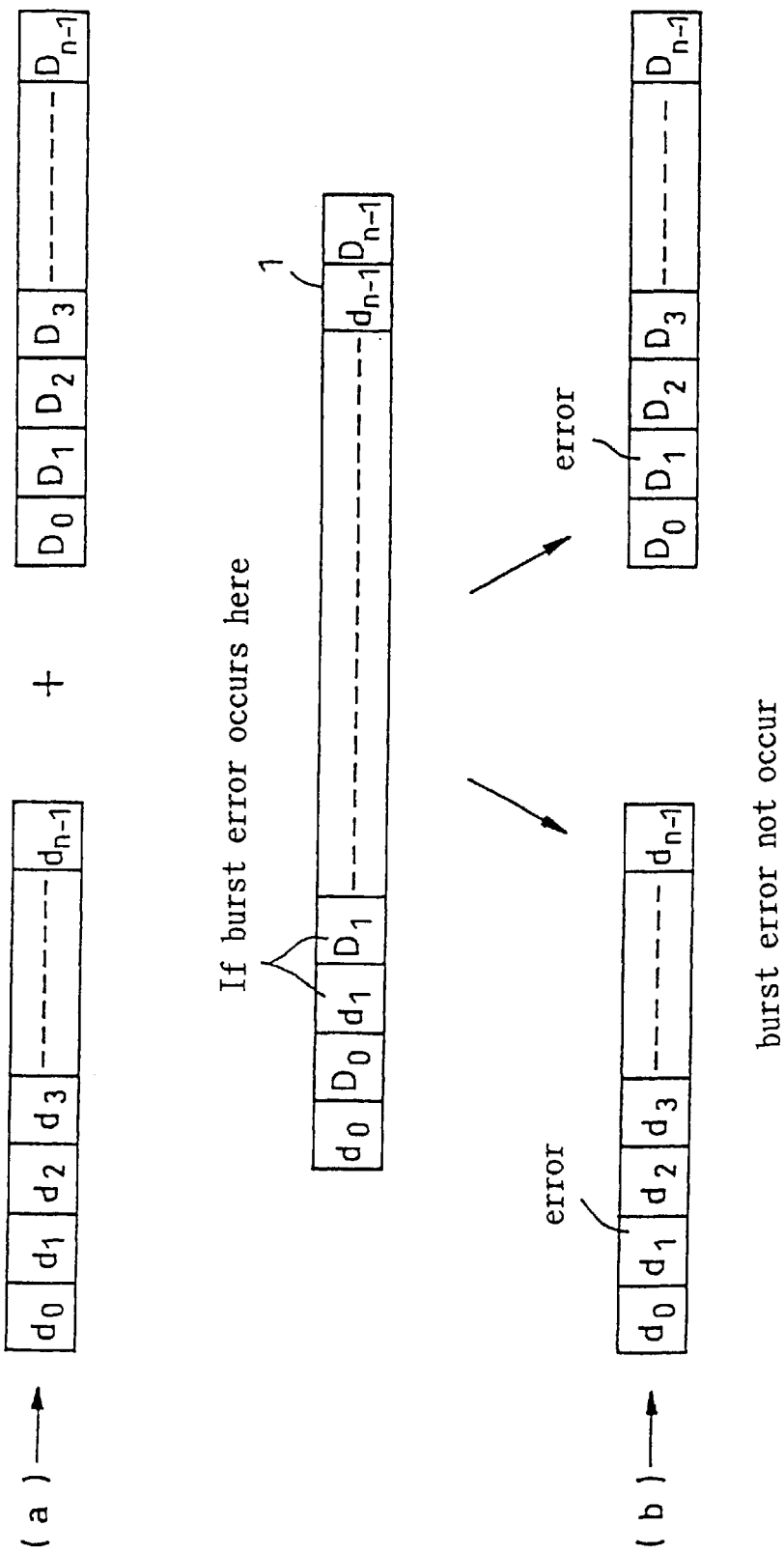
FIG. 29 is a view of a third embodiment of this invention.

In this method, as shown in FIG. 29A, a transmission code 1 is created by combining a plurality of transmission signals $d_n$, $D_n$ that have been produced separately by the processing unit of the transmitter, and sent to the receiver. Upon receiving the code 1, as shown in FIG. 29B, the processing unit of the receiver detects and corrects transmission errors by splitting the transmission code 1 received.

When the transmission code 1 combined in the transmitter is split in the receiver, bursts are cut, so that errors decrease and the correction capacity improves.

In this embodiment, transmission signals $d_n$ and $D_n$ are combined alternately with each other. But they may be combined in any other way depending upon the way burst occur, which is determined e.g. by experiments.

In the above-described embodiments, address codes ad are expressed in binary notation. But they may be expressed in any other number system having a base of N (N=2, 3 . . . ), as in the first embodiment.

In this embodiment, two digits of each address ad was used to select bit strings g. But the number of digits used for this purpose is not limited to two.

In order to evaluate the error detection/correction capacity of the method according to the present invention, comparison was made with the coding rate and error detection/correction capacity in a source BHC code. The results are shown below.

(Comparison Example)
1. Coding rate
Coding rates are compared under the following conditions:
Code length: 7–64 bits
i. source BHC code
Errors in 3 bits are corrected, and errors i four bits are detected.
Present Invention $(2^h, k)_2$ code
ii. errors in $(3+\alpha)$ are corrected, and errors in $(7+\beta)$ bits are detected.
α and β are expected values.
a) Source BHC code

| (n, k) | (7, 1) | (15, 5) | (31, 16) | (63, 45) |
|---|---|---|---|---|
| code length n | 7 | 15 | 31 | 63 |
| check bit | 1 | 5 | 16 | 45 |
| coding rate | 14.3% | 33.8% | 51.6% | 71.4% | b) Present Invention $(2^h, k)_2$ code

| $(2^h, k)_2$ | $(2^3, 1)_2$ | $(2^4, 5)_2$ | $(2^5, 16)_2$ | $(2^6, 42)_2$ |
|---|---|---|---|---|
| code length n | 8 | 16 | 32 | 64 |
| check bit | 1 | 5 | 16 | 42 |
| coding rate | 12.5% | 31.3% | 50.0% | 65.6% |

Thus, $(2^h, k)_2$ code according to the invention is at least as high in coding rate as the source BHC code.
2. Error detection/correction capacity
When α, β are added as expected values, the code according to the invention is at least as high in error correction capacity as the source BHC. If other factors, such as higher coding rate, higher error detection capacity, and the ability to exclude any wrong corrections, are taken into consideration, the code according to the present invention can be said to be superior to the conventional code.

Description of the expected value β

Up to $2^{h-r+1}-1$ bits are detectable. All the other bits, except part of the bits in which β is $2^{h-r+1}$ multiplied by $(n/2^{h-r+1})$, are also detectable.

That is, all the bits are detectable except that part of the bits are not detectable if the number of bits in error is 8, 16, 24 or 32.

The error detection rates when there are 8, 16 and 24 error bits.

8 error patterns: Only ten of 10,518,300 bits are not detectable.

$$_5C_3/_{32}C_8/10/10, 518, 300 \approx 1 \times 10^{-5}$$

16 error patterns: Only five of 601,080,390 bits are not detectable.

$$_5C_4/_{32}C_{16}=5/601, 080, 390 \approx 0.8 \times 10^{-5}$$

24 error patterns: Only 15 of 10,518,300 bits are not detectable.

$$(_5C_3 + {}_5C_4)/_{32}C_{24} = 15/10,518,300$$
$$= 1.4 \times 10^{-6}$$

Description of the expected value α

Up to $(2^{h-r}-1)$ bits are all correctable. For α: $(2^{h-r}-2^{h-r+1}-1)$, part of the bits are not correctable. Correction capacity is calculated for 1–7 bits in error.

For 1, 2 and 3 error patterns, all the bits are correctable.

For 4 error patterns, 700 of 35,960 are not correctable though detectable.

$$_5C_3 \times_8 C_4/_{32}C_4 = 10 \times 70/35,960 \approx 2 \times 10^{-2}$$

For 5 error patterns, 560 of 201,376 are not correctable, though detectable.

$$_5C_3 \times_8 C_5/_{32}C_5 = 10 \times 56/201,376 \approx 2.8 \times 10^{-3}$$

For 6 error patterns, 280 of 906,192 are not correctable, though detectable.

$$_5C_3 \times_8 C_6/_{32}C_6 = 10 \times 28/906,192$$
$$\approx 3.1 \times 10^{-4}$$

For 7 error patterns, 80 of 3,365,856 are not correctable, though detectable.

$$_5C_3 \times_8 C_7/_{32}C_7 = 10 \times 8/3,365,856$$
$$\approx 2.4 \times 10^{-6}$$

From the expected value calculated from the above results, one can see that seven bits can be corrected almost perfectly.

That is, theoretically, detection capacity is nearly perfect for 1–31 bits, and correction capacity is nearly perfect for 1–7 bits, though such expected values may vary depending upon pseudo-random error generating characteristics.

The code according to the invention is thus superior both in error detection and correction capacities to expanded BHC codes.

3. Algorithm

In computer software, many useless operations are carried out to correct errors. By eliminating such useless operations, it is possible to reduce the number of operations to ⅛ in the case of $2^5$(h=2, r=3), as is apparent from the formula $$EXP_2[h-(h-r)(r+1)]$$

The error detection and correction capacities vary widely depending not on the error pattern but on whether the number of error bits is even or odd.

Industrial Application

According to this invention, a plurality of bit strings created by combining information bits and check bits in the transmission code are used to detect and correct transmission errors. It is thus possible to detect and correct even multiple errors with high reliability. This method can be used not only in the communications field but for data transmission between computer drives and CPU'S.

I claim:

1. A method for detecting errors in transmission of n (in number) digital signals which are a mixture of k (in number) information bits ($a_k$) and n–k check bits ($c_{(n-k)}$), said method comprising, in a processing unit of a transmistter: attaching n addresses (ad) which are h-digit numbers expressed in a number system having integer q as its base (n =$q^h$) to said respective n digital signals, allocating said check bits ($c_{(n-k)}$) to respective addresses (ad) each including h–r ($1 \leq r \leq h$) integers q–1 or 0's, and allocating said information bits ($a_k$) to the remaining ones of said addresses, selecting h–r digits from the h digits of each of said addresses (ad) without duplication, creating $_hC_{h-r} \cdot q^{h-r}$ bit strings (g) each comprising $q^r$ bits having the same integers for the selected h–r digits, determining the value of the check bits ($c_{(n-k)}$) in each bit string (g) to which the largest address (ad) is attached by subjecting the respective bit strings (g) to parity checks, thus producing a transmission code (1), and in a processing unit of a receiver: attaching n addresses (ad) which are h-digit numbers expressed in a number system having integer q as its base (n =$q^h$) to said respective n digital signals of said transmission code (1) received from said transmitter, selecting h–r digits from the h digits of each of said addresses (ad) without duplication, creating $_hC_{h-r} \cdot q^{h-r}$ bit strings (g) each comprising $q^r$ bits having the same integers for the selected h–r digits, and detecting errors in transmission by subjecting the respective bit strings (g) to parity checks.

2. A method as claimed in claim 1 wherein all or part of the h digits of each address (ad) are expressed in different number systems having different integers as their bases.

3. A method for correcting errors in transmission of n (in number) digital signals which are a mixture of k (in number) information bits ($a_k$) and n–k check bits ($c_{(n-k)}$), said method comprising, the steps carried out in the processing unit of the transmitter as claimed in claim 1 or 2, and in a processing unit of a receiver:

attaching n addresses (ad) which are h-digit numbers expressed in a number system having integer q as its base (n =$q^h$) to said respective n digital signals of said transmission code (1) received from said transmitter, selecting h–r digits from the h digits of each of said addresses (ad) without duplication, creating a group (G) of check formulas for each of the $_hC_{h-r}$ combinations of h–r bits, said check formulas in each group (G) being all the possible combinations of the integers of the selected h–r digits, creating $q^{h-r}$ bit strings (g) for each group (G), each of said bit strings comprising $q^r$ bits to which are attached addresses (ad) having the same integers at the selected h–r digits, allocating each check formula to a respective bit string (g), wherein only the h–r digits of said each check formula used to select said respective bit string (g) are effective digits and the retaining digits are indefinite, and correcting any bit in error by repeatedly subjecting said bit strings (g) to parity checks to calculate any parity break, collecting r+1 bit strings (g) in which parity break has been detected for each check formula group (G) and subjecting the thus collected r+1 bit strings to logic operations to find out the address of any bit in error.

4. A method as claimed in claim 3 wherein said logic operations are carried out for check formulas based on correction equations ($H_n$) for calculating effective digit components by performing logic operations between said check formula groups (G).

5. A method as claimed in claim 3 or 4 wherein only logic operations that give effective results are carried out between the check formulas.

6. A method as claimed in claim 5 wherein the step of correcting transmission errors is repeated N times.

7. A method as claimed in claim 5, wherein the step of correcting transmission errors is carried out by comparing the operation results calculated from the check formulas and pointed to an identical address (ad) with a predetermined number A.

8. A method as claimed in claim 5 wherein a predetermined number L of bits are corrected at one time.

9. A method as claimed in claim 5 wherein all or part of the h digits of each address (ad) are expressed in different number systems having different integers as their bases.

10. A method as claimed in claim 5 wherein a plurality of bits are combined into a transmission signal (1) in the processing unit of said transmitter and are transmitted to the receiver in a serial order, and the processing unit of the receiver separates the bits of the signal received, creates the original transmission signal (1) from the separated bits, and corrects any error present in the transmission signal (1) thus created.

11. A method as claimed in claim 3 wherein the step of correcting transmission errors is repeated N times.

12. A method as claimed in claim 11, wherein the step of correcting transmission errors is carried out by comparing the operation results calculated from the check formulas and pointed to an identical address (ad) with a predetermined number A.

13. A method as claimed in claim 11 wherein a predetermined number L of bits are corrected at one time.

14. A method as claimed in claim 11 wherein all or part of the h digits of each address (ad) are expressed in different number systems having different integers as their bases.

15. A method as claimed in claim 11 wherein a plurality of bits are combined into a transmission signal (1) in the processing unit of said transmitter and are transmitted to the receiver in a serial order, and the processing unit of the receiver separates the bits of the signal received, creates the original transmission signal (1) from the separated bits, and corrects any error present in the transmission signal (1) thus created.

16. A method as claimed in claim 3 wherein the step of correcting transmission errors is carried out by comparing the operation results calculated from the check formulas and pointed to an identical address (ad) with a predetermined number A.

17. A method as claimed in claim 16 wherein a predetermined number L of bits are corrected at one time.

18. A method as claimed in claim 16 wherein all or part of the h digits of each address (ad) are expressed in different number systems having different integers as their bases.

19. A method as claimed in claim 16 wherein a plurality of bits are combined into a transmission signal (1) in the processing unit of said transmitter and are transmitted to the receiver in a serial order, and the processing unit of the receiver separates the bits of the signal received, creates the original transmission signal (1) from the separated bits, and corrects any error present in the transmission signal (1) thus created.

20. A method as claimed in claim 3 wherein a predetermined number L of bits are corrected at one time.

21. A method as claimed in claim 20 wherein all or part of the h digits of each address (ad) are expressed in different number systems having different integers as their bases.

22. A method as claimed in claim 20 wherein a plurality of bits are combined into a transmission signal (1) in the processing unit of said transmitter and are transmitted to the receiver in a serial order, and the processing unit of the receiver separates the bits of the signal received, creates the original transmission signal (1) from the separated bits, and corrects any error present in the transmission signal (1) thus created.

23. A method as claimed in claim 3 wherein all or part of the h digits of each address (ad) are expressed in different number systems having different integers as their bases.

24. A method as claimed in claim 23 wherein a plurality of bits are combined into a transmission signal (1) in the processing unit of said transmitter and are transmitted to the receiver in a serial order, and the processing unit of the receiver separates the bits of the signal received, creates the original transmission signal (1) from the separated bits, and corrects any error present in the transmission signal (1) thus created.

25. A method as claimed in claim 3 wherein a plurality of bits are combined into a transmission signal (1) in the processing unit of said transmitter and are transmitted to the receiver in a serial order, and the processing unit of the receiver separates the bits of the signal received, creates the original transmission signal (1) from the separated bits, and corrects any error present in the transmission signal (1) thus created.

26. A method as claimed in claim 4 wherein only logic operations that give effective results are carried out between the check formulas.

27. A method as claimed in claim 4 wherein the step of correcting transmission errors is repeated N times.

28. A method as claimed in claim 4, wherein the step of correcting transmission errors is carried out by comparing the operation results calculated from the check formulas and pointed to an identical address (ad) with a predetermined number A.

29. A method as claimed in claim 4 wherein a predetermined number L of bits are corrected at one time.

30. A method as claimed in claim 4 wherein all or part of the h digits of each address (ad) are expressed in different number systems having different integers as their bases.

31. A method as claimed in claim 4 wherein a plurality of bits are combined into a transmission signal (1) in the processing unit of said transmitter and are transmitted to the receiver in a serial order, and the processing unit of the receiver separates the bits of the signal received, creates the original transmission signal (1) from the separated bits, and corrects any error present in the transmission signal (1) thus created.

* * * * *